US010338469B2

(12) United States Patent
Asano et al.

(10) Patent No.: US 10,338,469 B2
(45) **Date of Patent: *Jul. 2, 2019**

(54) PHOTOSENSITIVE RESIN COMPOSITION, LITHOGRAPHIC PRINTING PLATE PRECURSOR AND METHOD FOR PRODUCING LITHOGRAPHIC PRINTING PLATE

(71) Applicant: FUJIFILM Corporation, Tokyo (JP)

(72) Inventors: Kotaro Asano, Shizuoka (JP); Atsuyasu Nozaki, Shizuoka (JP); Takashi Sato, Shizuoka (JP); Rena Mukaiyama, Shizuoka (JP); Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 113 days.

This patent is subject to a terminal disclaimer.

(21) Appl. No.: 15/279,699

(22) Filed: Sep. 29, 2016

(65) Prior Publication Data

US 2017/0017153 A1 Jan. 19, 2017

Related U.S. Application Data

(63) Continuation of application No. PCT/JP2015/054633, filed on Feb. 19, 2015.

(30) Foreign Application Priority Data

Mar. 31, 2014 (JP) ................................ 2014-074366

(51) Int. Cl.
*G03F 7/32* (2006.01)
*G03F 7/039* (2006.01)
(Continued)

(52) U.S. Cl.
CPC ................ *G03F 7/039* (2013.01); *B41C 1/10* (2013.01); *B41C 1/1008* (2013.01); *G03F 7/20* (2013.01);
(Continued)

(58) Field of Classification Search
CPC ........................................................ G03F 7/00
See application file for complete search history.

(56) References Cited

U.S. PATENT DOCUMENTS

2005/0064325 A1* 3/2005 Nakamura ............ B41C 1/1008 430/270.1
2005/0069812 A1* 3/2005 Maemoto ............. B41C 1/1008 430/270.1

FOREIGN PATENT DOCUMENTS

JP 02-156241 A 6/1990
JP 2005-106910 A 4/2005

OTHER PUBLICATIONS

Written Opinion of the International Searching Authority of PCT/JP2015/054633 dated Apr. 21, 2015.

(Continued)

*Primary Examiner* — Chanceity N Robinson
(74) *Attorney, Agent, or Firm* — Sughrue Mion, PLLC

(57) ABSTRACT

A photosensitive resin composition contains a polymer compound having a constitutional unit represented by the following Formula A-1 as a constitutional unit A and at least one constitutional unit among constitutional units represented by the following Formulas B-1 to B-6 as a constitutional unit B in the main chain, and an infrared absorbing material.

(A-1)

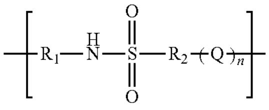

(B-1)

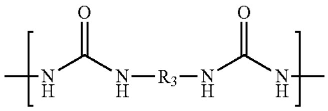

(B-2)

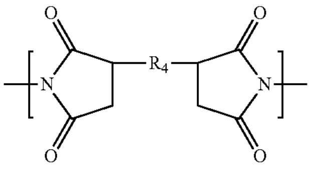

(B-3)

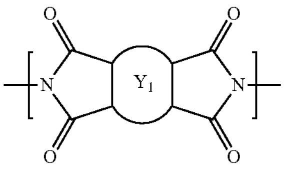

(B-4)

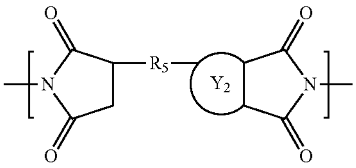

(B-5)

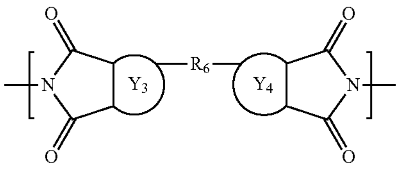

(Continued)

-continued (B-6)

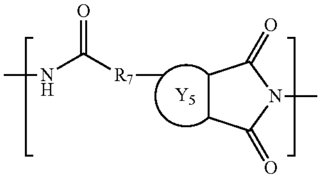

20 Claims, No Drawings

(51) Int. Cl.
*B41C 1/10* (2006.01)
*G03F 7/20* (2006.01)
*G03F 7/095* (2006.01)

(52) U.S. Cl.
CPC ............ *G03F 7/32* (2013.01); *B41C 2210/02* (2013.01); *B41C 2210/06* (2013.01); *G03F 7/095* (2013.01)

(56) References Cited

OTHER PUBLICATIONS

International Search Report of PCT/JP2015/054633 dated Apr. 21, 2015.
Communication dated Aug. 3, 2017 issued by the European Patent Office in counterpart application No. 15772206.7.

* cited by examiner

PHOTOSENSITIVE RESIN COMPOSITION, LITHOGRAPHIC PRINTING PLATE PRECURSOR AND METHOD FOR PRODUCING LITHOGRAPHIC PRINTING PLATE

CROSS-REFERENCE TO RELATED APPLICATIONS

This application is a continuation application of International Application No. PCT/JP2015/054633, filed on Feb. 19, 2015, which is incorporated herein by reference in its entirety The disclosures of Japanese Patent Application No. 2014-074366, filed Mar. 31, 2014 is incorporated herein by reference in their entirety.

All publications, patent applications, and technical standards mentioned in this specification are herein incorporated by reference to the same extent as if each individual publication, patent application, or technical standard was specifically and individually indicated to be incorporated by reference.

BACKGROUND OF THE INVENTION

1. Field of the Invention

The present invention relates to a photosensitive resin composition, a lithographic printing plate precursor, and a method for producing a lithographic printing plate.

2. Description of the Related Art

In recent years, the development of lasers has been remarkable, and in particular, solid lasers and semiconductor lasers having an emission region in a near infrared region to an infrared region, with a high output and a small size, have become easily available. In the field of lithographic printing, as an exposure light source when manufacturing a printing plate directly from digital data from a computer or the like, these lasers are very useful.

A positive type lithographic printing plate precursor for infrared laser has an alkali-soluble binder resin and an IR dye which absorbs light and generates heat, as essential components. In the unexposed portion (image portion), the IR dye and the like act as a development restrainer which substantially decreases the solubility of a binder resin in a developer due to an interaction with the binder resin, and in the exposed portion (non-image portion), the interaction between the IR dye and the like and the binder resin weakens due to generated heat, and the IR dye and the like dissolve in an alkaline developer, and as a result, a lithographic printing plate is formed.

As the lithographic printing plate in the related art, the lithographic printing plates described in JP1990-156241A (JP-H02-156241A) or JP2005-106910A are known.

SUMMARY OF THE INVENTION

Since the image forming capability of a positive type lithographic printing plate precursor for infrared laser as described above depends on the heat generated by infrared laser exposure to the recording layer surface, in the vicinity of a support, an image is formed by diffusion of heat to the support, that is, the heat quantity to be used for solubilization of the recording layer is reduced, and thus, sensitivity becomes low. Therefore, there is a problem in which development restraining ability loss effects of the recording layer in the non-image portion are not sufficiently obtained, the difference between the image portion and the non-image portion is reduced, and thus, highlight reproducibility is insufficient.

In addition, to solve the above-described problem of the highlight reproducibility, using a recording layer formed of a material having characteristics in which a non-image portion can be more easily developed, that is, the solubility in an alkali aqueous solution is better may be considered, but there is a problem in which such a recording layer is chemically weakened even in the image portion region and easily damaged by an ink washing solvent used in the developer or during printing, or the plate cleaner, that is, is poor in chemical resistance, and in the unexposed portion region, there is demand for a resin material having characteristics in which the chemical resistance and the durability of the coating film are excellent and the developability thereof becomes excellent after the dissolution suppressing action is removed by exposure.

For the same purpose as described above, various improved techniques have been proposed, and for example, a technique for a lithographic printing plate precursor in which a recording layer containing a polyurethane resin having sulfonamide in the main chain which is insoluble in water and soluble in an alkali aqueous solution, a photosensitive composition containing a photosensitive compound which acts as a positive type (for example, refer to JP1990-156241A (JP-H02-156241A)) or a water-insoluble and alkali-soluble resin having an active hydrogen in the main chain, on a support, and an infrared absorbent, of which the solubility in an alkali aqueous solution is increased by exposure is provided has been disclosed (for example, refer to JP2005-106910A). According to these lithographic printing plate precursors, it is possible to provide a positive type lithographic printing plate precursor having excellent printing durability and excellent chemical resistance.

However, in recent years, diversifying and varying of print materials (paper, ink, and the like) have progressed, and even in the case of using the same printing plate, there is a problem in which the number of printable sheets (hereinafter, referred to as printing durability) is greatly reduced depending on the type of a print material, in the former technique, chemical resistance is excellent, but there is problem in which, in particular, since the film hardness of the resin used in the underlayer is not sufficient, the printing durability in printing using a low quality print material (paper or ink) is greatly reduced and since the development speed (developability) to an alkaline aqueous solution is not sufficient, the difference between the image portion and the non-image portion is reduced, and thus, highlight reproducibility is not sufficient, and in the latter technique, the printing durability and the highlight reproducibility in printing using a high quality print material (paper or ink) are excellent, but there is problem in which, in particular, since the film hardness of the resin used in the underlayer is not sufficient, the printing durability in printing using a low quality print material (paper or ink) is greatly reduced, and thus, this technique also has room for improvement. Therefore, it is difficult to maintain and improve a plurality of characteristics such as printing durability depending on the film hardness of the underlayer, chemical resistance, the development speed (highlight reproducibility) to an alkaline aqueous solution.

An object of the present invention is to provide a photosensitive resin composition which enables production of a lithographic printing plate precursor having a non-image portion which has good solubility in an alkali aqueous solution and which enables production of a lithographic printing plate having excellent printing durability and excellent chemical resistance, a lithographic printing plate precursor obtained by using the photosensitive resin composition, and a method for producing a lithographic printing plate.

The above-described object of the present invention has been achieved by the means according to the following <1>, <9>, or <14>. <1>, <9>, and <14> are described below with <2> to <8> and <10> to <13> which are preferable embodiments.

<1> A photosensitive resin composition, comprising a polymer compound having a constitutional unit represented by the following Formula A-1 as a constitutional unit A and at least one constitutional unit among constitutional units represented by the following Formulas B-1 to B-6 as a constitutional unit B in a main chain, and an infrared absorbing material, (A-1)

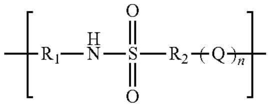

(B-1)

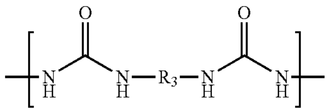

(B-2)

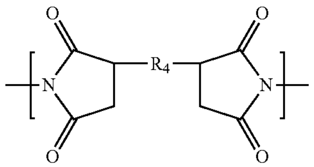

(B-3)

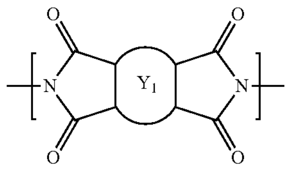

(B-4)

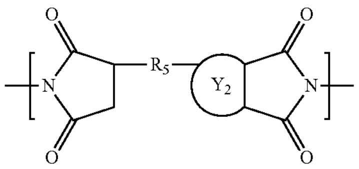

(B-5)

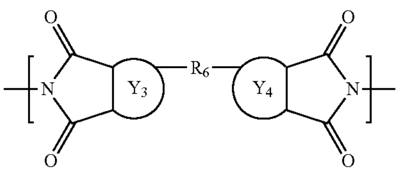

(B-6)

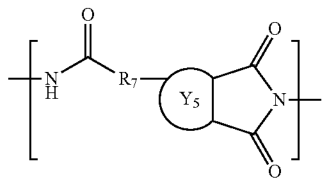

wherein in Formula A-1 and Formulas B-1 to B-6, $R_1$ to $R_3$ each independently represent a divalent linking group, Q represents a divalent structure including a sulfonamide group, n represents an integer of 0 or greater, $R_4$ to $R_7$ each independently represent a single bond or a divalent linking group, and $Y_1$ to $Y_5$ each independently represent an aromatic hydrocarbon ring or an aliphatic hydrocarbon ring.

<2> The photosensitive resin composition according to <1>, wherein the polymer compound has the constitutional unit represented by Formula B-1 or B-6 as the constitutional unit B.

<3> The photosensitive resin composition according to <1> or <2>, wherein the polymer compound has the constitutional unit represented by Formula B-1 as the constitutional unit B.

<4> The photosensitive resin composition according to any one of <1> to <3>, wherein the constitutional unit A is a constitutional unit represented by the following Formula A-2.

(A-2)

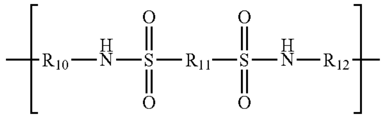

In Formula A-2, $R_{10}$, $R_{11}$, and $R_{12}$ each independently represent a divalent linking group.

<5> The photosensitive resin composition according to any one of <1> to <4>, wherein the polymer compound further has a constitutional unit represented by the following Formula A-3 as a constitutional unit A' in the main chain, (A-3)

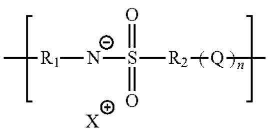

in Formula A-3, $R_1$ and $R_2$ each independently represent a divalent linking group, Q represents a divalent structure including a sulfonamide group, n represents an integer of 0 or greater, and X represents an organic or inorganic cation.

<6> The photosensitive resin composition according to <5>, wherein the ratio of the constitutional unit A to the total mass of the constitutional unit A and the constitutional unit A' in the polymer compound is 5% by mass to 90% by mass.

<7> The photosensitive resin composition according to any one of <1> to <6>, wherein $R_1$ and $R_2$ are arylene groups.

<8> The photosensitive resin composition according to any one of <1> to <7>, wherein the polymer compound further has an alkyleneoxy group in the main chain.

<9> A lithographic printing plate precursor, comprising an image recording layer including the photosensitive resin composition according to any one of <1> to <8>.

<10> The lithographic printing plate precursor according to <9> which is a positive type.

<11> The lithographic printing plate precursor according to <9> or <10>, wherein the image recording layer is formed on a support having a hydrophilic surface.

<12> The lithographic printing plate precursor according to <11> which is a positive type lithographic printing plate precursor having an image recording layer wherein an underlayer and an upper layer are disposed in this order on the support having a hydrophilic surface, wherein the photosensitive resin composition is contained in the underlayer and/or the upper layer.

<13> The lithographic printing plate precursor according to <11>, wherein the photosensitive resin composition is contained only in the underlayer.

<14> A method for producing a lithographic printing plate, comprising a step of image-exposing the lithographic printing plate precursor according to any one of <9> to <13> and a step of developing using a developer, in this order.

According to the present invention, it is possible to provide a photosensitive resin composition which enables production of a lithographic printing plate precursor having a non-image portion which has good solubility in an alkali aqueous solution and which enables production of a lithographic printing plate having excellent printing durability and excellent chemical resistance, a lithographic printing plate precursor obtained by using the photosensitive resin composition, and a method for producing a lithographic printing plate.

DESCRIPTION OF THE PREFERRED EMBODIMENTS

Hereinafter, the content of the present invention will be described in detail. The description of the constitutive elements as described below is based on representative embodiments of the present invention, but the present invention is not limited to such embodiments.

Moreover, in the present specification, "to" which indicates a numerical range is used to show a range in which the numerical values described before and after "to" indicate the upper limit value and the lower limit value.

Regarding the description of a group (atomic group) in the present specification, when the description does not indicate whether a group is substituted or unsubstituted, the description includes both a group having a substituent and a group not having a substituent. For example, "alkyl group" includes not only an alkyl group (an unsubstituted alkyl group) which does not have a substituent, but also an alkyl group (a substituted alkyl group) which has a substituent.

In addition, the chemical structural formulas in the present specification are described by simplified structural formulas in which hydrogen atoms have been omitted, in some cases.

Moreover, in the present specification, "(meth)acrylate" represents acrylate and methacrylate, "(meth)acrylic" represents acrylic and methacrylic, and "(meth)acryloyl" represents acryloyl and methacryloyl.

In addition, in the present invention, "% by mass" has the same meaning as "% by weight", and "part(s) by mass" has the same meaning as "part(s) by weight".

In addition, in the present invention, preferable aspects in a combination are more preferable.

In addition, in the present invention, "a constitutional unit (constitutional unit A) represented by the following Formula (A-1)" is also simply referred to as a "constitutional unit A", and "constitutional unit represented by Formula (B-1)" is also simply referred to as a "constitutional unit B-1".

As a result of conducting extensive studies, the inventors of the present invention found that by containing a polymer compound having the constitutional unit (constitutional unit A) represented by the following Formula (A-1) and at least one constitutional unit (constitutional unit B) among constitutional units represented by the following Formulas B-1 to B-6 in the main chain, and an infrared absorbent in a photosensitive resin composition, it is possible to provide a lithographic printing plate precursor having excellent printing durability, chemical resistance, and alkaline aqueous solution developability (highlight reproducibility).

Although the action mechanism of the excellent effects due to containing the above materials is not clear, it is estimated as follows.

By studies by the present inventors, it was found that the film hardness of a resin is important to the printing durability in printing and the film hardness is significantly influenced by an interaction between binders. In particular, in low quality print materials, the effect is significant, and in general acrylic resins or polyurethane resins, sufficient film hardness is less likely to be imparted. It is thought that this is because inorganic salt particles (calcium carbonate, kaolin, or the like) included in a print material (paper, ink, or the like) are eluted during printing, this polishes to the image portion of the printing plate, and as a result, abrasion is promoted. In contrast, the binder polymer of the present invention has a plurality of linking groups having a very high interaction such urea, imide, or amide, in addition to sulfonamide in the main chain, and thus, the binder polymer has excellent printing durability. It is estimated that this is caused by improvement of the film hardness of the resin and effects of suppressing abrasion of the image portion of the printing plate.

In addition, by studies by the present inventors, it was found that it is effective for chemical resistance to increase the polarity of a binder polymer. The binder polymer of the present invention has groups having a very high interaction such urea or imide, in addition to sulfonamide in the main chain, and thus, the binder polymer has excellent chemical resistance. As a result, it is thought that both hardness and chemical resistance of an image portion can be achieved.

(Photosensitive Resin Composition)

The photosensitive resin composition of the present invention contains a polymer compound (hereinafter, also referred to as a "specific polymer compound") having a constitutional unit (constitutional unit A) represented by the following Formula (A-1) and at least one constitutional unit (constitutional unit B) among constitutional units represented by the following Formulas B-1 to B-6 in the main chain, and an infrared absorbing material.

First, the specific polymer compound and the infrared absorbing material which are essential components of the photosensitive resin composition of the present invention will be described.

(A-1)

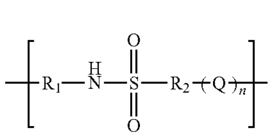

(B-1)

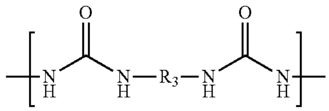

(B-2)

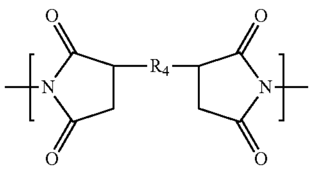

-continued (B-3)

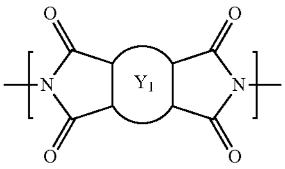

(B-4)

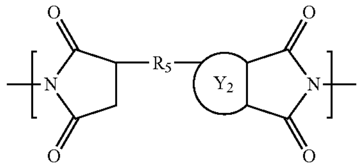

(B-5)

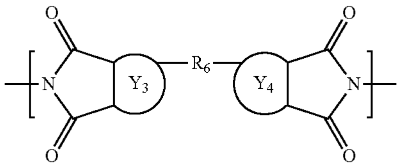

(B-6)

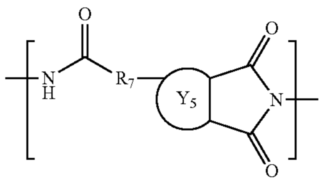

<Polymer Compound Having Constitutional Unit a and Constitutional Unit B in Main Chain>

The photosensitive resin composition of the present invention contains a polymer compound having the constitutional unit A and the constitutional unit B in the main chain.

Hereinafter, respective constitutional units of the polymer compound and a combination between the constitutional units will be described.

[Constitutional Unit A]

The polymer compound used in the present invention has a constitutional unit represented by the following Formula (A-1) in the main chain. In the present invention, the "main chain" represents a relatively longest bonding chain in a molecule of a polymer compound configuring a resin, and the "side chain" represents a carbon chain which has been branched from the main chain.

(A-1)

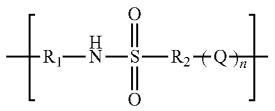

In Formula (A-1), $R_1$ and $R_2$ each independently represent a divalent linking group, Q represents a divalent structure including a sulfonamide group, and n represents an integer of 0 or greater.

In Formula (A-1), $R_1$ is preferably an alkylene group or an arylene group, more preferably an alkylene group having 4 or less carbon atoms or an arylene group having 6 to 10 carbon atoms, and still more preferably a phenylene group.

In addition, $R_2$ is preferably an arylene group, more preferably an arylene group having 6 to 10 carbon atoms, and still more preferably a phenylene group.

Both $R_1$ and $R_2$ are preferably arylene groups, and more preferably phenylene groups.

The alkylene group or the arylene group represented by $R_1$ or $R_2$ may be substituted, and the substituent is preferably an alkyl group having 6 or less carbon atoms, an alkoxy group having 6 or less carbon atoms, or a halogen atom, and more preferably an alkyl group having 4 or less carbon atoms.

Q represents a divalent structure including a sulfonamide group, and is preferably a structure represented by the following Formula (Q-1).

(Q-1)

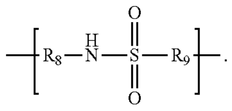

In Formula (Q-1), $R_8$ and $R_9$ each independently represent a single bond or a divalent linking group.

In Formula (Q-1), $R_8$ is preferably a single bond, an alkylene group, or an arylene group, more preferably an alkylene group or an arylene group, still more preferably an alkylene group having 4 or less carbon atoms or an arylene group having 6 to 10 carbon atoms, and particularly preferably a phenylene group. The arylene group or the alkylene group represented by $R_8$ may be substituted, and the substituent is preferably an alkyl group having 6 or less carbon atoms, an alkoxy group having 6 or less carbon atoms, or a halogen atom, and more preferably an alkyl group having 4 or less carbon atoms.

In Formula (Q-1), $R_9$ is preferably a single bond, an alkylene group, an arylene group, a carbonyl group, an ether bond, an amide bond, a sulfonyl group, or a group obtained by combing these linking groups, and more preferably a single bond, an arylene group, or a group obtained by combining an arylene group with a sulfonyl bond or an ether bond.

In a case where $R_9$ represents a group obtained by combining an arylene group with a sulfonyl bond or an ether bond, the arylene group is preferably bonded directly to the sulfur atom of the sulfonamide group in Formula (Q-1).

The alkylene group represented by $R_9$ may have any one of a linear chain shape, a branched chain shape, and a cyclic shape. In addition, the alkylene group is preferably an alkylene group having 6 or less carbon atoms, and the alkylene group represented by $R_9$ may be further substituted with a halogen atom, an aryl group, or an alkoxy group.

In Formula (A-1), $R_8$ in the structure represented by Formula (Q-1) may be bonded to $R_2$ in Formula (A-1), and $R_9$ may be bonded to $R_2$, but $R_9$ is preferably bonded to $R_2$.

n represents an integer of 0 or greater, preferably 0 or 1, and more preferably 1.

In addition, the constitutional unit A is preferably a constitutional unit represented by the following Formula (A-2).

(A-2)

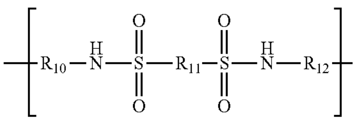

In Formula (A-2), $R_{10}$, $R_{11}$, and $R_{12}$ each independently represent a divalent linking group.

In Formula (A-2), each of $R_{10}$ and $R_{12}$ is independently preferably an alkylene group or an arylene group, more preferably an alkylene group having 4 or less carbon atoms or an arylene group having 6 to 10 carbon atoms, and still more preferably a phenylene group.

alkyl group having 6 or less carbon atoms, an alkoxy group having 6 or less carbon atoms, or a halogen atom, and more preferably an alkyl group having 4 or less carbon atoms.

In addition, the constitutional unit A in the specific polymer compound used in the present invention is preferably a constitutional unit derived from a structure obtained by removing two amino groups from the following exemplified compound.

SA-1

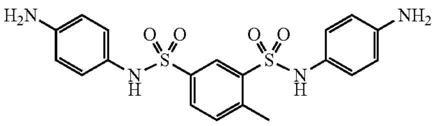

SA-2

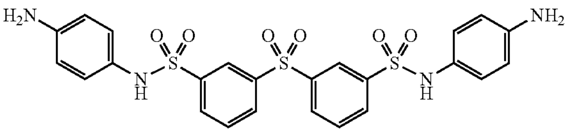

SA-3

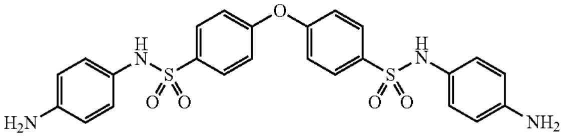

SA-4

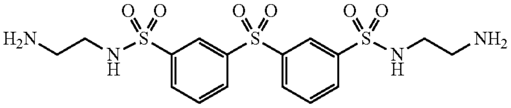

SA-5

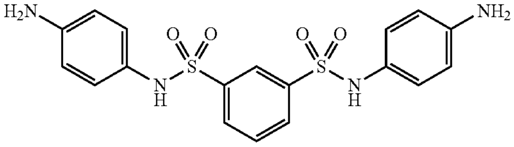

SA-6

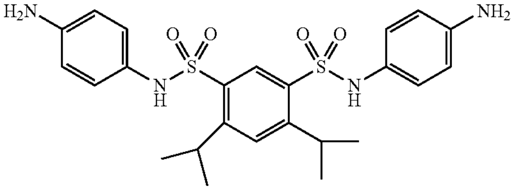

SA-7

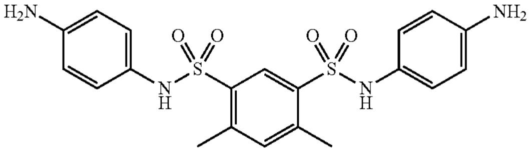

SA-8

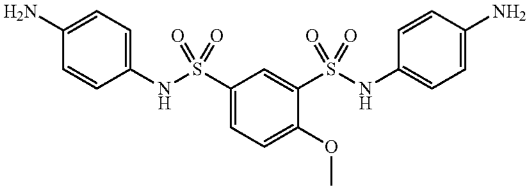

SA-9

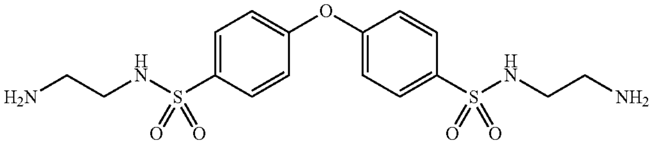

SA-10

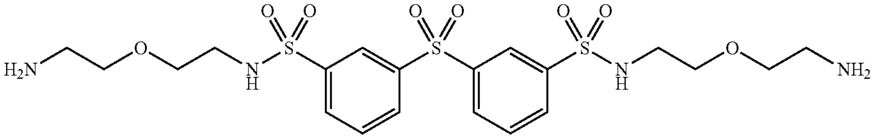

Both $R_{10}$ and $R_{12}$ are preferably arylene groups, and more preferably phenylene groups.

The arylene group or the alkylene group represented by $R_{10}$ or $R_{12}$ may be substituted, and the substituent is preferably an alkyl group having 6 or less carbon atoms, an alkoxy group having 6 or less carbon atoms, or a halogen atom, and more preferably an alkyl group having 4 or less carbon atoms.

In Formula (A-2), $R_{11}$ represents a divalent linking group, and is preferably an arylene group or a linking group represented by $-R_{13}-O-R_{14}-$ or $-R_{13}-SO_2-R_{14}-$, more preferably an arylene group, and still more preferably a phenylene group. $R_{13}$ and $R_{14}$ each independently represent an arylene group, and is preferably a phenylene group.

The arylene group or the phenylene group represented by $R_{11}$ may be substituted, and the substituent is preferably an The specific polymer compound used in the present invention preferably further contains a constitutional unit (constitutional unit A') represented by the following Formula (A-3) in the main chain.

(A-3)

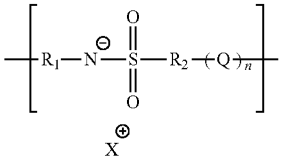

In Formula (A-3), $R_1$, $R_2$, Q, and n are the same as $R_1$, $R_2$, Q, and n in Formula (A-1) respectively, and X represents an organic or inorganic cation.

X may be an inorganic cation or an organic cation, and is preferably a cation derived from a monovalent basic compound described below.

By containing the constitutional unit A' in the specific polymer compound, a lithographic printing plate having excellent chemical resistance and printing durability is obtained.

The constitutional unit A' is a unit generated as a result of dissociation of the hydrogen atom in the sulfonamide group in the constitutional unit A In addition, to generate the constitutional unit A' from the constitutional unit A, a monovalent basic compound described below is preferably contained in the resin composition.

$R_1$, $R_2$, Q, and n in the constitutional unit A' in the specific polymer compound used in the present invention are the same as $R_1$, $R_2$, Q, and n in Formula (A-1), respectively, and preferable aspects thereof are also the same.

The ratio of the constitutional unit A with respect to the total mass of the constitutional unit A and the constitutional unit A' in the constitutional unit A' in the specific polymer compound used in the present invention is preferably 5% by mass to 90% by mass and more preferably 30% by mass to 60% by mass.

[Constitutional Unit B]

A constitutional unit B in the specific polymer compound used in the present invention contains at least one constitutional unit of constitutional units represented by each of the following Formulas (B-1) to (B-6).

(B-1)

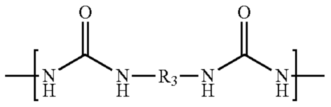

(B-2)

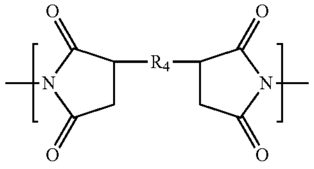

(B-3)

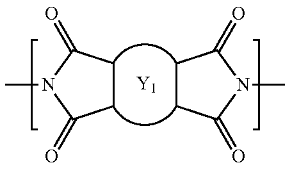

(B-4)

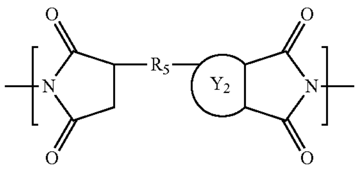

(B-5)

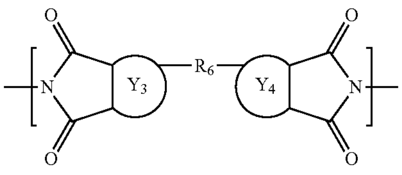

-continued (B-6)

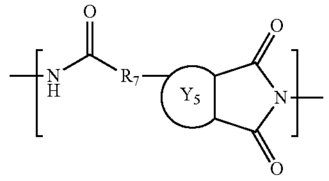

[Constitutional Unit B-1]

The specific polymer compound used in the present invention preferably further has a constitutional unit represented by the following Formula (B-1) as the constitutional unit B in the main chain.

(B-1)

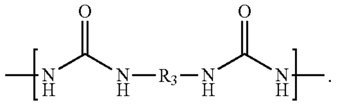

In Formula (B-1), $R_3$ represents a divalent linking group.

In Formula (B-1), $R_3$ preferably represents an alkylene group, an arylene group, or a group obtained by combining these.

In a case where $R_3$ represents an alkylene group, the alkylene group may have any one of a linear chain shape, a branched chain shape, and a cyclic shape, or may have a shape obtained by combining these.

The linear or branched alkylene group preferably has 1 to 20 carbon atoms, more preferably 2 to 14 carbon atoms, and still more preferably 2 to 10 carbon atoms. The alkylene group may have a substituent, and examples of the substituent include a halogen atom, an aryl group, and an alkoxy group.

In a case where $R_3$ represents an arylene group, the arylene group preferably has 6 to 18 carbon atoms, and is more preferably a phenylene group. In addition, a plurality of arylene groups may be linked by a linking group such as a carbonyl group, an ester bond, or an ether bond. The arylene group and the phenylene group may have a substituent, and as the substituent, an alkyl group having 1 to 6 carbon atoms, an alkoxy group having 1 to 6 carbon atoms, or a carboxy group is preferable, and a carboxy group is more preferable.

In a case where $R_3$ represents a group obtained by combining an alkylene group and an arylene group, the alkylene group is preferably a linear alkylene group having 1 to 6 carbon atoms. The alkylene may include a linking group such as a carbonyl group, an ester bond, or an ether bond. In addition, the alkylene group may have a substituent, and examples of the substituent include a halogen atom, an aryl group, and an alkoxy group. The arylene group is preferably a phenylene group. The phenylene group may be substituted, and as the substituent, an alkyl group having 1 to 6 carbon atoms, an alkoxy group having 1 to 6 carbon atoms, or a carboxy group is preferable, and a carboxy group is more preferable.

In addition, a plurality of arylene groups and alkylene groups may be combined.

The specific polymer compound used in the present invention may have only one type of the constitutional unit B-1, and preferably has two or more types of the constitutional unit B-1's.

In addition, the specific polymer compound used in the present invention more preferably includes two types of constitutional units of the constitutional unit B-1 in which $R_3$ is an alkylene group and the constitutional unit B-1 in which $R_3$ is an arylene group.

In addition, the constitutional unit B-1 in the specific polymer compound used in the present invention is preferably a constitutional unit derived from an exemplified compound obtained by reacting a diamine compound with a diisocyanate compound described below.

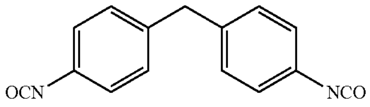

MDI

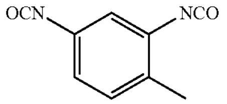

TDI

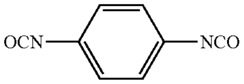

PPDI

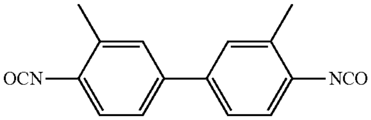

DMBPDI

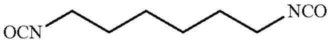

HDI

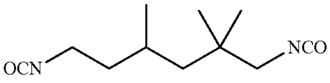

TMHDI

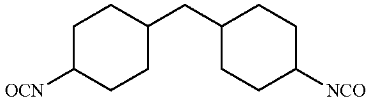

H12 MDI

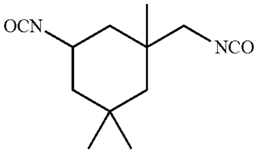

IPDI

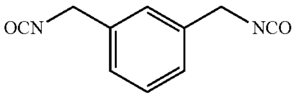

XDI

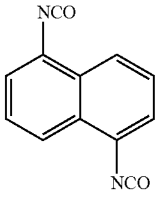

NDI

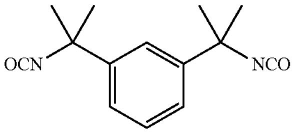

TMXDI

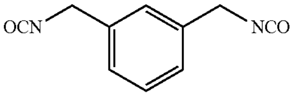

H6 XDI

Diamine compounds suitably used to synthesize the specific polymer compound are exemplified below.

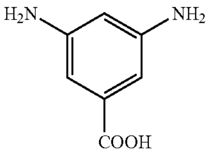

DABA

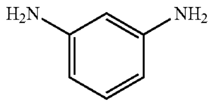

1,3-DAB

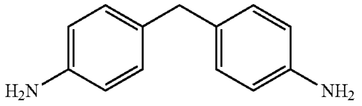

DDM

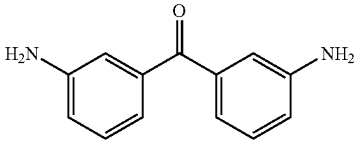

2,3,3-DADPM

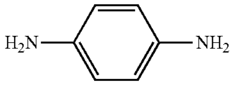

1,4-DAB

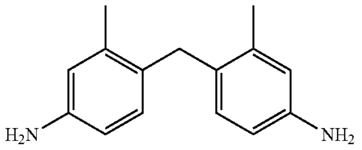

m-DDM

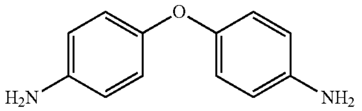

DDE

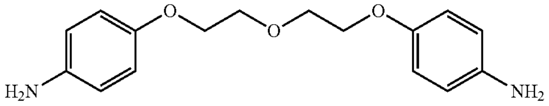

DEGDAPE

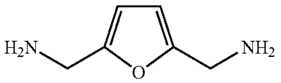

FDMA

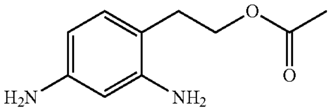

2,4-DAEA

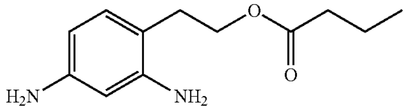

2,4-DAEB

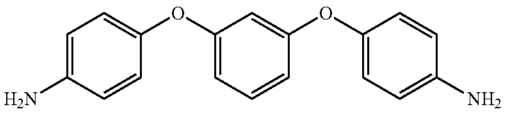

TPE-R

-continued

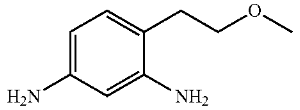

2,4-DAPEM

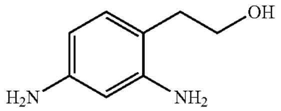

2,4-DAPE

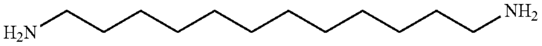

DDDA

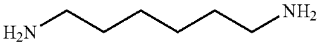

HMDA

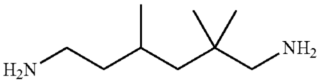

TMHMDA

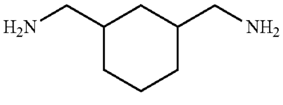

CHDAM

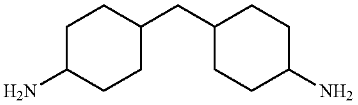

DADCM

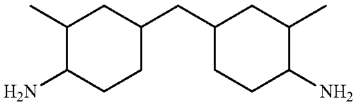

DAMDCM

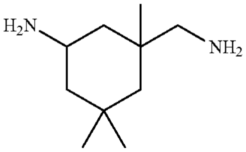

IPDA

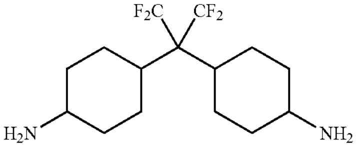

6FAP

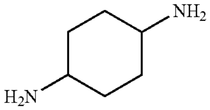

1,3-CHDA

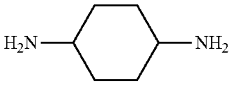

1,4-CHDA

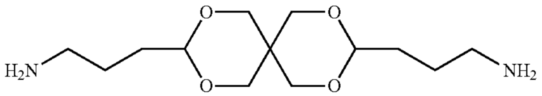

APTOSU

-continued

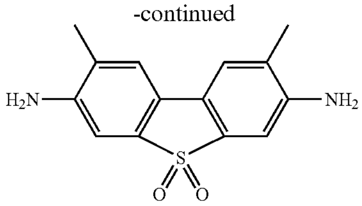

TSN

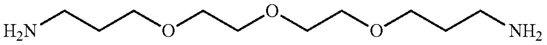

TOTDDA

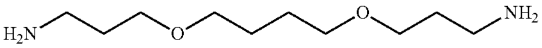

DODDA

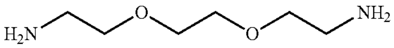

1,2-BAEE

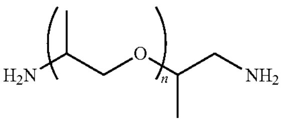

PEDA-1(Mn =2 30)

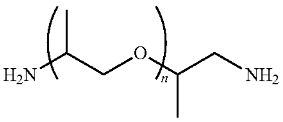

PEDA-2(Mn = 400)

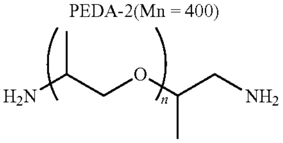

PEDA-3(Mn = 1000)

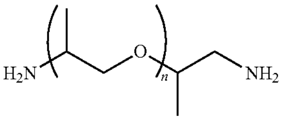

PEDA-4(Mn = 2000)

<Polymer Compound having Constitutional Unit A and Constitutional Unit B-1 in Main Chain>

A polymer compound having the constitutional unit A and the constitutional unit B-1 in the main chain is produced, for example, by sequential polymerization of a compound having two or more isocyanate groups and a compound having two or more amino groups.

The specific polymer compound used in the present invention is preferably produced by a sequential polymerization reaction of a compound having two or more isocyanate groups and a compound including at least one constitutional unit A and having two or more amino groups, and more preferably produced by a sequential polymerization reaction of a diisocyanate compound and a diamine compound including at least one constitutional unit A. In addition, it is preferable to allow to react after a diamine compound not including the constitutional unite A is further added.

The polymer compound containing the constitutional unit A and the constitutional unit B-1 in the main chain used in the present invention is preferably a linear polymer compound.

In addition, the polymer compound containing the constitutional unit A and the constitutional unit B-1 in the main chain used in the present invention preferably has a carboxyl group, more preferably has a carboxyl group bonded to the aromatic ring, and still more preferably has at least the following constitutional unit.

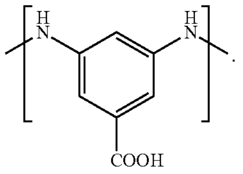

Preferable specific examples of the polymer compound containing the constitutional unit A and the constitutional unit B-1 in the main chain used in the present invention are shown in the following Tables 1 to 4. Each of Exemplified Compounds PU-1 to PU-68 means a polymer compound obtained by reacting a diamine compound with a diisocyanate compound described in Tables 1 to 4 in a ratio (molar ratio) described in Tables 1 to 4.

In addition, the weight average molecular weight (Mw) of a polymer is a value measured by GPC method.

The polymer compound containing the constitutional unit A and the constitutional unit B-1 used in the present invention is not limited to the specific examples described in Tables 1 to 4.

TABLE 1

| Specific polymer compound | Diisocyanate compound (molar ratio) | | Diamine compound (molar ratio) | | Mw (×10000) |
|---|---|---|---|---|---|
| PU-1 | HDI | — | SA-1 | DABA | 5.2 |
| | 50 | — | 30 | 20 | |
| PU-2 | HDI | — | SA-1 | DABA | 5.4 |
| | 50 | — | 25 | 15 | |
| PU-3 | H6 XDI | — | SA-1 | DABA | 5.0 |
| | 50 | — | 30 | 20 | |
| PU-4 | H6 XDI | — | SA-1 | — | 6.1 |
| | 50 | — | 50 | — | |
| PU-5 | HDI | MDI | SA-1 | DABA | 6.2 |
| | 30 | 20 | 30 | 20 | |
| PU-6 | TMHDI | — | SA-1 | DABA | 5.8 |
| | 50 | — | 25 | 15 | |
| PU-7 | TMHDI | H6 XDI | SA-1 | — | 5.9 |
| | 25 | 25 | 50 | — | |
| PU-8 | TMHDI | DMBPDI | SA-1 | — | 5.5 |
| | 25 | 25 | 50 | — | |
| PU-9 | DMBPDI | H6 XDI | SA-1 | DABA | 5.5 |
| | 20 | 30 | 30 | 20 | |
| PU-10 | IPDI | — | SA-1 | — | 5.2 |
| | 50 | — | 50 | — | |
| PU-11 | HDI | — | SA-2 | DABA | 5.4 |
| | 50 | — | 30 | 20 | |
| PU-12 | HDI | — | SA-2 | DABA | 6.2 |
| | 50 | — | 25 | 15 | |
| PU-13 | H6 XDI | — | SA-2 | DABA | 5.2 |
| | 50 | — | 30 | 20 | |
| PU-14 | H6 XDI | — | SA-2 | — | 5.1 |
| | 50 | — | 50 | — | |
| PU-15 | HDI | MDI | SA-2 | DABA | 5.3 |
| | 40 | 10 | 30 | 20 | |
| PU-16 | TMHDI | — | SA-2 | DABA | 5.2 |
| | 50 | — | 25 | 15 | |
| PU-17 | TMHDI | H6 XDI | SA-2 | — | 5.6 |
| | 25 | 25 | 50 | — | |
| PU-18 | TMHDI | DMBPDI | SA-2 | — | 6.2 |
| | 25 | 25 | 50 | — | |

TABLE 2

| Specific polymer compound | Diisocyanate compound (molar ratio) | | Diamine compound (molar ratio) | | Mw (×10000) |
|---|---|---|---|---|---|
| PU-19 | DMBPDI | H6 XDI | SA-2 | DABA | 5.8 |
| | 10 | 40 | 30 | 20 | |
| PU-20 | IPDI | — | SA-2 | — | 5.2 |
| | 50 | — | 50 | — | |
| PU-21 | HDI | — | SA-3 | DABA | 5.9 |
| | 50 | — | 30 | 20 | |
| PU-22 | HDI | — | SA-3 | DABA | 5.7 |
| | 50 | — | 25 | 15 | |
| PU-23 | H6 XDI | — | SA-3 | DABA | 5.9 |
| | 50 | — | 30 | 20 | |
| PU-24 | H6 XDI | — | SA-3 | — | 5.9 |
| | 50 | — | 50 | — | |
| PU-25 | HDI | MDI | SA-3 | DABA | 5.3 |
| | 40 | 10 | 30 | 20 | |
| PU-26 | TMHDI | — | SA-3 | DABA | 5.3 |
| | 50 | — | 25 | 15 | |
| PU-27 | TMHDI | H6 XDI | SA-3 | — | 5.2 |
| | 25 | 25 | 50 | — | |
| PU-28 | TMHDI | DMBPDI | SA-3 | — | 5.1 |
| | 25 | 25 | 50 | — | |
| PU-29 | DMBPDI | H6 XDI | SA-3 | DABA | 5.5 |
| | 20 | 30 | 30 | 20 | |
| PU-30 | IPDI | — | SA-3 | — | 5.6 |
| | 50 | — | 50 | — | |
| PU-31 | HDI | — | SA-4 | DABA | 5.5 |
| | 50 | — | 30 | 20 | |
| PU-32 | HDI | — | SA-4 | DABA | 5.6 |
| | 50 | — | 25 | 15 | |
| PU-33 | H6 XDI | — | SA-4 | DABA | 5.5 |
| | 50 | — | 30 | 20 | |
| PU-34 | H6 XDI | — | SA-4 | — | 5.7 |
| | 50 | — | 50 | — | |
| PU-35 | HDI | MDI | SA-4 | DABA | 5.3 |
| | 40 | 10 | 30 | 20 | |
| PU-36 | HDI | — | SA-5 | DABA | 4.8 |
| | 50 | — | 30 | 20 | |

TABLE 3

| Specific polymer compound | Diisocyanate compound (molar ratio) | | Diamine compound (molar ratio) | | Mw (×10000) |
|---|---|---|---|---|---|
| PU-37 | HDI | — | SA-5 | DABA | 4.9 |
| | 50 | — | 25 | 15 | |
| PU-38 | H6 XDI | — | SA-5 | DABA | 5.2 |
| | 50 | — | 40 | 10 | |
| PU-39 | H6 XDI | — | SA-5 | — | 5.3 |
| | 50 | — | 50 | — | |
| PU-40 | HDI | MDI | SA-5 | DABA | 5.8 |
| | 40 | 10 | 30 | 20 | |
| PU-41 | H6 XDI | — | SA-6 | DABA | 5.9 |
| | 50 | — | 30 | 20 | |
| PU-42 | HDI | MDI | SA-6 | DABA | 5.8 |
| | 40 | 10 | 40 | 10 | |
| PU-43 | HDI | — | SA-6 | DABA | 5.3 |
| | 50 | — | 30 | 20 | |
| PU-44 | HDI | — | SA-6 | DABA | 5.2 |
| | 50 | — | 25 | 15 | |
| PU-45 | H6 XDI | — | SA-6 | DABA | 5.3 |
| | 50 | — | 35 | 15 | |
| PU-46 | H6 XDI | — | SA-6 | — | 5.5 |
| | 50 | — | 50 | — | |
| PU-47 | HDI | MDI | SA-6 | DABA | 5.5 |
| | 30 | 20 | 30 | 20 | |
| PU-48 | H6 XDI | — | SA-1 | DDM | 5.5 |
| | 50 | — | 45 | 5 | |
| PU-49 | H6 XDI | — | SA-1 | m-DDM | 5.8 |
| | 50 | — | 45 | 5 | |
| PU-50 | H6 XDI | — | SA-1 | DEGDAPE | 5.8 |
| | 50 | — | 45 | 5 | |
| PU-51 | H6 XDI | — | SA-1 | FDMA | 5.2 |
| | 50 | — | 45 | 5 | |

TABLE 3-continued

| Specific polymer compound | Diisocyanate compound (molar ratio) | | Diamine compound (molar ratio) | | Mw (×10000) |
|---|---|---|---|---|---|
| PU-52 | H6 XDI | — | SA-1 | 2.4-DAEA | 5.8 |
| | 50 | — | 45 | 5 | |
| PU-53 | H6 XDI | — | SA-1 | DDDA | 5.9 |
| | 50 | — | 45 | 5 | |

TABLE 4

| Specific polymer compound | Diisocyanate compound (molar ratio) | | Diamine compound (molar ratio) | | Mw (×10000) |
|---|---|---|---|---|---|
| PU-54 | HDI | — | SA-8 | DABA | 5.2 |
| | 50 | — | 30 | 20 | |
| PU-55 | HDI | — | SA-9 | DABA | 5.4 |
| | 50 | — | 30 | 20 | |
| PU-56 | HDI | — | SA-10 | DABA | 5.2 |
| | 50 | — | 30 | 20 | |
| PU-57 | HDI | — | SA-1 | PEDA-2 | 5.3 |
| | 50 | — | 45 | 5 | |
| PU-58 | HDI | — | SA-1 | PEDA-2 | 5.4 |
| | 50 | — | 40 | 10 | |
| PU-59 | HDI | — | SA-1 | PEDA-3 | 4.9 |
| | 50 | — | 49 | 1 | |
| PU-60 | HDI | — | SA-1 | PEDA-3 | 4.8 |
| | 50 | — | 48 | 2 | |
| PU-61 | HDI | — | SA-1 | TOTDDA | 5.6 |
| | 50 | — | 45 | 5 | |
| PU-62 | HDI | — | SA-1 | TOTDDA | 5.1 |
| | 50 | — | 40 | 10 | |
| PU-63 | HDI | — | SA-1 | DODDA | 5.6 |
| | 50 | — | 45 | 5 | |
| PU-64 | HDI | — | SA-1 | DODDA | 5.7 |
| | 50 | — | 40 | 10 | |
| PU-65 | HDI | — | SA-4 | PEDA-2 | 5.5 |
| | 50 | — | 45 | 5 | |
| PU-66 | HDI | — | SA-4 | TOTDDA | 5.5 |
| | 50 | — | 45 | 5 | |
| PU-67 | HDI | — | SA-8 | PEDA-2 | 5.4 |
| | 50 | — | 45 | 5 | |
| PU-68 | HDI | — | SA-8 | TOTDDA | 5.6 |
| | 50 | — | 45 | 5 | |

Among these, as the polymer compound containing the constitutional unit A and the constitutional unit B-1, PU-1, PU-3, PU-6, PU-8, PU-57, PU-63, PU-65, or PU-66 is preferable.

As one example of the specific polymer compound used in the present invention, the structural formula of PU-1 in Table 1 is shown below. Moreover, the number at the bottom right of the parenthesis represents a molar ratio.

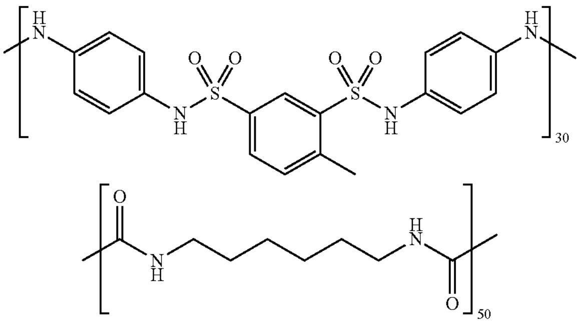

-continued

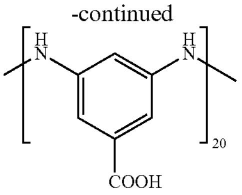

The molar ratio between the constitutional unit A and the constitutional unit B-1 in the polymer compound having the constitutional unit A and the constitutional unit B-1 is preferably 3:1 to 1:3, more preferably 2:1 to 1:2, and still more preferably 1.5:1 to 1:1.

If the content of the constitutional units A and B-1 is within the above range, it is possible to obtain a resin composition having excellent chemical resistance.

[Constitutional Units B-2 to B-6]

The specific polymer compound used in the present invention preferably has at least one of constitutional units represented by the following Formulas (B-2) to (B-6) as the constitutional unit B in the main chain.

(B-2)

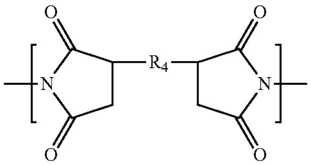

(B-3)

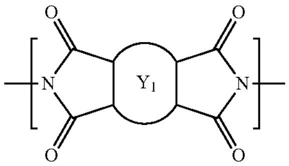

(B-4)

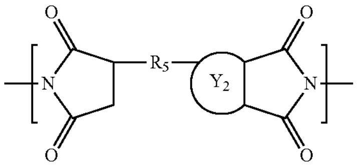

(B-5)

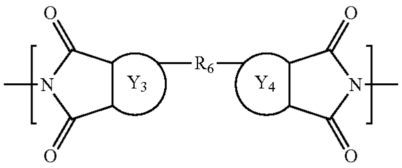

(B-6)

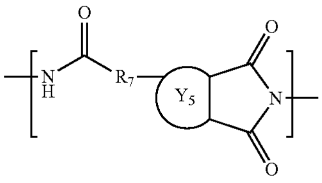

In Formulas (B-2) to (B-6), $R_4$ to $R_7$ each independently represent a single bond or a divalent linking group, and $Y_1$ to $Y_5$ each independently represent an aromatic hydrocarbon ring or an aliphatic hydrocarbon ring.

In Formula (B-2), $R_4$ preferably represents a single bond, an alkylene group, or an arylene group, and more preferably a single bond.

In a case where $R_4$ represents an alkylene group, the alkylene group may be linear, branched, or cyclic.

The linear or branched alkylene group preferably has 1 to 20 carbon atoms, more preferably 1 to 14 carbon atoms, and still more preferably 1 to 10 carbon atoms. The alkylene group may have a substituent, and examples of a preferable substituent include a halogen atom, an aryl group, and an alkoxy group.

In a case where $R_4$ represents an arylene group, the arylene group preferably has 6 to 20 carbon atoms, and more preferably has 6 to 16 carbon atoms. The arylene group may have a substituent, and examples of a preferable substituent include an alkyl group having 1 to 6 carbon atoms, an alkoxy group having 1 to 6 carbon atoms, and a halogen atom.

In Formula (B-3), $Y_1$ is preferably an aromatic hydrocarbon ring, and more preferably a benzene ring.

In addition, in a case where $Y_1$ represents an aliphatic hydrocarbon ring, the aliphatic hydrocarbon ring is preferably an aliphatic hydrocarbon ring having 4 to 20 carbon atoms, and more preferably an aliphatic hydrocarbon ring having 4 to 10 carbon atoms.

$Y_1$ may be substituted, and examples of a preferable substituent include an alkyl group having 1 to 6 carbon atoms, an alkoxy group having 1 to 6 carbon atoms, and a halogen atom.

In Formula (B-4), $Y_2$ is preferably an aromatic hydrocarbon ring, and more preferably a benzene ring.

In addition, in a case where $Y_2$ represents an aliphatic hydrocarbon ring, the aliphatic hydrocarbon ring is preferably an aliphatic hydrocarbon ring having 4 to 20 carbon atoms, and more preferably an aliphatic hydrocarbon ring having 4 to 12 carbon atoms.

$Y_2$ may be substituted, and examples of a preferable substituent include an alkyl group having 1 to 6 carbon atoms, an alkoxy group having 1 to 6 carbon atoms, a halogen atom, and an aryl group.

In Formula (B-4), $R_5$ preferably represents a single bond, an alkylene group, or an arylene group, and more preferably a single bond.

In a case where $R_5$ represents an alkylene group, the alkylene group may be linear, branched, or cyclic.

The linear or branched alkylene group preferably has 1 to 20 carbon atoms, more preferably 1 to 14 carbon atoms, and still more preferably 1 to 10 carbon atoms. The alkylene group may have a substituent, and examples of a preferable substituent include a halogen atom, an aryl group, and an alkoxy group.

In Formula (B-5), both $Y_3$ and $Y_4$ are preferably an aromatic hydrocarbon rings, and more preferably benzene rings.

$Y_3$ and $Y_4$ may be substituted, and examples of a preferable substituent include a hydrocarbon group having 1 to 6 carbon atoms, a halogen atom, and an alkoxy group having 1 to 6 carbon atoms.

In Formula (B-5), $R_6$ preferably represents a single bond, an alkylene group, a carbonyl group, an ether bond, an amide bond, an arylene group, a sulfonyl group, or a group obtained by combing these linking groups, and more preferably a single bond.

The alkylene group may have any one of a linear chain shape, a branched chain shape, and a cyclic shape. In addition, the alkylene group is preferably an alkylene group having 6 or less carbon atoms, and the alkylene group may be further substituted with a halogen atom, an aryl group, or an alkoxy group.

In addition, in a case where at least one of $Y_3$ or $Y_4$ represents an aliphatic hydrocarbon ring, $R_5$ preferably includes an arylene group.

In Formula (B-6), $Y_5$ is preferably an aromatic hydrocarbon ring, and more preferably a benzene ring.

$Y_5$ may be substituted, and examples of a preferable substituent include a hydrocarbon group having 1 to 12 carbon atoms, a halogen atom, and an alkoxy group having 1 to 12 carbon atoms.

In Formula (B-6), $R_7$ preferably represents a single bond, an alkylene group, or an arylene group, and more preferably a single bond.

The specific polymer compound used in the present invention may have only one type of constitutional unit included in the constitutional units B-2 to B-6, and preferably has two or more types of constitutional units included in the constitutional units B-2 to B-6.

In addition, the specific polymer compound used in the present invention preferably has at least one constitutional unit selected from the group consisting of the constitutional unit B-3 and the constitutional unit B-6 and at least one constitutional unit selected from the group consisting of the constitutional unit B-4 and the constitutional unit B-5, and more preferably has the constituent unit B-5 and the constituent unit B-6, from the viewpoint of printing durability of the obtained lithographic printing plate.

In addition, the constitutional units B-2 to B-6 in the specific polymer compound used in the present invention are preferably constitutional units derived from the following exemplified compounds.

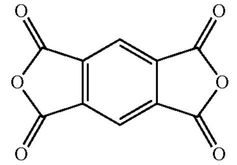

PMDA

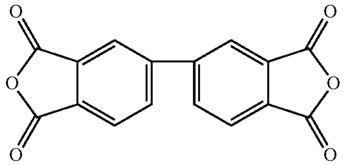

BPDA

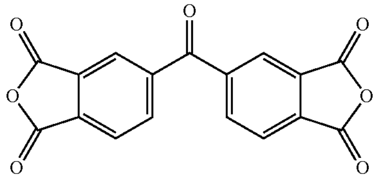

BPTCDA

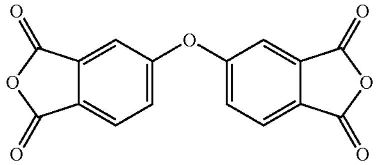

ODA

-continued

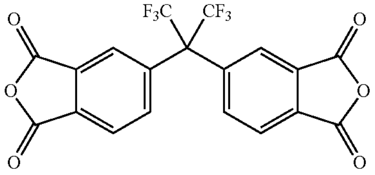

HFIDA

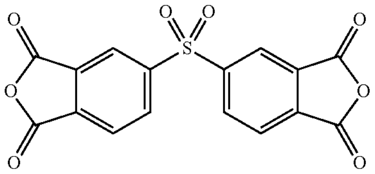

DPSCDA

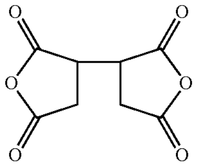

m-BTCDA

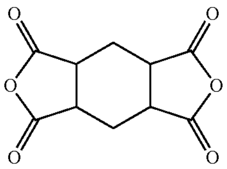

PMDA-HS

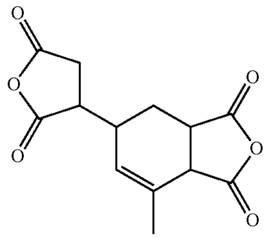

n-CHDA

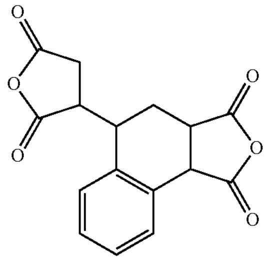

THNDA

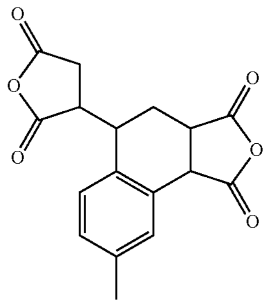

m-THNDA

-continued

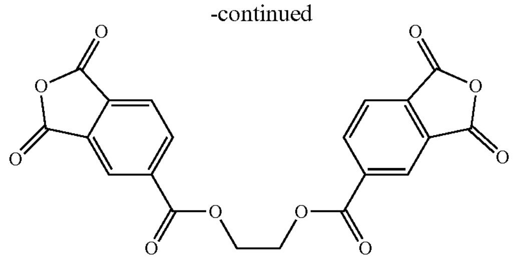

TMEG

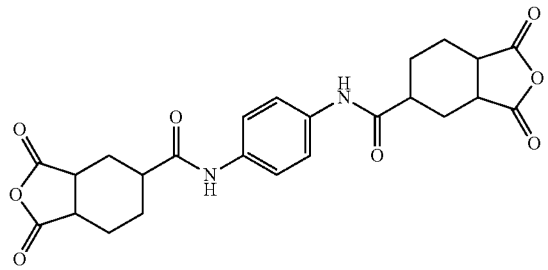

PPHT

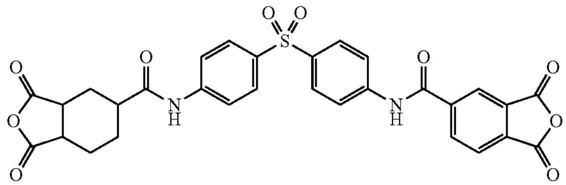

PSHT

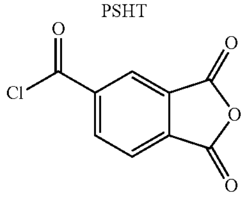

TMAC

<Polymer Compound Having Constitutional Unit A and at Least One of Constitutional Unit B-2, . . . , or B-6>

The polymer compound having the constitutional unit A and at least one of Constitutional Unit B-2, . . . , or B-6 is produced, for example, by a condensation reaction between a compound having two or more acid anhydride groups or a compound having at least one of each of an acid halide group and an acid anhydride group and a compound having one or more amino groups.

The specific polymer compound used in the present invention includes a compound having two or more acid anhydride groups or a compound having at least one of each of an acid halide group and an acid anhydride group and at least one constitutional unit A, is preferably produced by a condensation reaction with a compound having two or more amino groups, and more preferably produced by a condensation reaction between a compound having two acid anhydride groups or a compound having at least one of each of an acid halide group and an acid anhydride group and a diamine compound including at least one constitutional unit A. In addition, after a diamine compound not including the constitutional unite A is added, a reaction may be performed.

Preferable specific examples of the polymer compound having the constitutional unit A and at least one of the constitutional unit B-2, . . . , or B-6 which can be used in the present invention are shown in the following Tables 5 to 7.

Each of PI-1 to PI-41 means a specific polymer compound obtained by reacting a compound having an acid anhydride group with a diamine compound described in Table 5 to 7 in a ratio (molar ratio) described in Tables 5 to 7.

In addition, the weight average molecular weight (Mw) of a polymer is a value measured by GPC method.

The specific polymer compound having the constitutional unit A and at least one of the constitutional unit B-2, . . . , or B-6 used in the present invention is not limited to the specific examples described in the following Tables 5 to 7.

TABLE 5

| Specific polymer compound | Compound including acid anhydride group (molar ratio) | | Diamine compound (molar ratio) | | Mw (×10000) |
|---|---|---|---|---|---|
| PI-1 | PMDA | BPDA | SA-1 | — | 7.5 |
| | 25 | 25 | 50 | — | |
| PI-2 | PMDA | BPTCDA | SA-1 | — | 8.5 |
| | 25 | 25 | 50 | — | |
| PI-3 | PMDA | ODA | SA-1 | — | 7.2 |
| | 25 | 25 | 50 | — | |
| PI-4 | PMDA | m-CHDA | SA-1 | — | 6.8 |
| | 25 | 25 | 50 | — | |
| PI-5 | PMDA | THNDA | SA-1 | — | 6.2 |
| | 25 | 25 | 50 | — | |
| PI-6 | PMDA-HS | DPSCDA | SA-1 | — | 5.8 |
| | 25 | 25 | 50 | — | |
| PI-7 | PMDA-HS | TMEG | SA-1 | — | 5.9 |
| | 30 | 20 | 50 | — | |
| PI-8 | PMDA | PPHT | SA-1 | — | 6.5 |
| | 40 | 10 | 50 | — | |
| PI-9 | PMDA | PSHT | SA-1 | — | 5.5 |
| | 40 | 10 | 50 | — | |
| PI-10 | PMDA | — | SA-2 | — | 6.8 |
| | 50 | — | 50 | — | |
| PI-11 | PMDA | — | SA-3 | — | 7.1 |
| | 50 | — | 50 | — | |
| PI-12 | PMDA | BPDA | SA-4 | — | 6.2 |
| | 25 | 25 | 50 | — | |
| PI-13 | PMDA | BPDA | SA-5 | — | 5.9 |
| | 25 | 25 | 50 | — | |

TABLE 6

| Specific polymer compound | Compound including acid anhydride group (molar ratio) | | Diamine compound (molar ratio) | | Mw (×10000) |
|---|---|---|---|---|---|
| PI-14 | PMDA | BPDA | SA-6 | — | 4.8 |
| | 30 | 20 | 50 | — | |
| PI-15 | TMAc | — | SA-1 | — | 5.3 |
| | 50 | — | 50 | — | |
| PI-16 | TMAc | — | SA-3 | — | 5.2 |
| | 50 | — | 50 | — | |
| PI-17 | TMAc | BPDA | SA-1 | — | 5.6 |
| | 25 | 25 | 50 | — | |
| PI-18 | TMAc | BPTCDA | SA-1 | — | 6.2 |
| | 25 | 25 | 50 | — | |
| PI-19 | TMAc | ODA | SA-1 | — | 8.9 |
| | 25 | 25 | 50 | — | |
| PI-20 | TMAc | m-CHDA | SA-1 | — | 7.5 |
| | 25 | 25 | 50 | — | |
| PI-21 | TMAc | THNDA | SA-1 | — | 6.4 |
| | 25 | 25 | 50 | — | |
| PI-22 | PMDA | — | SA-1 | m-DDM | 6.5 |
| | 50 | — | 45 | 5 | |
| PI-23 | PMDA | — | SA-1 | CHDAM | 7.1 |
| | 50 | — | 40 | 10 | |
| PI-24 | PMDA | — | SA-1 | DAMDCM | 6.4 |
| | 50 | — | 45 | 5 | |
| PI-25 | PMDA | — | SA-1 | HMDA | 4.9 |
| | 50 | — | 40 | 10 | |
| PI-26 | PMDA | — | SA-1 | DEGDAPE | 8.1 |
| | 50 | — | 40 | 10 | |

TABLE 7

| Specific polymer compound | Compound including acid anhydride group (molar ratio) | | Diamine compound (molar ratio) | | Mw (×10000) |
|---|---|---|---|---|---|
| PI-27 | PMDA | BPDA | SA-8 | — | 6.5 |
| | 25 | 25 | 50 | — | |
| PI-28 | PMDA | BPDA | SA-9 | — | 5.6 |
| | 30 | 20 | 50 | — | |
| PI-29 | PMDA | BPDA | SA-10 | — | 4.5 |
| | 30 | 20 | 50 | — | |
| PI-30 | PMDA | BPDA | SA-1 | PEDA-2 | 6.5 |
| | 30 | 20 | 45 | 5 | |
| PI-31 | PMDA | BPDA | SA-1 | PEDA-2 | 6.8 |
| | 30 | 20 | 40 | 10 | |
| PI-32 | PMDA | BPDA | SA-1 | PEDA-3 | 5.9 |
| | 30 | 20 | 49 | 1 | |
| PI-33 | PMDA | BPDA | SA-1 | PEDA-3 | 5.8 |
| | 30 | 20 | 48 | 2 | |
| PI-34 | PMDA | BPDA | SA-1 | TOTDDA | 5.7 |
| | 30 | 20 | 45 | 5 | |
| PI-35 | PMDA | BPDA | SA-1 | TOTDDA | 5.6 |
| | 30 | 20 | 40 | 10 | |
| PI-36 | PMDA | BPDA | SA-1 | DODDA | 6.4 |
| | 30 | 20 | 45 | 5 | |
| PI-37 | PMDA | BPDA | SA-1 | DODDA | 5.8 |
| | 30 | 20 | 40 | 10 | |
| PI-38 | PMDA | BPDA | SA-4 | PEDA-2 | 7.1 |
| | 30 | 20 | 45 | 5 | |
| PI-39 | PMDA | BPDA | SA-4 | TOTDDA | 6.9 |
| | 30 | 20 | 45 | 5 | |
| PI-40 | PMDA | BPDA | SA-8 | PEDA-2 | 6.1 |
| | 30 | 20 | 45 | 5 | |
| PI-41 | PMDA | BPDA | SA-8 | TOTDDA | 5.8 |
| | 30 | 20 | 45 | 5 | |

As one example of the specific polymer compound used in the present invention, the structural formula of PI-1 in Table 5 is shown below. Moreover, the number at the bottom right of the parenthesis represents a molar ratio.

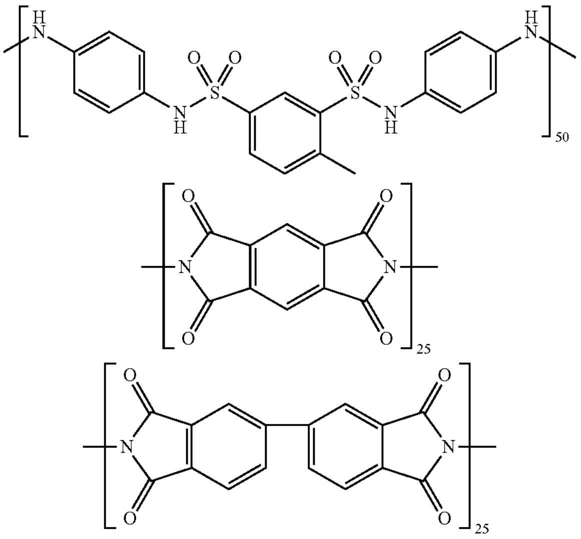

Among these, as the specific polymer compound having the constitutional unit A and at least one of the constitutional unit B-2, . . . , or B-6, PI-1, PI-2, PI-3, PI-17, PI-18, PI-09, PI-21, PI-23, PI-30, PI-32, or PI-34 is preferable.

The molar ratio of the constitutional unit A to all the constitutional units included in the constitutional units B-2 to B-6 in the specific polymer compound having the constitutional unit A and at least one of the constitutional unit B-2, . . . , or B-6 is preferably 3:1 to 1:3, more preferably 2:1 to 1:2, and still more preferably 1.5:1 to 1:1.

If the content of the constitutional unit A and the constitutional units B-2 to B-6 is within the above range, it is possible to obtain a resin composition having excellent chemical resistance.

In addition, the specific polymer compound used in the present invention preferably has at least one constitutional unit selected from the constitutional units B-1, B-3, B-4, and B-5 as the constitutional unit B, more preferably has the constitutional unit represented by Formula (B-1) or (B-6), from the viewpoint of image formability, printing durability, and production suitability, and still more preferably has the constitutional unit represented by Formula (B-1) as the constituent unit B from the viewpoint of printing durability and production suitability.

[Alkyleneoxy Group]

The specific polymer composition of the present invention preferably further has an alkyleneoxy group in the main chain.

According to the above aspect, it is possible to obtain a photosensitive resin composition which is good in image formability of the obtained lithographic printing plate and good in printing durability of the obtained lithographic printing plate.

The alkyleneoxy group is preferably derived from a diamine compound not including the constitutional unit A, described in the synthetic method of a polymer compound having the constitutional unit A and constitutional unit B-1 in the main chain and a polymer compound having the constitutional unit A and at least one constitutional unit of the constitutional units B-2, . . . , or B-6.

The alkyleneoxy group is preferably an alkyleneoxy group having 2 to 10 carbon atoms, more preferably an alkyleneoxy group having 2 to 8 carbon atoms, still more preferably an alkyleneoxy group having 2 to 4 carbon atoms, and particularly preferably an ethyleneoxy group, a propyleneoxy group, or an isopropyleneoxy group.

In addition, the alkyleneoxy group may be a polyalkyleneoxy group.

The alkyleneoxy group is preferably a polyalkyleneoxy group having a repetition number of 2 to 50, more preferably a polyalkyleneoxy group having a repetition number of 2 to 40, and still more preferably a polyalkyleneoxy group having a repetition number of 2 to 30.

The preferable number of carbon atoms of the constitution repeating unit of the polyalkyleneoxy group is the same as the preferable number of carbon atoms of the above polyalkyleneoxy group.

The content of the specific polymer compound in the photosensitive resin composition of the present invention is preferably 10% by mass to 90% by mass, more preferably 20% by mass to 80% by mass, and still more preferably 40% by mass to 70% by mass, with respect to the total solid content mass of the photosensitive resin composition. If the content is within the above range, the pattern formability at the time of development becomes good. Moreover, the total solid content mass of the photosensitive resin composition refers to the amount of the photosensitive resin composition excluding a volatile component such as a solvent.

The weight average molecular weight of the specific polymer compound in the photosensitive resin composition of the present invention is preferably 5,000 to 300,000, more preferably 10,000 to 200,000, and still more preferably 30,000 to 100,000.

Moreover, the measurement of the weight average molecular weight and the number average molecular weight in the present invention is preferably measured by a standard polystyrene conversion method using gel permeation chromatography (GPC). In the measurement performed by gel permeation chromatography in the present invention, as the GPC column, a column filled with polystyrene crosslinked gel (TSKgel SuperAWM-H; manufactured by Tosoh Corporation) was used, and as the GPC solvent, N-methylpyrrolidone (0.01 mol/L of each of phosphoric acid and lithium bromide) was used.

<Infrared Absorbent>

The photosensitive resin composition of the present invention contains an infrared absorbent.

The infrared absorbent is not particularly limited as long as it is a dye which generates heat by absorbing infrared light, and various dyes known as the infrared absorbent can be used.

As the infrared absorbent which can be used in the present invention, commercially available dyes or known dyes described in documents (for example, "Dye Handbook", compiled by the Society of Synthetic Organic Chemistry, published in 1970) can be used. Specifically, dyes such as azo dyes, metal complex azo dyes, pyrazolone azo dyes, anthraquinone dyes, phthalocyanine dyes, carbonium dyes, quinone imine dyes, methine dyes, and cyanine dyes are exemplified. In the present invention, among these dyes, a dye absorbing at least infrared light or near infrared light is preferable from the viewpoint of being suitable for use in laser emitting infrared light or near infrared light, and a cyanine dye is particularly preferable.

Examples of such a dye absorbing at least infrared light or near infrared light include the cyanine dyes described in JP1983-125246A (JP-S58-125246A), JP1984-84356A (JP-S59-84356A), JP-1984-202829A (JP-S59-202829A), or JP1985-78787A (JP-S60-78787A), the methine dyes described in JP1983-173696A (JP-S58-173696A), JP1983-181690A (JP-S58-181690A), or JP1983-194595A (JP-S58-194595A), the naphthoquinone dyes described in JP1983-112793A (JP-S58-112793A), JP1983-224793A (JP-S58-224793A), JP1984-48187A (JP-S59-48187A), JP1984-73996A (JP-S59-73996A), JP1985-52940A (JP-S60-52940A), or JP1985-63744A (JP-S60-63744A), the squarylium coloring agents described in JP1983-112792A (JP-S58-112792A), and the cyanine dyes described in GB434875B.

In addition, as the dye, the near infrared absorbing sensitizers described in U.S. Pat. No. 5,156,938A are also suitably used, also, the substituted aryl benzo(thio)pyrylium salts described in U.S. Pat. No. 3,881,924A, the trimethinecyanine thiapyrylium salts described in JP1982-142645A (JP-S57-142645A) (U.S. Pat. No. 4,327,169A), the pyrylium-based compounds described in JP1983-181051A (JP-S58-181051A), JP1983-220143A (JP-S58-220143A), JP1984-41363A (JP-S59-41363A), JP1984-84248A (JP-S59-84248A), JP1984-84249A (JP-S59-84249A), JP1984-146063A (JP-S59-146063A), or JP1984-146061A (JP-S59-146061A), the cyanine coloring agents described in JP1984-216146A (JP-S59-216146A), the pentamethinethiopyrylium salts described in U.S. Pat. No. 4,283,475A, or the pyrylium compounds described in JP1993-13514B (JP-H05-13514B) or JP1993-19702B (JP-H05-19702B) are used, and as commercially available products, Epolight III-178, Epolight III-130, Epolight III-125, or the like manufactured by Epolin Inc. is particularly preferably used.

In addition, particularly preferable another examples of the dye include near infrared absorbing dyes described as Formula (I) or (II) in U.S. Pat. No. 4,756,993A.

Among these dyes, examples of a particularly preferable dye include a cyanine coloring agent, a phthalocyanine dye, an oxonol dye, a squarylium coloring agent, a pyrylium salt, a thiopyrylium dye, and a nickel thiolate complex. Furthermore, in a case where a cyanine coloring agent represented by the following Formula (a) is used in the upper layer in the present invention, a high polymerization activity is given and the stability and the economic efficiency become excellent, and thus, the cyanine dye is most preferable.

Formula (a)

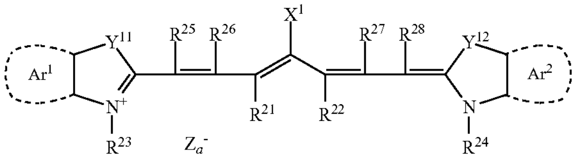

In Formula (a), $X^1$ represents a hydrogen atom, a halogen atom, a diarylamino group (—$NPh_2$), $X^2$-$L^1$, or a group shown below. $X^2$ represents an oxygen atom or a sulfur atom. $L^1$ represents a hydrocarbon group having 1 to 12 carbon atoms, an aromatic ring having a heteroatom, or a hydrocarbon group having 1 to 12 carbon atoms including a heteroatom. Here, the heteroatom represents N, S, O, a halogen atom, or Se.

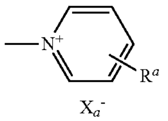

In the formula, $Xa^-$ has the same definition as $Za^-$ described below, and $R^a$ represents a substituent selected from a hydrogen atom, an alkyl group, an aryl group, a substituted or unsubstituted amino group, and a halogen atom.

$R^{21}$ and $R^{22}$ each independently represent a hydrocarbon group having 1 to 12 carbon atoms. From the viewpoint of storage stability of a photosensitive layer coating solution, each of $R^{21}$ and $R^{22}$ is preferably a hydrocarbon group having two or more carbon atoms, and $R^{21}$ and $R^{22}$ are particularly preferably bonded to each other to form a 5-membered ring or a 6-membered ring.

$Ar^1$ and $Ar^2$ may be the same as or different from each other, and $Ar^1$ and $Ar^2$ each represent an aromatic hydrocarbon group which may have a substituent. Examples of a preferable aromatic hydrocarbon group include a benzene ring and a naphthalene ring. In addition, examples of a preferable substituent include a hydrocarbon group having 12 or less carbon atoms, a halogen atom, and an alkoxy group having 12 or less carbon atoms.

$Y^{11}$ and $Y^{12}$ may be the same as or different from each other, and $Y^{11}$ and $Y^{12}$ each represent a sulfur atom or a dialkyl methylene group having 12 or less carbon atoms. $R^{23}$ and $R^{24}$ may be the same as or different from each other, and $R^{23}$ and $R^{24}$ each represent a hydrocarbon group having 20 or less carbon atoms which may have a substituent. Examples of a preferable substituent include an alkoxy group having 12 or less carbon atoms, a carboxyl group, and a sulfo group.

$R^{25}$, $R^{26}$, $R^{27}$, and $R^{28}$ may be the same as or different from each other, and $R^{25}$, $R^{26}$, $R^{27}$, and $R^{28}$ each represent a hydrogen atom or a hydrocarbon group having 12 or less carbon atoms. From the viewpoint of availability of a raw material, each of $R^{25}$, $R^{26}$, $R^{27}$, and $R^{28}$ is preferably a hydrogen atom. In addition, $Z_a^-$ represents a counter anion. Here, the cyanine coloring agent represented by Formula (a) has an anionic substituent in the structure thereof, and in a case where neutralization of the charge is not necessary, $Z_a^-$ is not necessary. From the viewpoint of storage stability of a photosensitive layer coating solution, preferable $Z_a^-$ is a halide ion, a perchlorate ion, a tetrafluoroborate ion, a hexafluorophosphate ion, or a sulfonate ion, and particularly preferably a perchlorate ion, a hexafluorophosphate ion, or an arylsulfonate ion.

Specific examples of the cyanine coloring agent represented by Formula (a) which can be suitably used include the cyanine coloring agents described in paragraphs 0017 to 0019 of JP2001-133969A, paragraphs 0012 to 0038 of JP2002-40638A, and paragraphs 0012 to 0023 of JP2002-23360A.

The infrared absorbent contained in the upper layer is particularly preferably a cyanine dye A shown below.

Cyanine dye A

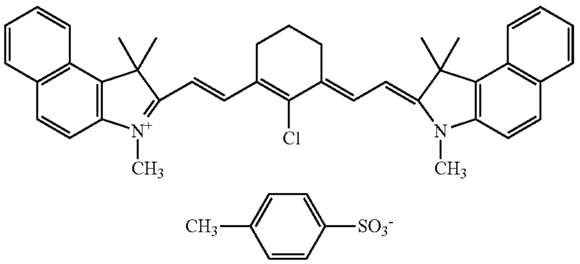

The addition amount when an infrared absorbent is added to the photosensitive resin composition of the present invention is preferably 0.01% by mass to 50% by mass, more preferably 0.1% by mass to 30% by mass, and particularly preferably 1.0% by mass to 30% by mass, with respect to the total solid content in the photosensitive resin composition. If the addition amount is 0.01% by mass or greater, the layer becomes high sensitive, and if the amount added is 50% by mass or less, the uniformity of the layer is good and the durability of the layer is excellent.

Other components may be contained in the photosensitive resin composition of the present invention, as desired, as long as the effects of the present invention are not impaired.

Hereinafter, a monovalent basic compound, other alkali-soluble resins, an acid generator, an acid proliferative agent, and other additives which are arbitrary components of the photosensitive resin composition of the present invention will be described.

<Monovalent Basic Compound>

The photosensitive resin composition of the present invention preferably includes a monovalent basic compound.

The monovalent basic compound used in the present invention means a monovalent basic compound capable of forming the constitutional unit A and the salt structure in the specific polymer compound, and preferred examples thereof include hydroxide or oxide of an alkali metal, hydrogen carbonate, alkoxide (ROM), phenoxide (ArONa), ammonia (gas or an aqueous solution), amines excluding diaryl amine and triarylamine (since diarylamine and triarylamine are substantially neutral and salt formation with an acid group is insufficient, these are excluded), heterocyclic bases such as pyridine, quinoline, and piperidine, a hydrazine derivative, an amidine derivative, and a tetraalkylammonium hydroxide.

In addition, "form a salt structure" in the present invention means that the compound or the group defined there as it is becomes a salt, and the compound or a part of the salt are combined to becomes a salt. For example, after the anion of a specific compound dissociates, only the cation portion may form a sulfonamide group and a salt. In addition, the "salt structure" may be present in a dissociated state in the layer of the photosensitive resin composition.

Among the monovalent basic compounds which can be used in the present invention, hydroxide or oxide of an alkali metal, hydrogen carbonate, alkoxide (ROM), phenoxide (ArONa), ammonia (gas or an aqueous solution), or a nitrogen-containing compound is preferable, and a nitrogen-containing basic compound shown below, that is, a nitrogen-containing basic compound having a structure represented by the following Formulas (A) to (E) is preferably exemplified.

(A)

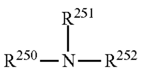

In Formula (A), $R^{250}$, $R^{251}$, and $R^{252}$ each independently represent a hydrogen atom, an alkyl group having 1 to 20 carbon atoms, or an aryl group having 6 to 20 carbon atoms, and $R^{251}$ and $R^{252}$ may be bonded to each other to form a ring. The alkyl group and the aryl group may further have a substituent such as a hydroxy group, an amide group, or an ester group.

(B)

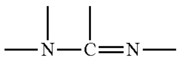

(C)

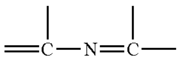

(D)

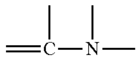

(E)

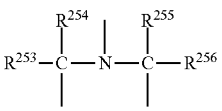

In Formula (E), $R^{253}$, $R^{254}$, $R^{255}$, and $R^{256}$ each independently represent an alkyl group having 1 to 20 carbon atoms.

Specific examples of the monovalent basic compound which includes a preferable chemical structure represented by any one of Formulas (A) to (E) and can be used in the present invention will be described below, but the present invention is not limited thereto.

(C-1)

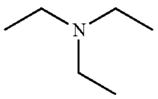

-continued (C-2)

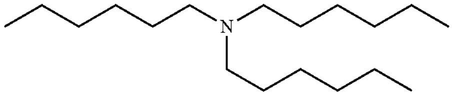

(C-3)

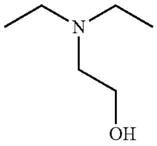

(C-4)

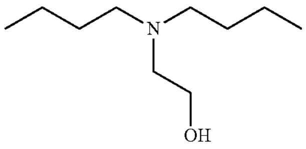

(C-5)

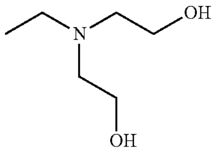

(C-6)

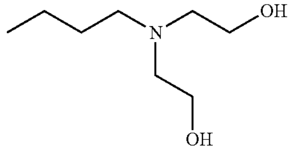

(C-7)

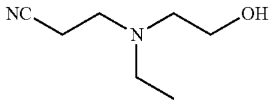

(C-8)

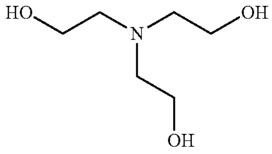

(C-9)

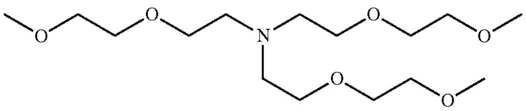

(C-10)

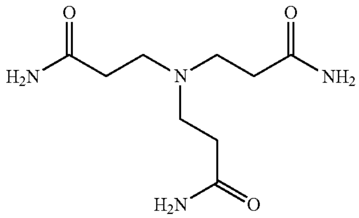

(C-11)

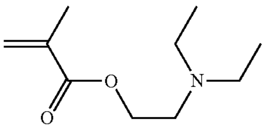

-continued
(C-12)
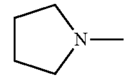
(C-13)
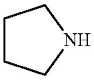
(C-14)
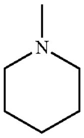
(C-15)
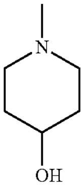
(C-16)
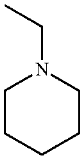
(C-17)
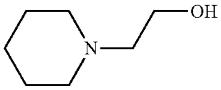
(C-18)
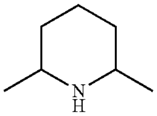
(C-19)
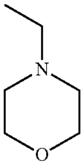
(C-20)
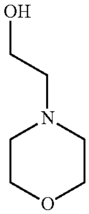
(C-21)
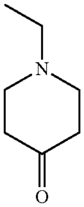
-continued
(C-22)
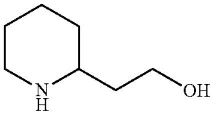
(C-23)
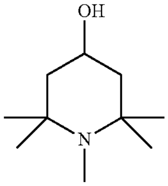
(C-24)
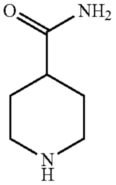
(C-25)
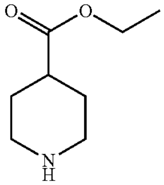
(C-28)
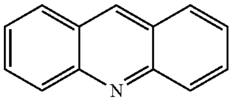
(C-29)
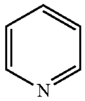
(C-30)
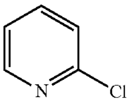
(C-31)
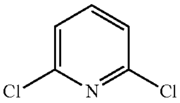
(C-32)
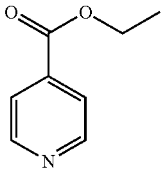
(C-33)
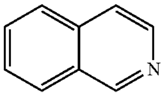
(C-34)
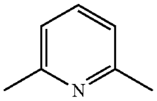

-continued (C-35)

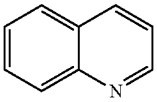

(C-36)

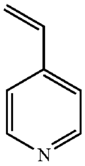

(C-37)

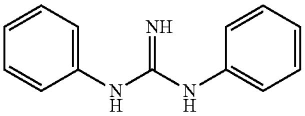

(C-38)

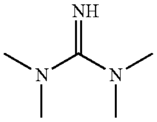

(C-39)

$CH_3ONa$ (C-40)

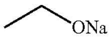

(C-41)

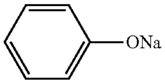

(C-42)

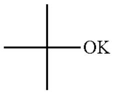

(C-43)

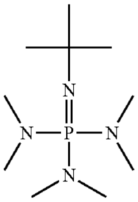

(C-44)

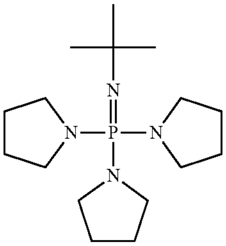

A more preferable compound is a nitrogen-containing cyclic compound or a nitrogen-containing basic compound having two or more nitrogen atoms having different chemical environments in one molecule. The nitrogen-containing cyclic compound is more preferably a compound having a polycyclic structure. Preferable specific examples of the nitrogen-containing polycyclic compound include a compound represented by the following Formula (F).

(F)

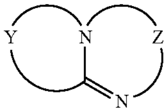

In Formula (F), Y and Z each independently represent a linear, branched, or cyclic alkylene group which may include a heteroatom or may be substituted. Examples of the heteroatom include a nitrogen atom, a sulfur atom, and an oxygen atom. The alkylene group is preferably an alkylene group having 2 to 10 carbon atoms and more preferably an alkylene group having 2 to 5 carbon atoms.

In a case where the alkylene group has a substituent, examples of the substituent include a halogen atom and a halogen-substituted alkyl group, in addition to an alkyl group having 1 to 6 carbon atoms, an aryl group, and an alkenyl group.

Specific examples of the basic compound represented by Formula (F) include compounds shown below.

(c-45)

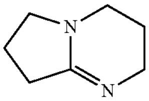

(c-46)

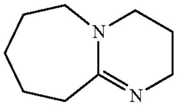

(c-47)

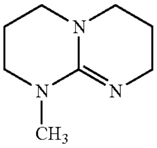

(c-48)

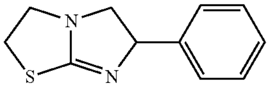

(c-49)

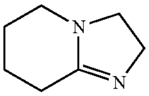

(c-50)

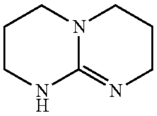

(c-51)

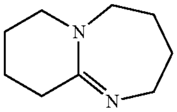

(c-52)

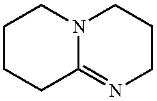

Among the above monovalent basic compounds, 1,8-diazabicyclo[5.4.0]undec-7-ene is particularly preferable. The nitrogen-containing basic compound having two or more nitrogen atoms having different chemical environments in one molecule is particularly preferably a compound including both a substituted or unsubstituted amino group and a ring structure including a nitrogen atom or a compound having an alkylamino group. Examples of a particularly preferable compound thereof include guanidine, 1,1-dimethyl guanidine, 1,1,3,3-tetramethyl guanidine, pyrazole, pyrazine, pyrimidine, 6-dihydroxypyrimidine, 2-pyrazoline, 3-pyrazoline, trimethyl imidazole, triphenyl imidazole, and methyl diphenyl imidazole, but the present invention is not limited thereto.

In addition, onium hydroxide is also exemplified as a preferable aspect of the monovalent basic compound. Specific examples of the onium include ammonium which may be substituted, a sulfonium salt which may be substituted, a phosphonium salt which may be substituted, and a pyridinium salt which may be substituted.

As a more preferable aspect of the onium hydroxide, structures represented by the following Formulas (1) to (4) are exemplified.

Formula (1)

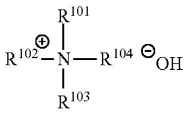

Formula (2)

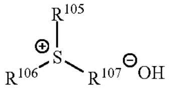

Formula (3)

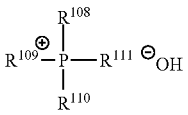

Formula (4)

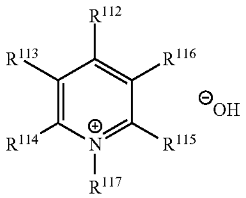

$R^{101}$ to $R^{117}$ are monovalent substituents, $R^{101}$ to $R^{104}$, $R^{105}$ to $R^{107}$, $R^{108}$ to $R^{111}$, and $R^{112}$ to $R^{117}$ are linked to each other to form a cyclic structure, respectively.

The monovalent substituent represented by each of $R^{101}$ to $R^{17}$ is more preferably an alkyl group which may be substituted, an alicyclic group which may be substituted, a heterocyclic group which may be substituted (including a heteroaryl group), an aryl group which may be substituted, an aralkyl group which may be substituted, an alkyl group having 1 to 10 carbon atoms, an aryl group having 6 to 20 carbon atoms, or an aralkyl group having 6 to 20 carbon atoms which may be substituted. In addition, as a particularly preferably aspect, a structure represented by the following Formula (5) or (6) is exemplified.

Formula (5)

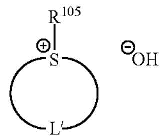

Formula (6)

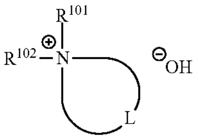

$R^{101}$, $R^{102}$, and $R^{105}$ have the same meaning as $R^{101}$, $R^{102}$, and $R^{105}$ in Formulas (1) to (4), respectively, and the preferable ranges thereof are also the same. L and L' each represent an atomic group necessary to form a hetero ring. The hetero ring is preferably a 5-membered or 6-membered ring.

The specific compounds of onium hydroxide are exemplified below, but the present invention is not limited thereto.

(O-1)

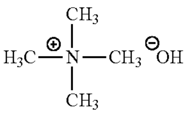

(O-2)

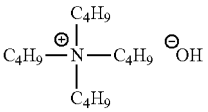

(O-3)

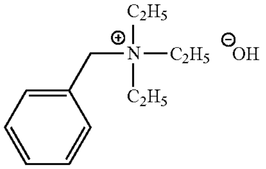

(O-4)

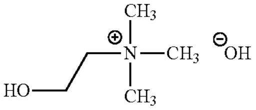

(O-5)

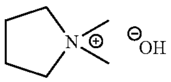

(O-6)

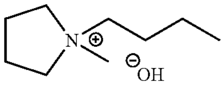

(O-7)

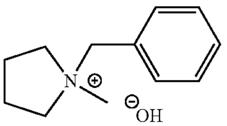

(O-8)

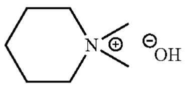

-continued (O-9)

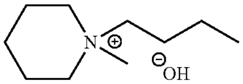

(O-10)

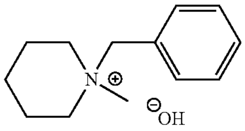

(O-11)

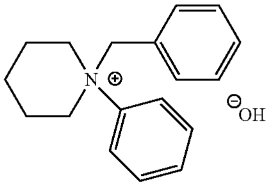

(O-12)

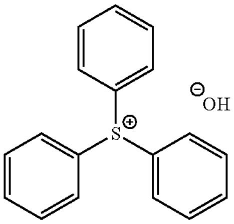

(O-13)

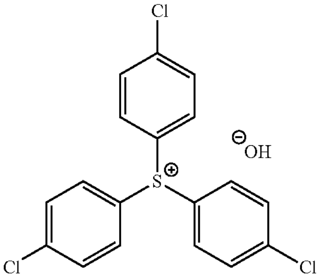

(O-14)

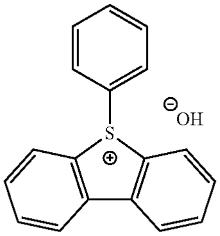

(O-15)

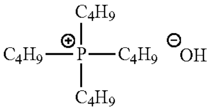

(O-16)

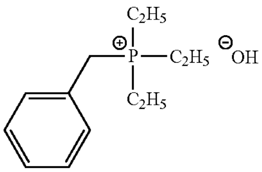

-continued (O-17)

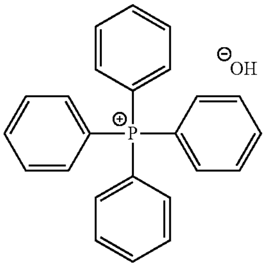

(O-18)

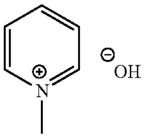

(O-19)

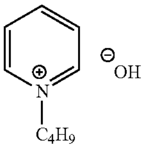

(O-20)

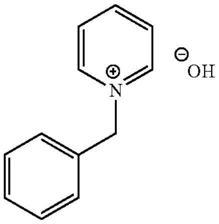

These monovalent basic compounds may be used alone or in combination of two or more types thereof.

The addition amount of a basic compound added to the photosensitive resin composition of the present invention is preferably 0.0% by mass to 30% by mass and more preferably 0.5% by mass to 20% by mass, with respect to the total solid content mass of the resin composition.

In the photosensitive resin composition of the present invention, by adding a specific polymer compound and the monovalent basic compound described above, at least some of the acid group which the specific polymer compound has in the system preferably forms a salt structure with the monovalent basic compound. From this viewpoint, the acid value of the specific polymer compound in the present invention is preferably 0.01 mmol/g to 3.50 mmol/g and more preferably 0.05 mmol/g to 2.90 mmol/g from the viewpoint of developability and strength of an image portion.

In addition, the addition amount (neutralization amount) of monovalent basic compound added to the specific polymer compound is preferably 10 mol % to 50 mol %, more preferably 10 mol % to 30 mol %, and still more preferably 15 mol % to 25 mol %, with respect to 100 mol % of the acid group, from the viewpoint of suppression of interlayer mixing, developability, and printing durability.

It can be confirmed by measuring the acid value by a neutralization titration method that the acid group in the layer of the photosensitive resin composition forms a salt structure with the monovalent basic compound.

Here, the acid value of the polymer after the salt is formed is preferably 0.001 mmol/g to 2.00 mmol/g, more preferably 0.10 mmol/g to 1.80 mmol/g, and still more preferably 0.50 mmol/g to 1.60 mmol/g.

Specific examples of the specific polymer compound suitable in the present invention in the salt structure molecule formed of the specific polymer compound and the monovalent basic compound are shown below.

Moreover, the specific polymer compound used in the present invention is not limited to the specific examples.

TABLE 8

| Specific polymer compound having salt structure | Specific polymer compound | Monovalent basic compound | Addition amount of monovalent basic compound (mol %) |
|---|---|---|---|
| PN-1 | PU-1 | O-10 | 20 |
| PN-2 | PU-2 | O-10 | 20 |
| PN-3 | PU-3 | O-10 | 20 |
| PN-4 | PU-3 | C-46 | 20 |
| PN-5 | PU-3 | C-1 | 20 |
| PN-6 | PU-3 | C-3 | 20 |
| PN-7 | PU-4 | O-10 | 20 |
| PN-8 | PU-5 | O-10 | 20 |
| PN-9 | PU-6 | O-10 | 20 |
| PN-10 | PU-7 | O-10 | 20 |
| PN-11 | PU-8 | O-10 | 20 |
| PN-12 | PU-9 | O-10 | 20 |
| PN-13 | PU-10 | O-10 | 20 |
| PN-14 | PI-1 | O-10 | 20 |
| PN-15 | PI-2 | O-10 | 20 |
| PN-16 | PI-3 | O-10 | 20 |
| PN-17 | PI-4 | O-10 | 20 |
| PN-18 | PI-5 | O-10 | 20 |
| PN-19 | PI-6 | O-10 | 20 |
| PN-20 | PI-7 | O-10 | 20 |
| PN-21 | PI-8 | O-10 | 20 |
| PN-22 | PI-9 | O-10 | 20 |
| PN-23 | PI-23 | O-10 | 20 |

As described above, by a monovalent basic compound being contained in the photosensitive resin composition of the present invention, excellent chemical resistance and image formability are obtained.

Though the detailed mechanism thereof is unclear, in general, in a case where a salt structure is formed by an acid group in the binder polymer and a basic compound, there is concern that durability (printing durability) is reduced. However, it is thought that, even in such a case, in the preferable aspect according to the present invention, by selecting and using a resin containing at least one constitutional unit of the constitutional units B-1, . . . , or B-6 in the main chain structure of the binder polymer, reduction in the durability (printing durability) is effectively suppressed, the chemical resistance and the image formability can be further improved.

Moreover, the reason why the excellent effects are exhibited in the "monovalent" basic compound is estimated as follows. That is, if a crosslinked structure is made by a di- or higher polyvalent compound, for example, an acid group in the specific polymer compound, the developability and the development latitude are likely to deteriorate. It is thought that in the case of a monovalent compound, such a crosslinked structure is not generated, and good characteristics can be obtained.

In addition, in a case where the photosensitive resin composition of the present invention is used in a printing plate precursor having a multilayer structure of the upper layer and the underlayer described below, from the viewpoint of suppressing the compatibility of these layers, the conjugate acid of the basic compound preferably has pKa of 8 to 20. On the other hand, since the above-described crosslinked structure is more easily made in the case of a di- or higher valent compound on such a strong base group side, the developability and the development latitude become more inevitable. Also from this viewpoint, it is effective and preferable to apply a monovalent basic compound in the present invention.

<Other Alkali-Soluble Resins>

In the present invention, the "alkali-soluble" means "being solubilized by a treatment for a standard development time in an alkali aqueous solution with a pH of 8.5 to 13.5".

Although the alkali-soluble resin other than the specific polymer compound used in the photosensitive resin composition of the present invention is not particularly limited as long as it has a characteristic of being dissolved by contact with an alkali developer, the alkali-soluble resin preferably has an acidic functional group such as a phenolic hydroxyl group, a sulfonate group, a phosphate group, a sulfonamide group, or an active imide group in the main chain and/or a side chain in the polymer, a resin including 10 mol % or greater of a monomer having such an acidic functional group imparting alkali-solubility is exemplified, and a resin including 20 mol % or greater is more preferable. If the copolymerization component of the monomer imparting alkali-solubility is 10 mol % or greater, sufficient alkali-solubility is obtained, and developability is excellent.

In addition, as the alkali-soluble resin, a novolac resin is also preferably exemplified. As the novolac resin which can be used in the present invention, novolac resins such as a phenol formaldehyde resin, an m-cresol formaldehyde resin, a p-cresol formaldehyde resin, an m-/p-mixed cresol formaldehyde resin, a phenol/cresol (which may be any mixture of m-, p-, and m-/p-) mixed formaldehyde resin or pyrogallol acetone resins are preferably exemplified.

In addition, a polycondensate of phenol having an alkyl group having 3 to 8 carbon atoms as a substituent and formaldehyde, such as a t-butyl phenol formaldehyde resin or an octyl phenol formaldehyde resin, as described in U.S. Pat. No. 4,123,279A, is exemplified. In addition, the weight average molecular weight (Mw) thereof is preferably 500 or greater, and more preferably 1,000 to 700,000. In addition, the number average molecular weight (Mn) thereof is preferably 500 or greater, and more preferably 750 to 650,000. The dispersity (weight average molecular weight/number average molecular weight) is preferably 1.1 to 10.

Other alkali-soluble resins preferably have a weight-average molecular weight of 2,000 or greater and a number average molecular weight of 500 or greater, and more preferably have a weight average molecular weight of 5,000 to 300,000 and a number average molecular weight of 800 to 250,000. The dispersity (weight average molecular weight/number average molecular weight) of other alkali-soluble resins is preferably 1.1 to 10.

Other alkali-soluble resins included in the resin composition of the present invention as desired may be used alone or in combination of two or more types thereof.

The content of other alkali-soluble resins with respect to the total solid content in the photosensitive resin composition of the present invention is preferably 0% by mass to 98% by mass and more preferably 0% by mass to 80% by mass. In addition, 80 parts by mass or less thereof is preferably included with respect to 100 parts by mass of the specific polymer compound used in the present invention.

<Acid Generator>

The photosensitive resin composition of the present invention preferably contains an acid generator, from the viewpoint of sensitivity improvement.

The acid generator in the present invention is a compound which generates an acid by light or heat, and indicates a compound which generates an acid due to decomposition by irradiation with infrared rays or heating at 100° C. or higher. The acid generated is preferably a strong acid having a pKa of 2 or less such as sulfonic acid or hydrochloric acid. The acid generated from the acid generator functions as a catalyst, due to this, the chemical bond in the acid-decomposable group is cleaved to become an acid group, and as a result, the solubility in the alkali aqueous solution of the image recording layer is further improved.

Examples of the acid generator suitably used in the present invention include onium salts such as an iodonium salt, a sulfonium salt, a phosphonium salt, and a diazonium salt. Specifically, the compounds described in U.S. Pat. No. 4,708,925A or JP1995-20629A (JP-H07-20629A) can be exemplified. In particular, an iodonium salt, a sulfonium salt, or a diazonium salt, which has a sulfonate ion as a counter ion, is preferable. As the diazonium salt, the diazonium compound described in U.S. Pat. No. 3,867,147A, the diazonium compound described in U.S. Pat. No. 2,632,703A, or the diazo resins described in JP1989-102456A (JP-H01-102456A) or JP1989-102457A (JP-H01-102457A) are also preferable. In addition, the benzyl sulfonates described in U.S. Pat. Nos. 5,135,838A or 5,200,544A are also preferable. Furthermore, the active sulfonic esters or the disulfonyl compounds described in JP1990-100054A (JP-H02-100054A), JP1990-100055A (JP-H02-100055A), or JP1997-197671A (JP-H09-197671A) are also preferable. In addition, the haloalkyl-substituted S-triazines described in JP1995-271029A (JP-H07-271029A) are also preferable.

Furthermore, the compound described as an "acid precursor" in JP1996-220752A (JP-H08-220752A) or the compound described as "(a) a compound which can generates an acid by irradiation with active light" in JP1997-171254A (JP-H09-171254A) can also be applied as the acid generator of the present invention.

Among these, from the viewpoint of sensitivity and stability, an onium salt compound is preferably uses as an acid generator. The onium salt compound will be described below.

As the onium salt compound which can be suitably used in the present invention, compounds known as a compound which generates an acid due to decomposition by infrared ray exposure or heat energy generated from the infrared absorbent by exposure can be exemplified. As the onium salt compound suitable in the present invention, from the viewpoint of sensitivity, compounds having an onium salt structure described below, having a known thermal polymerization initiator or a bond with small bond dissociation energy can be exemplified.

Examples of the onium salt suitably used in the present invention include known diazonium salts, iodonium salts, sulfonium salts, ammonium salts, pyridinium salts, and azinium salts, and among these, sulfonate of triarylsulfonium or diaryliodonium, carboxylate, $BF_4^-$, $PF_6^-$, or $ClO_4^-$ is preferable.

Examples of the onium salt which can be used as an acid generator in the present invention include onium salts represented by the following Formulas (III) to (V).

Formula (III)

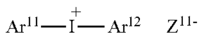

Formula (IV)

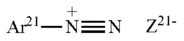

Formula (V)

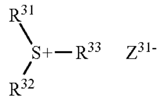

In Formula (III), $Ar^{11}$ and $Ar^{12}$ each independently represent an aryl group having 20 or less carbon atoms which may have a substituent. Examples of a preferably substituent in a case where the aryl group has a substituent include a halogen atom, a nitro group, an alkyl group having 12 or less carbon atoms, an alkoxy group having 12 or less carbon atoms, and an aryloxy group having 12 or less carbon atoms. $Z^{11-}$ represents a counter ion selected from the group consisting of a halogen ion, a perchlorate ion, a tetrafluoroborate ion, a hexafluorophosphate ion, a sulfonate ion, or a sulfonate ion having a fluorine atom such as a perfluoroalkyl sulfonate ion, and a perchlorate ion, a hexafluorophosphate ion, an aryl sulfonate ion, or a perfluoroalkyl sulfonic acid is preferable. In Formula (IV), $Ar^{21}$ represents an aryl group having 20 or less carbon atoms which may have a substituent. Examples of a preferable substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as $Z^{11-}$.

In Formula (V), $R^{31}$, $R^{32}$, and $R^{33}$ may be the same as or different from each other, and $R^{31}$, $R^{32}$, and $R^{33}$ each represent a hydrocarbon group having 20 or less carbon atoms which may have a substituent. Examples of a preferably substituent include a halogen atom, a nitro group, an alkyl group having 12 or less carbon atoms, an alkoxy group having 12 or less carbon atoms, and an aryloxy group having 12 or less carbon atoms. $Z^{31-}$ represents a counter ion having the same meaning as $Z^{11-}$.

Specific examples of onium salts (OI-1 to OI-10) represented by Formula (III), onium salts (ON-1 to OI-5) represented by Formula (IV), and onium salts (OS-1 to OS-6) represented by Formula (V) which can be suitably uses in the present invention are exemplified below.

[OI-1]

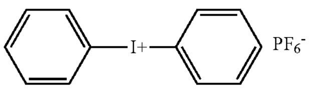

[OI-2]

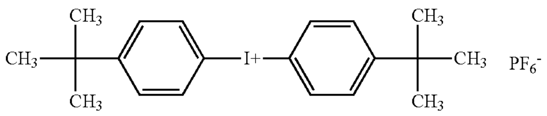

-continued
[OI-3]
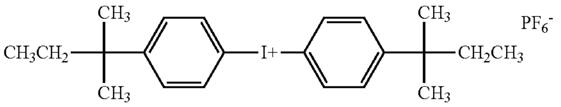
[OI-4]
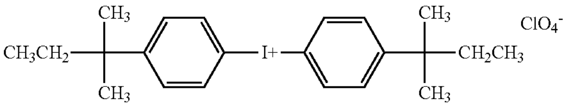
[OI-5]
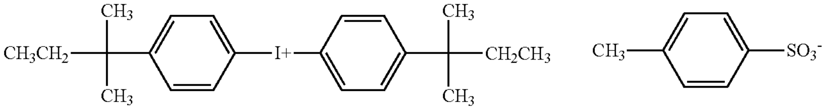
[OI-6]
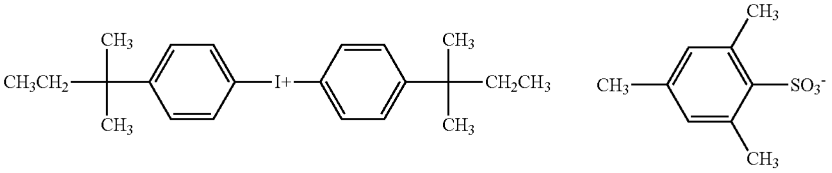
[OI-7]
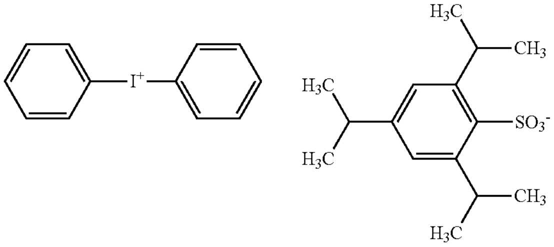
[OI-8]
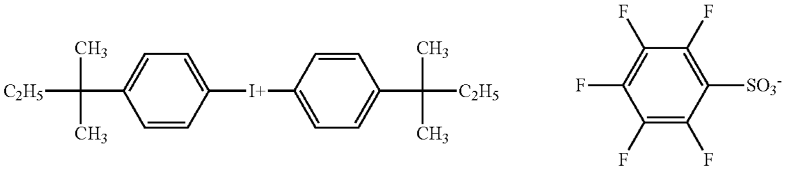
[OI-9]
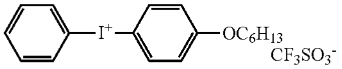
[OI-10]
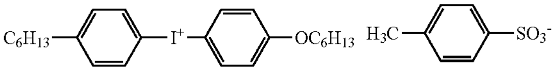
[ON-1]
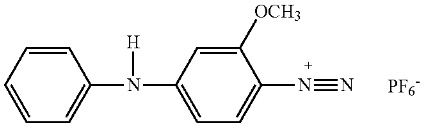
[ON-2]
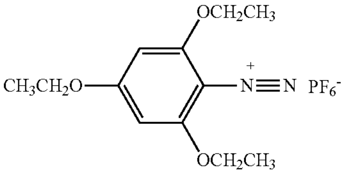
[ON-3]
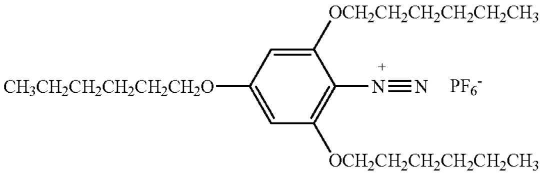
[ON-4]
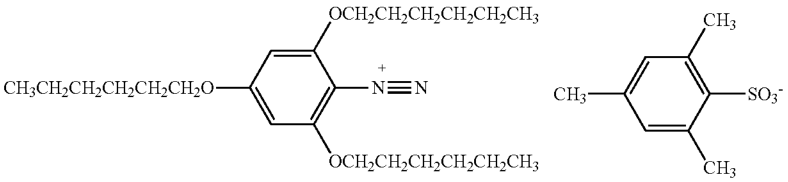

-continued

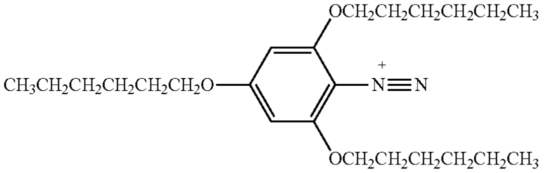

[ON-5]

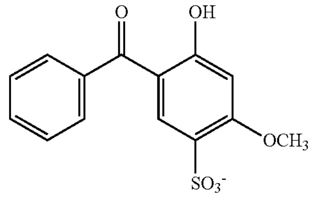

[OS-1]

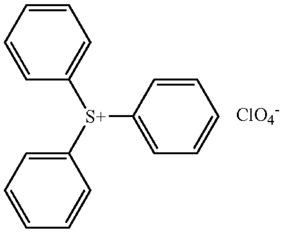

[OS-2]

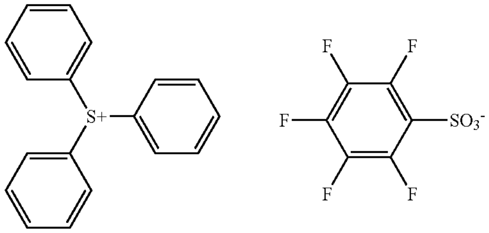

[OS-3]

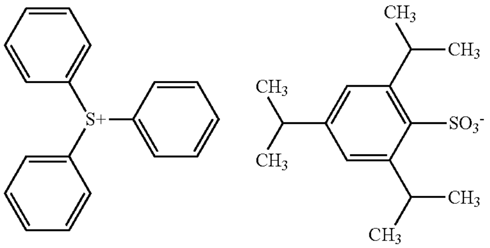

[OS-4]

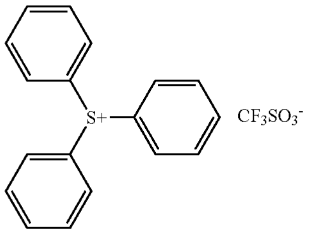

[OS-5]

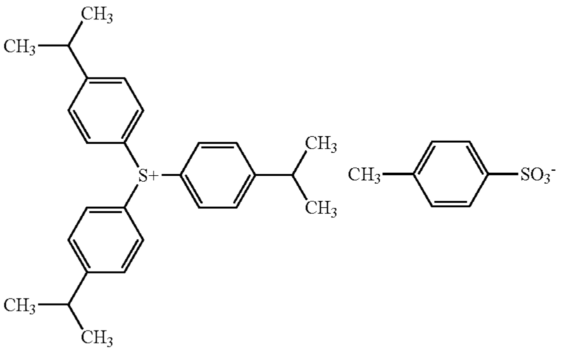

[OS-6]

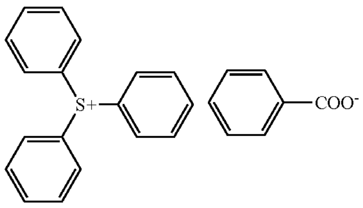

In addition, as another example of the compounds represented by each of Formula (III) to (V), the compounds described as an example of a radical polymerization initiator in paragraphs 0036 to 0045 of JP2008-195018A can be suitably used as an acid generator in the present invention.

Another example of a preferable onium salt as the acid generator used in the present invention includes an azinium salt compound represented by the following Formula (VI).

Formula (VI)

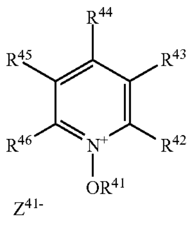

In Formula (VI), $R^{41}$, $R^{42}$, $R^{43}$, $R^{44}$, $R^{45}$, and $R^{46}$ may be the same as or different from each other, and $R^{41}$, $R^{42}$, $R^{43}$, $R^{44}$, $R^{45}$, and $R^{46}$ each represent a hydrogen atom, a halogen atom, or a monovalent substituent.

Examples of the monovalent substituent include a halogen atom, an amino group, a substituted amino group, a substituted carbonyl group, a hydroxyl group, a substituted oxy group, a thiol group, a thioether group, a silyl group, a nitro group, a cyano group, an alkyl group, an alkenyl group, an aryl group, a heterocyclic group, a sulfo group, a substituted sulfonyl group, a sulfonate group, a substituted sulfinyl group, a phosphono group, a substituted phosphono group, a phosphonate group, and a substituted phosphonate group, and in the case of being introducible, each of $R^{41}$, $R^{42}$, $R^{43}$, $R^{44}$, $R^{45}$, and $R^{46}$ may further have a substituent.

A compound (multimerized form) including two one more cation portions in the molecule as a result of bonding of the skeletons (cation portions) having a specific structure in the compound represented by Formula (VI) to each other through $R^{41}$ is also included in examples of the compound represented by Formula (VI), and such a compound is also suitably used.

$Z^{41-}$ represents a counter ion having the same meaning as $Z^{11-}$.

Specific examples of the azinium salt compound represented by Formula (VI) include the compounds described in paragraphs 0047 to 0056 of JP2008-195018A.

In addition, a compound group having an N—O bond described in JP1988-138345A (JP-S63-138345A), JP1988-142345A (JP-S63-142345A), JP1988-142346A (JP-S63-142346A), JP1988-143537A (JP-S63-143537A), or JP1971-42363B (JP-S46-42363B) is also suitably used as the acid generator in the present invention.

More preferable examples of the acid generator which can be used in the present invention include the following compounds (PAG-1) to (PAG-5).

PAG-1

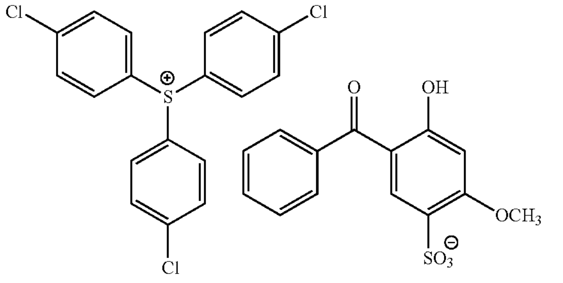

PAG-2

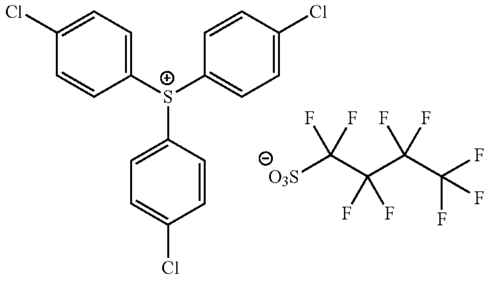

PAG-3

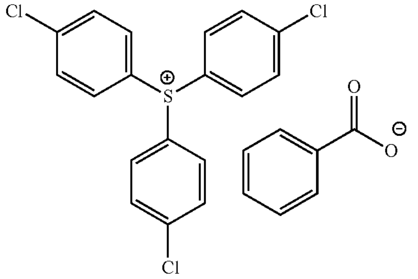

PAG-4

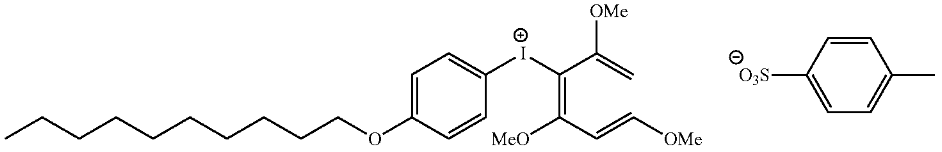

PAG-5

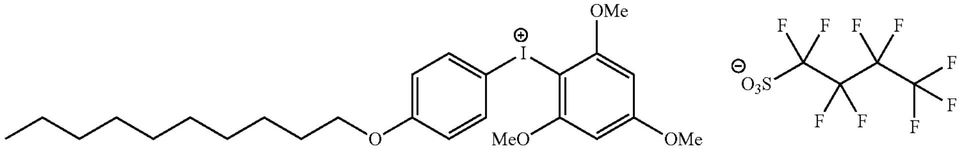

In a case where these acid generators are contained in the photosensitive resin composition of the present invention, these compounds may be used alone or in combination of two or more types thereof.

A preferable addition amount of acid generator is within the range of 0.01% by mass to 50% by mass, preferably within the range of 0.1% by mass to 40% by mass, and more preferably within the range of 0.5% by mass to 30% by mass, with respect to the total solid content in the photosensitive resin composition. If the addition amount is within the above range, improvement of sensitivity which is the effect of the addition of an acid generator is observed, and an occurrence of a residual film in the non-image portion is suppressed.

<Acid Proliferative Agent>

An acid proliferative agent may be added to the image recording layer of the present invention. The acid proliferative agent in the present invention is a compound substituted with a residue of a relatively strong acid, and a compound which newly generates an acid by being easily released in the presence of an acid catalyst. That is, the compound is decomposed by an acid catalyzed reaction, and generates an acid (hereinafter, referred to as ZOH in formulas) again. Since one or more acids per reaction are increased, and with the progress of the reaction, the acid concentration is increasingly increased, sensitivity is dramatically improved. The intensity of this generated acid is 3 or less as an acid dissociation constant (pKa), and preferably 2 or less. In the case of a weaker acid than this, it is not possible to cause the elimination reaction by an acid catalyst.

Examples of the acid used in such an acid catalyst include dichloroacetic acid, trichloroacetic acid, methanesulfonic acid, ethanesulfonic acid, benzenesulfonic acid, p-toluenesulfonic acid, naphthalenesulfonic acid, and phenyl sulfonic acid.

As the acid proliferative agent, the acid proliferative agents described in WO95/29968A, WO98/24000A, JP1996-305262A (JP-H08-305262A), JP1997-34106A (JP-H09-34106A), JP1996-248561A (JP-H08-248561A), JP1996-503082B (JP-H08-503082B), U.S. Pat. No. 5,445,917A, JP1996-503081B (JP-H08-503081B), U.S. Pat. Nos. 5,534,393A, 5,395,736A, 5,741,630A, 5,334,489A, 5,582, 956A, 5,578,424A, 5,453,345A, 5,445,917A, EP665960B, EP757628B, EP665961B, U.S. Pat. No. 5,667,943A, or JP1998-1598A (JP-H10-1598A) can be used alone or in combination of two or more types thereof.

Preferable specific examples of the acid proliferative agent in the present invention include the compounds described in paragraphs 0056 to 0067 of JP2001-66765A. Among these, the following compounds described as an exemplary compound (ADD-1), (ADD-2), or (ADD-3) can be suitably used.

(ADD-1)

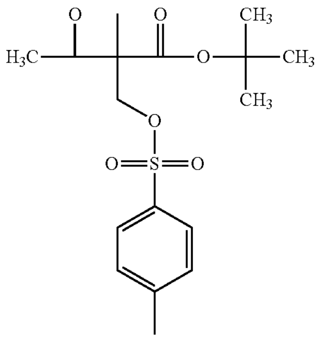

(ADD-2)

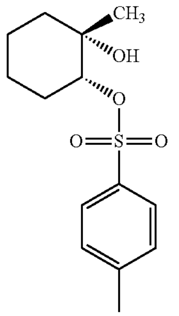

(ADD-3)

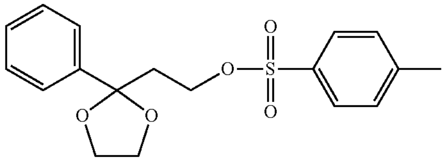

The addition amount in a case where the acid proliferative agent is added in an upper layer is within the range of 0.01% by mass to 20% by mass, preferably within the range of 0.01% by mass to 10% by mass, and more preferably within the range of 0.1% by mass to 5% by mass, in terms of the solid content. If the addition amount of the acid proliferative agent is within the above range, effects of adding acid proliferative agent is sufficiently obtained, improvement in sensitivity is achieved, and film hardness reduction of an image portion is suppressed.

<Other Additives>

The photosensitive resin composition of the present invention may include a development accelerator, a surfactant, a print-out agent/colorant, a plasticizer, or a wax agent, as other additives.

[Development Accelerator]

For the purpose of improving sensitivity, acid anhydrides, phenols, or organic acids may be added to the photosensitive resin composition of the present invention.

As the acid anhydrides, cyclic acid anhydride is preferable, and specifically, as the cyclic acid anhydride, phthalic anhydride, tetrahydrophthalic anhydride, hexahydrophthalic anhydride, 3,6-endooxytetrahydrophthalic anhydride, tetrachlorophthalic anhydride, maleic anhydride, chloromaleic anhydride, α-phenylmaleic anhydride, succinic anhydride, or pyromellitic anhydride described in U.S. Pat. No. 4,115,128A can be used. As the non-cyclic acid anhydride, acetic anhydride is exemplified.

Examples of the phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenxophenone, 4,4',4"-trihydroxytriphenyl methane, and 4,4',3",4"-tetrahydroxy-3,5,3',5'-tetramethyltriphenyl methane.

The organic acids are described in JP1985-88942A (JP-S60-88942A), JP1990-96755A (JP-H02-96755A), or the like, and specific examples thereof include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The ratio of the acid anhydrides, the phenols, and the organic acids to the total solid content in the photosensitive resin composition is preferably 0.05% by mass to 20% by mass, more preferably 0.1% by mass to 15% by mass, and particularly preferably 0.1% by mass to 10% by mass.

[Surfactant]

To improve coating property and stability of a treatment with respect to development conditions, a nonionic surfactant as described in JP1987-251740A (JP-S62-251740A) or JP1991-208514A (JP-H03-208514A), an amphoteric surfactant as described in JP1984-121044A (JP-S59-121044A) or JP1992-13149A (JP-H04-13149A), or a fluorine-containing monomer copolymer such as JP1987-170950A (JP-S62-170950A), JP1999-288093A (JP-H11-288093A), or JP2003-57820A can be added to the photosensitive resin composition of the present invention.

Specific examples of the nonionic surfactant include sorbitan tristearate, sorbitan monopalmitate, sorbitan trioleate, monoglyceride stearate, and polyoxyethylenenonylphenyl ether.

Specific examples of the amphoteric surfactant include alkyl di(aminoethyl)glycine, alkylpolyaminoethylglycine hydrochloride, 2-alkyl-N-carboxyethyl-N-hydroxyethyl imidazolinium betaine, and an N-tetradecyl-N,N-betaine type (for example, product name "AMOGEN K" manufactured by Dai-ichi Kogyo Seiyaku Co., Ltd.).

The ratio of the surfactant to the total solid content in the photosensitive resin composition is preferably 0.01% by mass to 15% by mass, more preferably 0.01% by mass to 5% by mass, and particularly preferably 0.05% by mass to 2.0% by mass.

[Print-Out Agent/Colorant]

As a print-out agent for obtaining a visible image immediately after heating by exposure or a dye or a pigment as an image colorant can be added to the photosensitive resin composition of the present invention.

Examples of the print-out agent and the colorant are described in detail in paragraphs 0122 and 0123 of JP2009-229917A, and the compounds described here can be applied to the present invention.

The dye is preferably added in a ratio of 0.01% by mass to 10% by mass and more preferably added in a ratio of 0.1% by mass to 3% by mass, with respect to the total solid content of the photosensitive resin composition.

[Plasticizer]

To impart flexibility or the like to the coating film, a plasticizer may be added to the photosensitive resin composition of the present invention. For example, butylphthalyl polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, or an oligomer or a polymer of acrylic acid or methacrylic acid is used.

These plasticizers are preferably added in a ratio of 0.5% by mass to 10% by mass and more preferably added in a ratio of 1.0% by mass to 5% by mass, with respect to the total solid content of the photosensitive resin composition.

[Wax Agent]

For the purpose of imparting resistance against scratches, a compound for reducing the coefficient of static friction of the surface can also be added to the photosensitive resin composition of the present invention. Specifically, the compounds having an ester of a long chain alkyl carboxylic acid as described in U.S. Pat. No. 6,117,913A, JP2003-149799A, JP2003-302750A, or JP2004-12770A can be exemplified.

As a preferable addition amount thereof, the ratio of the wax agent to the total solid content of the photosensitive resin composition is preferably 0.1% by mass to 10% by mass and more preferably 0.5% by mass to 5% by mass.

[Compositional Ratio of Respective Components]

The content of the specific polymer compound is preferably 10% by mass to 90% by mass, the content of the infrared absorbent is preferably 0.01% by mass to 50% by mass, the content of the monovalent basic compound is preferably 0% by mass to 30% by mass, the content of other alkali-soluble resins is preferably 0% by mass to 80% by mass, the content of the acid generator is preferably 0% by mass to 30% by mass, the content of the acid proliferative agent is preferably 0% by mass to 20% by mass, the content of the development accelerator is 0% by mass to 20% by mass, the content of the surfactant is preferably 0% by mass to 5% by mass, the content of the print-out agent/colorant is preferably 0% by mass to 10% by mass, the content of the plasticizer is preferably 0% by mass to 10% by mass, and the content of the wax agent is preferably 0% by mass to 10% by mass, with respect to the total solid content mass of the photosensitive resin composition of the present invention.

The photosensitive resin composition of the present invention can be applied to various fields requiring resin pattern formation excellent in durability, for example, various fields such as a resist, a display, a lithographic printing plate precursor, and the like, and since the photosensitive resin composition can be recorded with high sensitivity and has excellent image formability, and the durability of the image portion formed of the composition is good, by applying to an infrared sensitive positive type lithographic printing plate precursor described in detail below, the effects of the present invention can become significant.

(Lithographic Printing Plate Precursor)

The lithographic printing plate precursor of the present invention has an image recording layer including the photosensitive resin composition of the present invention.

In addition, the lithographic printing plate precursor of the present invention is preferably a positive type lithographic printing plate precursor.

The lithographic printing plate precursor of the present invention preferably has an image recording layer on a support having a hydrophilic surface.

Furthermore, the lithographic printing plate precursor of the present invention is a positive type lithographic printing plate precursor having an image recording layer having an underlayer and an upper layer in this order on a support having a hydrophilic surface, and the photosensitive resin composition is preferably contained in the underlayer and/or the upper layer, more preferably contained in the underlayer or the upper layer, and still more preferably contained only in the underlayer.

<Image Recording Layer>

The image recording layer used in the present invention can be formed by dissolving respective components of the photosensitive resin composition in a solvent and applying the resulting product to a suitable support.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, and toluene, and the present invention is not limited thereto. These solvents are used alone or in a mixture.

[Formation of Underlayer and Upper Layer]

In addition, the image recording layer of the present invention is preferably an image recording layer (hereinafter, also referred to as a "lithographic printing plate precursor having a two-layer structure") in which an underlayer and an upper layer are disposed in this order on a support.

The underlayer and the upper layer are preferably separately formed in principle.

As the method of separately forming the two layers, for example, a method of using the difference in the solvent solubilities between the components included in the underlayer and the components included in the upper layer and a method of rapidly drying and removing the solvent after application to the upper layer are exemplified. Since by using the latter method in combination, the separation between the layers is more favorably performed, the method is preferable.

These methods will be described in detail below, but the method of separately applying to the two layers is not limited thereto.

In the method of using the difference in the solvent solubilities between the components included in the underlayer and the components included in the upper layer, when applying a coating solution for an upper layer, a solvent system in which all the components included in the underlayer are insoluble is used. Thus, even in a case where two-layer coating is performed, a coating film can be formed such that each layer thereof is clearly separated. For example, by selecting a component insoluble in a solvent such as methyl ethyl ketone or 1-methoxy-2-propanol which dissolves an alkali-soluble resin which is the upper layer component, as the underlayer component, applying to the underlayer and drying using a solvent system which dissolves the underlayer component, dissolving the alkali-soluble resin-based upper layer in methyl ethyl ketone or 1-methoxy-2-propanol, and applying the resulting product and drying, bilayering is possible.

Next, the method of very rapidly drying the solvent after application to the second layer (upper layer) can be achieved by blowing high-pressure air from a slit nozzle provided substantially at a right angle with respect to the running direction of the web, applying heat energy as conductive heat from the lower surface of the web by a roll (heating roll) into which a heating medium such as steam has been supplied, or combining these.

The photosensitive resin composition of the present invention is preferably included in the upper layer and/or the underlayer, and more preferably included only in the underlayer.

The coating amount after drying of the underlayer applied to the support of the lithographic printing plate precursor of the present invention is preferably within the range of 0.5 $g/m^2$ to 4.0 $g/m^2$ and more preferably within the range of 0.6 $g/m^2$ to 2.5 $g/m^2$. If the coating amount is 0.5 $g/m^2$ or greater, printing durability is excellent, and if the coating amount is 4.0 $g/m^2$ or less, image reproducibility and sensitivity are excellent.

In addition, the coating amount after drying of the upper layer component is preferably 0.05 $g/m^2$ to 1.0 $g/m^2$ and more preferably 0.08 $g/m^2$ to 0.7 $g/m^2$. If the coating amount is 0.05 $g/m^2$ or greater, development latitude and scratch resistance are excellent, and if the coating amount is 1.0 $g/m^2$ or less, sensitivity is excellent.

The coating amount after drying of the underlayer and the upper layer is preferably within the range of 0.6 $g/m^2$ to 4.0 $g/m^2$ and more preferably within the range of 0.7 $g/m^2$ to 2.5 $g/m^2$. If the coating amount is 0.6 $g/m^2$ or greater, printing durability is excellent, and if the coating amount is 4.0 $g/m^2$ or less, image reproducibility and sensitivity are excellent.

<Upper Layer>

The upper layer of the lithographic printing plate precursor having a two-layer structure of the present invention can be preferably formed using the photosensitive resin composition of the present invention, and preferably formed using a resin composition other than the photosensitive resin composition of the present invention.

The upper layer of the lithographic printing plate precursor having a two-layer structure of the present invention is preferably an infrared sensitive positive type recording layer of which the solubility in an alkali aqueous solution is improved by heat.

The mechanism of improving the solubility in alkali aqueous solution by heat in the upper layer is not particularly limited, and any one can be used as long as it includes a binder resin and improves the solubility of the heated region. As the heat used in image formation, the heat generated in a case where the underlayer including an infrared absorbent is exposed is exemplified.

Preferable examples of the upper layer of which the solubility in an alkali aqueous solution is improved by heat include a layer including an alkali-soluble resin having a hydrogen-bonding capacity such as novolac or urethane, a layer including a water-insoluble and alkali-soluble resin and a compound having a dissolution suppressing action, and a layer including an ablation-possible compound.

In addition, by further adding an infrared absorbent to the upper layer, the heat generated from the upper layer can also be used in image formation. Preferable examples of the constitution of the upper layer including an infrared absorbent include a layer including an infrared absorbent, a water-insoluble and alkali-soluble resin, and a compound having a dissolution suppressing action, and a layer including an infrared absorbent, a water-insoluble and alkali-soluble resin, and an acid generator.

[Water-Insoluble and Alkali-Soluble Resin]

The upper layer according to the present invention preferably contains a water-insoluble and alkali-soluble resin. By containing the water-insoluble and alkali-soluble resin, an interaction is formed between the polar groups of the infrared absorbent and the water-insoluble and alkali-soluble resin, and a layer having a positive type photosensitivity is formed.

General water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified.

The water-insoluble and alkali-soluble resin which can be used in the present invention is not particularly limited as long as it has a characteristic of being dissolved by contact with an alkali developer, and a homopolymer containing an acidic group in the main chain and/or a side chain in the polymer, a copolymer thereof, or a mixture thereof is preferable.

Such a water-insoluble and alkali-soluble resin having an acidic group preferably has a functional group such as a phenolic hydroxyl group, a carboxy group, a sulfonate group, a phosphate group, a sulfonamide group, or an active imide group. Therefore, such a resin can be suitably produced by copolymerizing a monomer mixture including one or more ethylenically unsaturated monomers having a functional group described above. As the ethylenically unsaturated monomer having a functional group described above, in addition to acrylic acid and methacrylic acid, a compound represented by the following formula and a mixture thereof can be preferably exemplified. Moreover, in the following formula, $R^{40}$ represents a hydrogen atom or a methyl group.

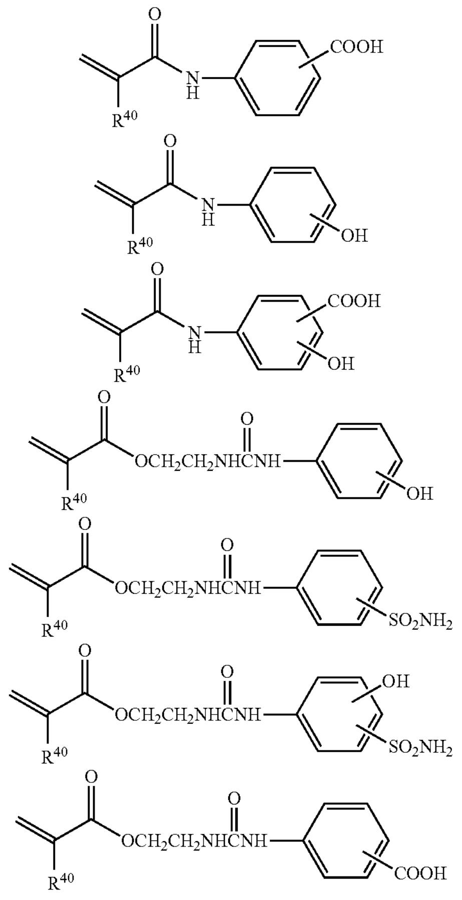

The water-insoluble and alkali-soluble resin which can be used in the present invention is preferably a polymer compound obtained by copolymerizing another polymerizable monomer in addition to the above-mentioned polymerizable monomers. As the copolymerization ratio in this case, a monomer imparting alkali-solubility such as a monomer having a functional group such as a phenolic hydroxyl group, a carboxy group, a sulfonate group, a phosphate group, a sulfonamide group, or an active imide group is preferably included in 10 mol % or greater, and more preferably included in 20 mol % or greater. If the copolymerization component of the monomer imparting alkali-solubility is 10 mol % or greater, sufficient alkali-solubility is obtained, and developability is excellent.

Examples of other usable polymerizable monomers include compounds exemplified below.

Alkyl acrylates or alkyl methacrylates such as methyl acrylate, ethyl acrylate, propyl acrylate, benzyl acrylate, methyl methacrylate, ethyl methacrylate, cyclohexyl methacrylate, and benzyl methacrylate. Acrylic acid esters or methacrylic acid esters having an aliphatic hydroxyl group such as 2-hydroxyethyl acrylate and 2-hydroxyethyl methacrylate. Acrylamides or methacrylamides such as acrylamide, methacrylamide, N-methylacrylamide, N-ethylacrylamide, and N-phenylacrylamide. Vinyl esters such as vinyl acetate, vinyl chloroacetate, vinyl butyrate, and vinyl benzoate. Styrenes such as styrene, α-methylstyrene, methylstyrene, and chloromethylstyrene. Other nitrogen atom-containing monomers such as N-vinyl pyrrolidone, N-vinyl pyridine, acrylonitrile, and methacrylonitrile. Maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide, and N-hydroxyphenylmaleimide.

Among these other ethylenically unsaturated monomers, (meth)acrylic acid esters, (meth)acrylamides, maleimides, or (meth)acrylonitrile is suitably used.

In addition, as the alkali-soluble resin, a Novolac resin exemplified as other alkali-soluble resin exemplified as an arbitrary component of the photosensitive resin composition of the present invention may also be preferably exemplified.

In addition, the water-insoluble and alkali-soluble resin described above can also be used in the resin composition of the present invention.

Furthermore, in the upper layer of the present invention, other resins can be used in combination within a range not impairing the effects of the present invention. Since the upper layer is required to express alkali-solubility, in particular, in a non-image portion region, it is necessary to select a resin which does not impair this characteristic. From this viewpoint, as a resin usable in combination, a water-insoluble and alkali-soluble resin is exemplified. General water-insoluble and alkali-soluble resin will be described below in detail, and among these, a polyamide resin, an epoxy resin, a polyacetal resin, an acrylic resin, a methacrylic resin, a polystyrene-based resin, and a novolac-type phenolic resin are preferably exemplified. In addition, the amount to be mixed is preferably 50% by mass or less with respect to the water-insoluble and alkali-soluble resin.

The water-insoluble and alkali-soluble resin preferably has a weight-average molecular weight of 2,000 or greater and a number average molecular weight of 500 or greater, and more preferably has a weight-average molecular weight of 5,000 to 300,000 and a number average molecular weight of 800 to 250,000. The dispersity (weight average molecular weight/number average molecular weight) of the alkali-soluble resin is preferably 1.1 to 10.

The alkali-soluble resin in other resin compositions of the image recording material of the present invention as desired may be used alone or in combination of two or more types thereof.

The content of the alkali-soluble resin with respect to the total solid content in other resin compositions of the present invention is preferably 2.0% by mass to 99.5% by mass, more preferably 10.0% by mass to 99.0% by mass, and still more preferably 20.0% by mass to 90.0% by mass, in the total solid content. If the addition amount of the alkali-soluble resin is 2.0% by mass or greater, the durability of a recording layer (photosensitive layer) is good, and if the addition amount of the alkali-soluble resin is 99.5% by mass or less, both the sensitivity and the durability are good.

[Infrared Absorbent]

An infrared absorbent may be included in other resin compositions described above.

The infrared absorbent is not particularly limited as long as it is a dye which generates heat by absorbing infrared light, and the infrared absorbent used in the resin composition of the present invention, described above, can also be used.

A particularly preferable dye is the cyanine dye represented by Formula (a).

By containing an infrared absorbent in the upper layer, sensitivity becomes good.

The addition amount of the infrared absorbent in the upper layer is preferably 0.01% by mass to 50% by mass, more preferably 0.1% by mass to 30% by mass, and particularly preferably 1.0% by mass to 10% by mass, with respect to the total solid content in the upper layer. If the addition amount is 0.01% by mass or greater, the sensitivity is improved, and if the amount added is 50% by mass or less, the uniformity of the layer is good and the durability of the layer is excellent.

[Other Components]

In addition, the upper layer of the lithographic printing plate precursor of the two-layer structure may include an acid generator, an acid proliferative agent, a development accelerator, a surfactant, a print-out agent/colorant, a plasticizer, or a wax agent.

As these components, respective components used in the resin composition of the present invention, described above, can also be used, and preferable aspects thereof are also the same.

<Underlayer>

The lithographic printing plate having a two-layer structure of the present invention preferably has a layer containing the photosensitive resin composition of the present invention, as the underlayer.

The underlayer of the lithographic printing plate precursor having a two-layer structure of the present invention is preferably formed by applying the photosensitive resin composition of the present invention.

By using the photosensitive resin composition of the present invention in the underlayer, a printing plate having excellent image formability and printing durability can be obtained.

In addition, by using the photosensitive resin composition of the present invention in the underlayer, in a case where materials such as an ink and paper having particularly poor quality are used, the printing durability is improved.

Though the detailed mechanism by which the effects as described above are obtained is unclear, it is assumed that for the printing durability in printing, the film hardness of the resin used in the underlayer is important, and thus, it is assumed that, since the interaction (hydrogen bonding or the like) between the binders is strong, by using the photosensitive resin composition of the present invention having a high film hardness in the underlayer, the printing durability is improved.

In a case where the photosensitive resin composition of the present invention is used in the upper layer, the underlayer is also preferably formed of the photosensitive resin composition of the present invention, and the underlayer may be formed using a resin composition other than the photosensitive resin composition of the present invention. A preferable aspect of the underlayer in this case is the same as the preferable aspect of the upper layer described above.

<Support>

The support used in the image recording material of the present invention is not particularly limited as long as it is a dimensionally stable plate-shaped material having necessary strength and durability, and examples thereof include paper, paper on which plastic (for example, polyethylene, polypropylene, and polystyrene) has been laminated, a metal plate (for example, aluminum, zinc, and copper), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal), and paper or a plastic film on which the above-described metals have been laminated or vapor-deposited.

Moreover, the support in a case where the image forming material of the present invention is applied to a lithographic printing plate precursor is preferably a polyester film or an aluminum plate, and among these, the aluminum plate which has good dimensional stability and is relatively inexpensive is particularly preferable. A suitable aluminum plate is a pure aluminum plate or an alloy plate which has aluminum as the main component and includes a small amount of other elements, or may be a plastic film on which aluminum has been laminated or vapor-deposited. Examples of other elements included in the aluminum alloy include silicon, iron, manganese, copper, magnesium, chromium, zinc, bismuth, nickel, and titanium. The content of other elements in the alloy is preferably 10% by mass or less.

Although particularly preferable aluminum in the present invention is pure aluminum, it is difficult to produce completely pure aluminum on refining technique, and thus, other elements may be slightly contained.

The composition of the aluminum plate applied to the present invention as described above is not particularly limited, and aluminum plates formed of known and used materials in the related art can be appropriately used. The thickness of the aluminum plate used in the present invention is preferably 0.1 mm to 0.6 mm, more preferably 0.15 mm to 0.4 mm, and still more preferably 0.2 mm to 0.3 mm.

Such an aluminum plate may be subjected to a surface treatment such as a surface-roughening treatment and an anodization treatment, if necessary. As the surface treatment of the aluminum support, for example, a degreasing treatment with a surfactant, an organic solvent, or an alkaline aqueous solution, a roughening treatment of a surface, an anodization treatment, or the like, as described in detail in paragraphs 0167 to 0169 of JP2009-175195A, is suitably performed.

The aluminum surface on which an anodization treatment has been performed may be subjected to a hydrophilizing treatment, as necessary.

As the hydrophilizing treatment, the alkali metal silicate (for example, sodium silicate aqueous solution) method, the method of treating with potassium fluoride zirconate or polyvinylphosphonic acid, or the like, as disclosed in paragraph 0169 of JP2009-175195A, is used.

In addition, the supports described in JP2011-245844A can also be preferably used.

<Undercoat>

For example, in a case where the image forming material of the present invention is applied to a lithographic printing plate precursor, an undercoat can be provided between a support and an under layer, if necessary.

As the undercoat component, various organic compounds can be used, and preferable examples thereof include phosphonic acids having an amino group such as carboxymethylcellulose or dextrin, an organic phosphonic acid, an organic phosphorus acid, an organic phosphinic acid, amino acids, and hydrochloride of an amine having a hydroxy group. In addition, these undercoat components may be used alone or in a mixture of two or more types thereof. Details of the compound used in the undercoat and the method of forming the undercoat are described in paragraphs 0171 and 0172 of JP2009-175195A, and those described here are also applied to the present invention.

The coating amount of the undercoat is preferably 2 $mg/m^2$ to 200 $mg/m^2$ and more preferably 5 $mg/m^2$ to 100 $mg/m^2$. If the coating amount is within the above range, sufficient printing durability is obtained.

<Back Coat Layer>

A back coat layer is provided on the rear surface of the support of the lithographic printing plate precursor of the present invention, if necessary. As the back coat layer, coating layers formed of an organic polymer compound described in JP1993-45885A (JP-H05-45885A) or a metal oxide obtained by hydrolyzing and polycondensing an organic or inorganic metal compound described in JP1994-35174A (JP-H06-35174A) are preferably used. Among these coating layers, alkoxy compounds of silicon such as $Si(OCH_3)_4$, $Si(OC_2H_5)_4$, $Si(OC_3H_7)_4$, and $Si(OC_4H_9)_4$ are easily available at low cost, and coating layers of metal oxides obtained from these have excellent developer resistance, and thus, these are particularly preferable.

(Production Method for Lithographic Printing Plate)

The production method of the lithographic printing plate of the present invention includes a exposure step of image-exposing the lithographic printing plate precursor and a development step of developing using a developer in this order.

According to the production method of the lithographic printing plate of the present invention, the developability change becomes good, the contamination due to the residual film of the non-image portion does not occur in the obtained lithographic printing plate, and the strength of the image portion and the durability are excellent.

Hereinafter, each step of production method of the present invention will be described in detail.

<Exposure Step>

The production method of the lithographic printing plate of the present invention includes an exposure step of exposing the lithographic printing plate precursor of the present invention in an image shape.

As a light source of active light used in image exposure of the lithographic printing plate precursor of the present invention, a light source having an emission wavelength in the near infrared region to the infrared region is preferable, and solid laser or semiconductor laser is more preferable. Among these, in the present invention, it is particularly preferable that image exposure is performed by solid laser or semiconductor laser emitting an infrared rays having a wavelength of 750 nm to 1,400 nm.

The output of the laser is preferably 100 mW or greater, and to shorten the exposure time, a multibeam laser device is preferable used. In addition, the exposure time per pixel is preferably within 20μ seconds.

Energy with which the lithographic printing plate precursor is irradiated is preferably 10 $mJ/cm^2$ to 300 $mJ/cm^2$. If the energy is within the above range, curing sufficiently proceeds and the laser ablation is suppressed, and thus, it is possible to prevent an image from being damaged.

In the exposure in the present invention, it is possible to expose by overlapping a light beam of the light source. The overlapping means that the sub-scanning pitch width is smaller than the beam diameter. For example, when the beam diameter is expressed by the half-value width (FWHM) of the beam intensity, the overlapping can be quantitatively expressed by FWHM/sub-scanning pitch width (overlap coefficient). In the present invention, this overlap coefficient is preferably 0.1 or greater.

The scanning method of the light source of an exposure apparatus which can be used in the present invention is not particularly limited, and a drum outer surface scanning method, a drum inner surface scanning method, a planar scanning method, or the like can be used. In addition, the channel of the light source may be a single channel or a multichannel, and in the case of drum outer surface scanning method, the multichannel is preferably used.

<Development Step>

The production method of the lithographic printing plate of the present invention includes a development step of developing using a developer.

The developer used in the development step is preferably an aqueous solution with a pH of 6.0 to 13.5 and more preferably an alkali aqueous solution with a pH of 8.5 to 13.5, A surfactant contributes to improvement of processability.

As the surfactant used in the developer, any of an anionic surfactant, a nonionic surfactant, a cationic surfactant, and an amphoteric surfactant can be used, and as described above, an anionic surfactant or a nonionic surfactant is preferable.

As the anionic surfactant, the nonionic surfactant, the cationic surfactant, and the amphoteric surfactant used in the developer of the present invention, the surfactants described in paragraphs 0128 to 0131 of JP2013-134341A can be used.

In addition, from the viewpoint of stable solubility or turbidity in water, a surfactant preferably has a HLB value of 6 or greater and more preferably has a HLB value of 8 or greater.

As the surfactant used in the developer, an anionic surfactant or a nonionic surfactant is preferable, and an anionic surfactant containing sulfonic acid or sulfonate or a nonionic surfactant having an aromatic ring and an ethylene oxide chain is particularly preferable.

The surfactant can be used alone or in combination of two or more types thereof.

The content of the surfactant in the developer is preferably 0.01% by mass to 10% by mass, and more preferably 0.01% by mass to 5% by mass.

If as a buffer, carbonate ions and hydrogencarbonate ions are included to maintain the pH of the developer at 8.5 to 13.5, it is possible to suppress variations in pH even in a case where the developer is used for a long period of time, and it is possible to suppress developability deterioration and a development scum occurrence due to the variation in pH. To make carbonate ions and hydrogencarbonate ions present in the developer, carbonate and hydrogencarbonate may be added, or by adjusting the pH after carbonate or hydrogencarbonate is added, carbonate ions and hydrogencarbonate ions may be generated. Although carbonate and hydrogencarbonate are not particularly limited, an alkali metal salt is preferable. Examples of the alkali metal include lithium, sodium, and potassium, and sodium is particularly preferable. These may be used alone or in combination of two or more types thereof.

The total amount of carbonate and hydrogen carbonate is preferably 0.3% by mass to 20% by mass, more preferably 0.5% by mass to 10% by mass, and still more preferably 1% by mass to 5% by mass, with respect to the total mass of the developer. If the total amount is 0.3% by mass or greater, developability and processing capability are not reduced, and if the total amount is 20% by mass or less, a precipitate or a crystal is less likely to be produced and at the time of the waste liquid treatment of the developer, gelation when neutralizing is less likely to occur, and thus, trouble does not occur in the waste liquid treatment.

In addition, for the purpose of finely adjusting the alkali concentration or assisting dissolution of the non-image portion photosensitive layer, supplementarily, other alkali agents, for example, organic alkali agents may be used in combination. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. Other alkali agents are used alone or in combination of two or more types thereof.

In addition to the above materials, the developer may contain a wetting agent, a preservative, a chelate compound, an antifoaming agent, an organic acid, an organic solvent, an inorganic acid, an inorganic salt, or the like. If a water-soluble polymer compound is added, in particular, when the developer was fatigued, the plate surface is likely to be sticky, and thus, a water-soluble polymer compound is preferably not added.

As the wetting agent, the wetting agents described in paragraph 0141 of JP2013-134341A can be suitably used. The wetting agent may be used alone or in combination of two or more types thereof. The wetting agent is preferably used in an amount of 0.1% by mass to 5% by mass with respect to the total mass of the developing agent.

As the preservative, the preservatives described in paragraph 0142 of JP2013-134341A can be suitably used. Two or more preservatives are preferably used in combination such that the preservatives have effect on various molds and sterilization. The addition amount of the preservative is an amount in which the effect is stably exhibited on bacteria, fungi, yeast or the like, and although the addition amount varies depending on the type of bacteria, molds, or yeast, the addition amount is preferably within the range of 0.01% by mass to 4% by mass with respect to the total mass of the developer.

As the chelate compound, the chelate compounds described in paragraph 0143 of JP2013-134341A can be suitably used. As the chelating agent, a chelating agent which is stably present in the developer composition and does not impair the printability is selected. The addition amount is preferably 0.001% by mass to 1.0% by mass with respect to the total mass of the developer.

As the antifoaming agent, the antifoaming agents described in paragraph 0144 of JP2013-134341A can be suitably used. The content of the antifoaming agent is preferably within the range of 0.001% by mass to 1.0% by mass with respect to the total weight of the developer.

As the organic acid, the antifoaming agents described in paragraph 0145 of JP2013-134341A can be suitably used.

The content of the organic acid is preferably 0.01% by mass to 0.5% by mass with respect to the total mass of the developer.

Examples of the organic solvent include aliphatic hydrocarbons (hexane, heptane, "Isopar E, H, G" (manufactured by Exxon Chemical Company), gasoline, kerosene, and the like), aromatic hydrocarbons (toluene, xylene, and the like), halogenated hydrocarbons (methylene dichloride, ethylene dichloride, trichlene, monochlorobenzene, and the like), and polar solvents.

Examples of the polar solvent include alcohols (methanol, ethanol, propanol, isopropanol, benzyl alcohol, ethylene glycol monomethyl ether, 2-ethoxyethanol, and the like), ketones (methyl ethyl ketone, cyclohexanone, and the like), esters (ethyl acetate, methyl lactate, propylene glycol monomethyl ether acetate, and the like), others (triethyl phosphate, tricresyl phosphate, N-phenylethanolamine, N-phenyldiethanolamine, and the like).

In addition, in a case where the organic solvent is insoluble in water, it is also possible to use by solubilizing the organic solvent in water using a surfactant or the like. In a case where the developer contains an organic solvent, from the viewpoint of safety and inflammability, the concentration of the solvent is preferably less than 40% by mass.

Examples of the inorganic acid and the inorganic salt include phosphoric acid, metaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate, and nickel sulfate. The content of the inorganic salt is preferably 0.01% by mass to 0.5% by mass with respect to the total mass of the developer.

Although the temperature of development is not particularly limited as long as, at the temperature, developing is possible, the temperature is preferably at 60° C. or lower, and more preferably 15° C. to 40° C. In the development treatment using an automatic developing device, the developer becomes fatigued according to the treatment amount, and thus, the processing capability may be restored using a replenisher or a fresh developer. As one example of the development or the treatment after the development, a method of performing alkali development, removing the alkali in a post-water washing step, performing a gum treatment in a gumming step, and drying in a drying step can be exemplified. In addition, as another example, a method of performing pre-water washing, developing, and gumming at the same time by using an aqueous solution containing carbonate ions, hydrogencarbonate ions, and a surfactant can be preferably exemplified. Thus, particularly, the pre-water washing may not be performed, and only by using one solution, pre-water washing, developing, and gumming are performed in one bath, and then, a drying step may be preferably performed. After developing, drying is preferably performed after the excess developer is removed using a squeeze roller or the like.

The development step can be suitably performed by an automatic processing machine equipped with a rubbing member. Examples of the automatic processing machine include an automatic processing machine which performs a rubbing treatment while transporting the lithographic printing plate precursor after image exposure, described in JP1990-220061A (JP-H02-220061A) and JP1985-59351A (JP-S60-59351A), and an automatic processing machine which performs a rubbing treatment on the lithographic printing plate precursor after image exposure, set on a cylinder while rotating the cylinder, described in U.S. Pat. Nos. 5,148,746A, 5,568,768A, and GB2297719B. Among these, as the rubbing member, an automatic processing machine using a rotating brush roll is particularly preferable.

The rotating brush roll used in the present invention can be suitably selected in consideration of the difficulty in flowing of the image portion and the stiffness of the support of the lithographic printing plate precursor. As the rotating brush roll, a known rotating brush roll formed by implanting a brush material into a plastic or metal roll can be used. For example, the brush rolls described in JP1983-159533A (JP-S58-159533A) or JP1991-100554A (JP-H03-100554A) or a brush roll formed by closely and radially wrapping a metal or plastic grooved material into which a brush material has been implanted in a row on a plastic or metal roll which becomes a core, as described in JP1987-167253Y (JP-S62-167253Y), can be used.

As the brush material, plastic fibers (for example, polyester-based synthetic fibers such as polyethylene terephthalate and polybutylene terephthalate, polyamide-based synthetic fibers such as nylon 6.6 and nylon 6.10, polyacryl-based synthetic fibers such as polyacrylonitrile and polyalkyl methacrylate, and polyolefin-based synthetic fibers such as polypropylene and polystyrene) can be used, and for example, a plastic fiber having a diameter of a fiber hair of 20 μm to 400 μm and a length of a hair of 5 mm to 30 mm can be suitably used.

The outer diameter of the rotating brush roll is preferably 30 mm to 200 mm, and the rotation speed of the front end of the brush rubbing the plate surface is preferably 0.1 m/sec to 5 m/sec. A plurality of the rotating brush rolls is preferably used.

Although the rotation direction of the rotating brush roll may be the same direction or may be the reverse direction, with respect to the transporting direction of the lithographic printing plate precursor, in a case where two or more rotating brush rolls are used, it is preferable that at least one rotating brush roll rotates in the same direction and at least one rotating brush roll rotates in the reverse direction. Thus, removal of the photosensitive layer of the non-image portion becomes more reliable. Furthermore, it is also effective to swing the rotating brush roller in the rotation axis direction of the brush roll.

After the development step, a continuous or discontinuous drying step is preferably performed. Drying is performed by hot air, infrared rays, or far infrared rays.

As the automatic processing machine preferably used in the production method of the lithographic printing plate of the present invention, an apparatus having a developing portion and a drying portion, and developing, and gumming are performed on the lithographic printing plate precursor in developer tank, and then, the lithographic printing plate precursor is dried in the drying portion, whereby a lithographic printing plate is obtained.

In addition, for the purpose of improving printing durability or the like, it is also possible to heat the printing plate after developing in very strong conditions. The heating temperature is preferably within the range of 200° C. to 500° C. If the temperature is low, sufficient image strengthening effects are not obtained, and in a case where the temperature is too high, there is a possibility that problems such as deterioration of the support or thermal decomposition of the image portion occur.

The lithographic printing plate obtained in this manner is mounted on an offset printing machine, and can be suitably used in printing a large number of sheets.

EXAMPLES

Hereinafter, the present invention will be described in detail using examples, but the present invention is not limited thereto. Moreover, "part" and "%" in the following examples respectively represent "part(s) by mass" and "% by mass" unless otherwise specified.

Synthesis Examples

<Synthesis of Sulfonamide-Containing Diamine (SA-1)>

Into a three-neck flask provided with a condenser and a stirrer, 350.0 g of chlorosulfonic acid was put, then, 46.1 g of toluene (manufactured by Wako Pure Chemical Industries, Ltd.) was added thereto under ice-cooling, and the resulting solution was stirred for 1 hour under ice-cooling. The temperature of the reaction solution was raised to 60° C., and the reaction solution was stirred for 3 hours. This reaction solution was cooled to room temperature while being stirred and added dropwise to a mixed solution of 1 L of ice water and 1 L of chloroform, and after being stirred for 30 minutes, this was transferred to a separating funnel, and the organic layer (chloroform layer) was separated. This chloroform solution was transferred again to a separating funnel and washed with a saturated sodium hydrogen carbonate aqueous solution, then, washing with pure water and liquid-liquid separation was performed two times, and washing with saturated saline and liquid-liquid separation was performed. After the organic layer (chloroform layer) was transferred to an Erlenmeyer flask, 30 g of magnesium sulfate was added thereto, followed by stirring, the solid content was removed by filtration, the chloroform was distilled off using an evaporator, and the resulting product was vacuum-dried at room temperature for 24 hours, whereby 70.0 g of a precursor S-1 (4-methylbenzene-1,3-disulfonic chloride) which was a target substance was obtained. It was confirmed from the NMR spectrum that the obtained product was the precursor S-1. Analysis by $^1$NMR was performed on the precursor S-1. The result thereof is shown below.

$^1$NMR data (deuterated chloroform, 400 MHz, internal standard: tetramethylsilane) δ (ppm)=2.95 (s, 3H), 7.73-7.75 (d, 1H), 8.24-8.27 (d, 1H), 8.70 (s, 1H)

Into a three-neck flask provided with a condenser and a stirrer, 97.3 g of 1,4-phenylenediamine (manufactured by Tokyo Chemical Industry Co., Ltd.) and 400 g of acetonitrile were put, and the resulting solution was stirred while being cooled to 0° C. to 5° C. After 43.4 g of the obtained precursor (S-1) was dissolved in 400 g of tetrahydrofuran, the resulting solution was transferred to a dropping funnel, and the solution was added dropwise into the above three-neck flask under stirring over a period of 1 hour and stirred for 1 hour. After the temperature of the reaction solution was returned to room temperature, the solution was stirred for 2 hours, then, 615 g of a 1 M sodium hydroxide aqueous solution and 500 g of pure water were added thereto, and these were dissolved. This reaction solution was transferred to a separating funnel, then, washing with 500 mL of ethyl acetate and liquid-liquid separation was performed three times, and the aqueous layer was collected. After 33.7 g of ammonium chloride (manufactured by Kanto Chemical Co., Inc.) was put into a beaker, this ammonium chloride was dissolved in 2 L of pure water, and the resulting solution was stirred at room temperature. After the aqueous layer was added dropwise into the beaker, the precipitated crystals were collected by filtration, then, the crystals were reslurry-washed with 1 L of pure water, and the crystals were collected by filtration. The collected crystals were reslurry-washed with 500 mL of chloroform, then, the crystals were collected by filtration, and the collected crystals were vacuum-dried at 40° C. for 24 hours, whereby 56.5 g of a target substance (SA-1) was obtained. It was confirmed from the NMR spectrum that the obtained product was the target substance.

Analysis by $^1$NMR was performed on the target substance (SA-1). The result thereof is shown below.

$^1$NMR data (deuterated DMSO, 400 MHz, internal standard: tetramethylsilane) δ (ppm)=2.55 (s, 3H), 5.00 (s, 4H), 6.35-6.38 (t, 4H), 6.55-6.57 (d, 2H), 6.60-6.62 (d, 2H), 7.46-7.48 (d, 1H), 7.58-7.61 (d, 1H), 8.10 (s-1H), 9.61 (s-1H), 9.75 (s-1H)

In the same manner, SA-2 to SA-10 can be synthesized.

<Synthesis of Sulfonamide-Containing Diamine (SA-2)>

Into a three-neck flask provided with a condenser and a stirrer, 500.0 g of chlorosulfonic acid was put, then, 130.96 g of diphenylsulfone (manufactured by Sigma-Aldrich Co.) was added thereto at room temperature, and the resulting solution was stirred at room temperature for 1 hour. The temperature of the reaction solution was raised to 80° C., and the reaction solution was stirred for 8 hours. This reaction solution was cooled to room temperature while being stirred, and crystallized in 2 L of ice-cold water, followed by stirring for 30 minutes. This was collected by filtration, and the collected product was dissolved in 6 L of ethyl acetate. This ethyl acetate solution was transferred to a separating funnel, then, washing with pure water and liquid-liquid separation was performed two times, and washing with saturated saline and liquid-liquid separation was performed. After the organic layer was transferred to an Erlenmeyer flask, 30 g of magnesium sulfate was added thereto, followed by stirring, the solid content was removed by filtration, the ethyl acetate was distilled off using an evaporator, and the resulting product was vacuum-dried at 40° C. for 24 hours, whereby 145 g of a precursor S-2 (disulfonic chloride) which was a target substance was obtained. It was confirmed from the NMR spectrum that the obtained product was the precursor (S-2). Analysis by $^1$NMR was performed on the precursor S-2. The result thereof is shown below.

$^1$NMR data (deuterated D tetrahydrofuran, 400 MHz, internal standard: tetramethylsilane) δ (ppm)=8.00-8.04 (t, 2H), 8.43-8.48 (d, 2H), 8.56-8.59 (d, 2H), 8.76 (s, 2H)

Into a three-neck flask provided with a condenser and a stirrer, 43.26 g of 1,4-phenylenediamine (manufactured by Tokyo Chemical Industry Co., Ltd.) and 200 g of acetonitrile were put, and the resulting solution was stirred while being cooled to 0° C. to 5° C. After 20.76 g of the obtained precursor (S-2) was dissolved in 200 g of tetrahydrofuran, the resulting solution was transferred to a dropping funnel, and the solution was added dropwise into the above three-neck flask under stirring over a period of 1 hour and stirred for 1 hour. After the temperature of the reaction solution was returned to room temperature, the solution was stirred for 2 hours, then, 205 g of a 1 M sodium hydroxide aqueous solution and 300 g of pure water were added thereto, and these were dissolved. This reaction solution was transferred to a separating funnel, then, washing with 500 mL of ethyl acetate and liquid-liquid separation was performed three times, and the aqueous layer was collected. After 12.04 g of ammonium chloride (manufactured by Kanto Chemical Co., Inc.) was put into a beaker, this ammonium chloride was dissolved in 1 L of pure water, and the resulting solution was stirred at room temperature. After the aqueous layer was added dropwise into the beaker, the precipitated crystals were collected by filtration, then, the crystals were reslurry-washed with 1 L of pure water, and the crystals were collected by filtration. The collected crystals were reslurry-washed with 500 mL of methanol, then, the crystals were collected by filtration, and the collected crystals were vacuum-dried at 40° C. for 24 hours, whereby 26.1 g of a target substance (SA-2) was obtained. It was confirmed from the NMR spectrum that the obtained product was the target substance.

Analysis by $^{1}$NMR was performed on the target substance (SA-2). The result thereof is shown below.

$^{1}$NMR data (deuterated DMSO, 400 MHz, internal standard: tetramethylsilane) δ (ppm)=5.04 (s, 4H), 6.32-6.34 (d, 4H), 6.56-6.59 (d, 4H), 7.82-7.86 (t, 2H), 7.89-7.91 (d, 2H), 7.98-8.00 (d, 2H), 8.15 (s-2H), 9.69 (s-2H)

<Synthesis Example of Polyurea Resin (PU-1)>

Into a three-neck flask provided with a condenser and a stirrer, 5.19 g of SA-1 obtained above, 1.83 g of 3,5-diaminobenzoic acid (manufactured by Tokyo Chemical Industry Co., Ltd.), 0.04 g of sulfanilamide (manufactured by Tokyo Chemical Industry Co., Ltd.), and 25.8 g of N,N-dimethylacetamide were put, then, the temperature of the reaction solution was adjusted to room temperature, and the reaction solution was made to be homogeneous.

4.04 g of hexamethylene diisocyanate (manufactured by Tokyo Chemical Industry Co., Ltd.) and 0.01 g of NEOSTANN U-600 (manufactured by NITTO KASEI CO., LTD.: bismuth catalyst) were added thereto in this order, and the resulting solution was stirred at room temperature for 1 hour and allowed to react at 60° C. for 3 hours. Next, 5 g of methanol was added thereto, and the resulting product was allowed to react at 90° C. for 2 hours, whereby a binder polymer (PU-1) having a weight average molecular weight of 52,000 was obtained. It was confirmed from the NMR spectrum, the IR spectrum, and GPC (polystyrene conversion) that the obtained product was the target substance.

Moreover, in the same manner, PU-2 to PU-68 can be synthesized.

<Synthesis Example of Polyimide Resin (PI-1)>

Into a three-neck flask provided with a condenser and a stirrer, 3.89 g of SA-1 obtained in the same manner as the above synthetic method and 24.79 g of N-methylpyrrolidone were put, and by being stirred under ice-cooling, the resulting solution became homogeneous. 0.98 g of benzene-1,2,4,5-tetracarboxylic anhydride (manufactured by Tokyo Chemical Industry Co., Ltd.) and 1.32 g of diphenyl-3,3',4,4'-tetracarboxylic dianhydride (manufactured by Tokyo Chemical Industry Co., Ltd.) were added thereto in this order, and the resulting solution was stirred at 0° C. to 10° C. for 1 hour and allowed to react at room temperature for 3 hours. Next, 10.33 g of N-methylpyrrolidone, 2.85 g of pyridine, and 2.02 g of acetic anhydride were added thereto in this order, and the resulting solution was allowed to react at 80° C. for 3 hours. The reaction solution was poured into a mixed solution of 0.4 L of pure water and 0.4 L of methanol, and as a result, polyimide was precipitated. This was collected by filtration, washed, and dried, whereby 5.20 g of a binder polymer (PU-1) having a weight average molecular weight of 75,000 was obtained. It was confirmed from the NMR spectrum, the IR spectrum, and GPC (polystyrene conversion) that the obtained product was the target substance.

Moreover, in the same manner, PI-2 to PI-14 and PI-22 to PI-41 can be synthesized.

<Synthesis Example of Amide-Containing Polyimide Resin (PI-17)>

Into a three-neck flask provided with a condenser and a stirrer, 3.46 g of SA-1 obtained in the same manner as the above synthetic method, 16.44 g of N-methylpyrrolidone, and 0.53 g of triethylamine were put, and by being stirred under ice-cooling, the solution became homogeneous. 0.84 g of trimellitic anhydride chloride (manufactured by Tokyo Chemical Industry Co., Ltd.) and 1.17 g of diphenyl-3,3',4,4'-tetracarboxylic dianhydride (manufactured by Tokyo Chemical Industry Co., Ltd.) were added thereto in this order, and the resulting solution was stirred at 0° C. to 10° C. for 1 hour and allowed to react at room temperature for 3 hours. Next, 14.62 g of N-methylpyrrolidone, 3.54 g of pyridine, and 1.26 g of acetic anhydride were added thereto in this order, and the resulting solution was allowed to react at 80° C. for 3 hours. The reaction solution was poured into a mixed solution of 0.4 L of pure water and 0.4 L of methanol, and as a result, polyimide was precipitated. This was collected by filtration, washed, and dried, whereby 4.84 g of a binder polymer (PU-17) having a weight average molecular weight of 56,000 was obtained. It was confirmed from the NMR spectrum, the IR spectrum, and GPC (polystyrene conversion) that the obtained product was the target substance.

Moreover, in the same manner, PI-15, PI-16, and PI-18 to PI-21 can be synthesized.

In the examples, "weight average molecular weight" is calculated by a standard polystyrene conversion method using gel permeation chromatography (GPC). Here, as the GPC column, a column filled with polystyrene crosslinked gel (TSKgel SuperAWM-H; manufactured by Tosoh Corporation) was used, and as the GPC solvent, N-methylpyrrolidone (0.01 mol/L of each of phosphoric acid and lithium bromide) was used.

Examples 1 to 24 and Comparative Examples 1 to 3

<Production of Support>

An aluminum alloy plate having a thickness of 0.3 mm of a material 1S was subjected to the treatment shown in the following Table 9 among (A) to (F) described below, whereby and a support for a lithographic printing plate was manufactured. Moreover, during all treatment steps, a washing treatment with water was performed, and after the washing treatment with water, liquid cutting was performed using a nip roller.

[Treatment A]

(A-a) Mechanical Roughening Treatment (Brush Grain Method)

While supplying a suspension of pumice (specific gravity of 1.1 g/cm$^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(A-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 $g/m^2$.

(A-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(A-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 $A/dm^2$ as the peak current value, and 5% of the current from the power source was separately flowed to the auxiliary anode. The electric quantity ($C/dm^2$) was 185 $C/dm^2$ as the sum total of electric quantity at the time of anodization of the aluminum plate. Thereafter, washing with water by spraying was performed.

(A-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 $g/m^2$.

(A-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(A-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 $A/dm^2$ as the peak current value, and the electric quantity ($C/dm^2$) in the hydrochloric acid electrolysis was 63 $C/dm^2$ as the sum total of electric quantity at the time of anodization of the aluminum plate. Thereafter, washing with water by spraying was performed.

(A-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 $g/m^2$.

(A-i) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(A-j) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(A-k) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 $mg/m^2$. Thereafter, washing with water by spraying was performed.

[Treatment B]

(B-a) Mechanical Roughening Treatment (Brush Grain Method)

While supplying a suspension of pumice (specific gravity of 1.1 $g/cm^3$) to the surface of an aluminum plate as a polishing slurry liquid, a mechanical roughening treatment was performed using rotating bundle bristle brushes.

The median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having φ300 mm. The distance between two supporting rollers (φ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(B-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 $g/m^2$.

(B-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(B-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 $A/dm^2$ as the peak current value, and 5% of the current from the power source was separately flowed to the auxiliary anode. The electric quantity ($C/dm^2$) was 185 $C/dm^2$ as the sum total of electric quantity at the time of anodization of the aluminum plate. Thereafter, washing with water by spraying was performed.

(B-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 $g/m^2$.

(B-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(B-g) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1, the electrochemical surface-roughening treatment was performed using a carbon electrode as a counter electrode. As an auxiliary anode, ferrite was used.

The current density was 25 $A/dm^2$ as the peak current value, and the electric quantity ($C/dm^2$) in the hydrochloric acid electrolysis was 63 $C/dm^2$ as the sum total of electric quantity at the time of anodization of the aluminum plate. Thereafter, washing with water by spraying was performed.

(B-h) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 $g/m^2$.

(B-i) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(B-j) First Stage of Anodization Treatment

A first stage of the anodization treatment was performed using an anodizing apparatus by DC electrolysis. The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 $A/dm^2$. The depth of the micropores was 27 μm, and the obtained coating amount was 0.13 $g/m^2$.

(B-k) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(B-1) Second Stage of Anodization Treatment

A second stage of the anodizing treatment was performed using an anodizing apparatus by DC electrolysis. The anodizing treatment was performed using a solution obtained by dissolving aluminum ions of 7 g/L in a sulfuric acid aqueous solution of 170 g/L as an electrolytic bath under the conditions of a liquid temperature of 55° C. and a current density of 20 $A/dm^2$. The obtained coating amount was 2.6 $g/m^2$.

(B-m) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 $mg/m^2$. Thereafter, washing with water by spraying was performed.

[Treatment (C)]

(C-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 1.0 $g/m^2$.

(C-b) Desmutting Treatment in Acidic Aqueous Solution (First Desmutting Treatment)

Next, a desmutting treatment was performed in an acidic aqueous solution. As the acidic aqueous solution used in the desmutting treatment, a sulfuric acid aqueous solution having a concentration of 150 g/L was used. The temperature was 30° C. The desmutting treatment was performed for 3 seconds by spraying the desmutting liquid using a spray. Thereafter, a washing treatment with water was performed.

(C-c) Electrochemical Roughening Treatment in Acidic Aqueous Solution

Next, an electrolytic surface-roughening treatment was performed using an electrolyte in which the concentration of hydrochloric acid was 14 g/L, the concentration of aluminum ions was 13 g/L, and the concentration of sulfuric acid was 3 g/L. The temperature of the electrolyte was 30° C. The concentration of aluminum ions was adjusted by adding aluminum chloride.

The waveform of AC was a sine wave in which the positive waveform and the negative waveform were symmetrical, the frequency was 50 Hz, the anode reaction time and the cathode reaction time at one period of AC was 1:1, and the current density was 75 A/$dm^2$ at the peak current value of AC waveform. In addition, the electric quantity was 450 C/$dm^2$ as the sum total of electric quantity which the aluminum plate taken in the anode reaction, and the electrolytic treatment was performed four times with an interval of 4 seconds by 125 C/$dm^2$. As the counter electrode of the aluminum plate, a carbon electrode was used. Thereafter, a washing treatment with water was performed.

(C-d) Alkali Etching Treatment

The aluminum plate after the electrochemical roughening treatment was subjected to an etching treatment by spraying a caustic soda aqueous solution in which the concentration of caustic soda was 5% by mass and the concentration of aluminum ions was 0.5% by mass using a spray tube at a temperature of 35° C. The amount of aluminum dissolved on the surface subjected to the electrochemical roughening treatment was 0.1 g/$m^2$. Thereafter, a washing treatment with water was performed.

(C-e) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The temperature was 30° C. The desmutting treatment was performed for 3 seconds by spraying the desmutting liquid using a spray.

(C-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(C-g) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/$m^2$. Thereafter, washing with water by spraying was performed.

[Treatment (D)]

(D-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/$m^2$.

(D-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(D-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/$dm^2$ as the peak current value, and 5% of the current from the power source was separately flowed to the auxiliary anode. The electric quantity (C/$dm^2$) was 250 C/$dm^2$ as the sum total of electric quantity at the time of anodization of the aluminum plate. Thereafter, washing with water by spraying was performed.

(D-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/$m^2$.

(D-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(D-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(D-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(D-h) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(D-i) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(D-j) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/m$^2$. Thereafter, washing with water by spraying was performed.

[Treatment (E)]

(E-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/m$^2$.

(E-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(E-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/dm$^2$ as the peak current value, and 5% of the current from the power source was separately flowed to the auxiliary anode. The electric quantity (C/dm$^2$) was 250 C/dm$^2$ as the sum total of electric quantity at the time of anodization of the aluminum plate. Thereafter, washing with water by spraying was performed.

(E-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/m$^2$.

(E-e) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(E-f) Electrochemical Roughening Treatment

An electrochemical surface roughening treatment was continuously performed using an AC voltage of hydrochloric acid electrolysis 60 Hz. As the electrolyte, an electrolyte which had been adjusted to have a concentration of aluminum ions of 4.5 g/L by adding aluminum nitrate to a hydrochloric acid aqueous solution having a concentration of 6.2 g/L at a liquid temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 25 A/dm$^2$ as the peak current value, and the electric quantity (C/dm$^2$) in the hydrochloric acid electrolysis was 63 C/dm$^2$ as the sum total of electric quantity at the time of anodization of the aluminum plate. Thereafter, washing with water by spraying was performed.

(E-g) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.1 g/m$^2$.

(E-h) Desmutting Treatment in Acidic Aqueous Solution

Next, a desmutting treatment was performed in a sulfuric acid aqueous solution. Specifically, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed for 3 seconds by spraying the desmutting liquid using a spray.

(E-i) First Stage of Anodization Treatment

A first stage of the anodization treatment was performed using an anodizing apparatus by DC electrolysis.

The anodization treatment was performed using a solution obtained by dissolving aluminum ions of 7 g/L in a sulfuric acid aqueous solution of 170 g/L as an electrolytic bath under the conditions of a liquid temperature of 43° C. and a current density of 30 A/$dm^2$. The depth of the micropores was 27 μm, and the obtained coating amount was 0.13 g/$m^2$.

(E-j) Pore-Widening Treatment

A pore-widening treatment was performed by immersing the aluminum plate subjected to the anodization treatment in a caustic soda aqueous solution in which the concentration of caustic soda was 5% by mass and the concentration of aluminum ions was 0.5% by mass at a temperature of 35° C. for 1 second. Thereafter, washing with water by spraying was performed.

(E-k) Second Stage of Anodization Treatment

A second stage of the anodizing treatment was performed using an anodizing apparatus by DC electrolysis. The anodizing treatment was performed using a solution obtained by dissolving aluminum ions of 7 g/L in a sulfuric acid aqueous solution of 170 g/L as an electrolytic bath under the conditions of a liquid temperature of 40° C. and a current density of 20 A/$dm^2$. The obtained coating amount was 2.6 g/$m^2$.

(E-l) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/$m^2$. Thereafter, washing with water by spraying was performed.

[Treatment (F)]

(F-a) Alkali Etching Treatment

The aluminum plate was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved on the surface to be subjected to an electrochemical roughening treatment was 5 g/$m^2$.

(F-b) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(F-c) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 A/$dm^2$ as the peak current value, and 5% of the current from the power source was separately flowed to the auxiliary anode. The electric quantity (C/$dm^2$) was 250 C/$dm^2$ as the sum total of electric quantity at the time of anodization of the aluminum plate. Thereafter, washing with water by spraying was performed.

(F-d) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.2 g/$m^2$.

(F-e) Desmutting Treatment in Acidic Aqueous Solution

Next, the desmutting treatment was performed at a solution temperature of 35° C. for 4 seconds using the waste liquid (aluminum ions having a concentration of 5 g/L were dissolved in a sulfuric acid aqueous solution having a concentration of 170 g/L) generated in the anodization treatment step. The desmutting treatment was performed in a sulfuric acid aqueous solution. The desmutting treatment was performed for 3 seconds by spraying the desmutting liquid using a spray.

(F-f) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(F-g) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 mg/$m^2$. Thereafter, washing with water by spraying was performed.

[Treatment (G)]

(G-a) Mechanical Roughening Treatment (Brush Grain Method)

While supplying a suspension of pumice (specific gravity of 1.1 g/$cm^3$) to the surface of an aluminum plate as a polishing slurry liquid, a mechanical roughening treatment was performed using rotating bundle bristle brushes.

In the mechanical roughening treatment, the median diameter (μm) of a polishing material was 30 m, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(G-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 $g/m^2$.

(G-c) Desmutting Treatment in Acidic Aqueous Solution

Next, a desmutting treatment was performed in an acidic aqueous solution. As the acidic aqueous solution used in the desmutting treatment, the waste liquid (aluminum ions of 5.0 g/L were dissolved in a sulfuric acid aqueous solution of 170 g/L) generated in the anodization treatment step was used. The temperature was 30° C. The desmutting treatment was performed for 3 seconds by spraying the desmutting liquid using a spray.

(G-d) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(G-e) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 $mg/m^2$. Thereafter, washing with water by spraying was performed.

[Treatment (H)]

(H-a) Mechanical Roughening Treatment (Brush Grain Method)

While supplying a suspension of pumice (specific gravity of 1.1 $g/cm^3$) to the surface of an aluminum plate as a polishing slurry liquid, a mechanical roughening treatment was performed using rotating bundle bristle brushes.

In the mechanical roughening treatment, the median diameter (μm) of a polishing material was 30 μm, the number of the brushes was four, and the rotation speed (rpm) of the brushes was set to 250 rpm. The material of the bundle bristle brushes was nylon 6.10, the diameter of the brush bristles was 0.3 mm, and the bristle length was 50 mm. The brushes were produced by implanting bristles densely into the holes in a stainless steel cylinder having ϕ300 mm. The distance between two supporting rollers (ϕ200 mm) of the lower portion of the bundle bristle brush was 300 mm. The bundle bristle brushes were pressed until the load of a driving motor for rotating the brushes became 10 kW plus with respect to the load before the bundle bristle brushes were pressed against the aluminum plate. The rotation direction of the brushes was the same as the moving direction of the aluminum plate.

(H-b) Alkali Etching Treatment

The aluminum plate obtained above was subjected to an etching treatment by spraying a caustic soda aqueous solution in which the concentration of caustic soda was 26% by mass and the concentration of aluminum ions was 6.5% by mass using a spray tube at a temperature of 70° C. Thereafter, washing with water by spraying was performed. The amount of aluminum dissolved was 10 $g/m^2$.

(H-c) Desmutting Treatment in Acidic Aqueous Solution

Next, a desmutting treatment was performed in a nitric acid aqueous solution. As the nitric acid aqueous solution used in the desmutting treatment, the waste liquid of nitric acid used in electrochemical roughening of the next step was used. The temperature was 35° C. The desmutting treatment was performed for 3 seconds by spraying the desmutting liquid using a spray.

(H-d) Electrochemical Roughening Treatment

An electrochemical surface roughening treatment was continuously performed using an AC voltage of nitric acid electrolysis 60 Hz. As the electrolyte at this time, an electrolyte which had been adjusted to have a concentration of aluminum ions of 4.5 g/L by adding aluminum nitrate to a nitric acid aqueous solution having a concentration of 10.4 g/L at a temperature of 35° C. was used. Using a trapezoidal rectangular waveform AC having a time tp until the current value reached a peak from zero of 0.8 msec and the duty ratio of 1:1 as the AC power supply waveform, the electrochemical surface-roughening treatment was performed using a carbon electrode as a counter electrode. As an auxiliary anode, ferrite was used. The current density was 30 $A/dm^2$ as the peak current value, and 5% of the current from the power source was separately flowed to the auxiliary anode. The electric quantity ($C/dm^2$) was 185 $C/dm^2$ as the sum total of electric quantity at the time of anodization of the aluminum plate. Thereafter, washing with water by spraying was performed.

(H-e) Alkali Etching Treatment

The aluminum plate obtained above was subjected to an etching treatment by spraying a caustic soda aqueous solution in which the concentration of caustic soda was 5% by mass and the concentration of aluminum ions was 0.5% by mass using a spray tube at a temperature of 50° C. Thereafter, washing with water by spraying was performed. The amount of aluminum dissolved was 0.5 $g/m^2$.

(H-f) Desmutting Treatment in Acidic Aqueous Solution

Next, a desmutting treatment was performed in a sulfuric acid aqueous solution. As the sulfuric acid aqueous solution used in the desmutting treatment, a solution in which the concentration of sulfuric acid was 170 g/L and the concentration of aluminum ions was 5 g/L was used. The temperature was 30° C. The desmutting treatment was performed for 3 seconds by spraying the desmutting liquid using a spray.

(H-g) Anodization Treatment

An anodization treatment was performed using an anodization apparatus (the length of each of a first electrolytic portion and a second electrolytic portion was 6 m, the length of each of a first feeding portion and a second feeding portion was 3 m, and the length of each of a first feeding electrode and a second feeding electrode was 2.4 m) of a two-stage feeding electrolytic treatment method. As the electrolyte supplied to the first electrolytic portion and the second electrolytic portion, sulfuric acid was used. All electrolytes have a concentration of sulfuric acid of 50 g/L (including 0.5% by mass of aluminum ions) and were at a temperature of 20° C. Thereafter, washing with water by spraying was performed.

(H-h) Silicate Treatment

To ensure hydrophilicity of the non-image portion, a silicate treatment was performed by dipping at 50° C. for 7 seconds using 2.5% by mass No. 3 sodium silicate aqueous solution. The amount of Si attached was 10 $mg/m^2$. Thereafter, washing with water by spraying was performed.

[Formation of Undercoat]

An undercoat layer coating solution 1 shown below was applied to each of the supports A to F produced in the above manner, followed by drying at 80° C. for 15 seconds, whereby supports A-1 to F-1 provided with an undercoat were obtained. The coating amount after drying was 15 mg/m$^2$.

(Undercoat Coating Solution 1)

Following copolymer having a weight average molecular weight of 28,000: 0.3 parts Methanol: 100 parts Water: 1 part

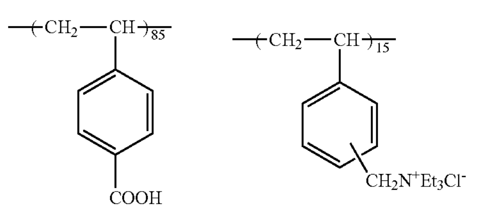

<Formation of Image Recording Layer>

After a coating solution composition (I) for forming an underlayer having the following compositional ratio was applied to the obtained supports [A-1] to [F-1] using a wire bar, the resulting product was dried in a drying oven at 150° C. for 40 seconds such that the coating amount became 1.0 g/m$^2$, whereby an underlayer was provided. After the underlayer was provided, a coating solution composition (II) for forming an upper layer having the following compositional ratio was applied using a wire bar, whereby an upper layer was provided. After application, the resulting product was dried at 150° C. for 40 seconds, whereby a lithographic printing plate precursor in which the amount of the underlayer and the upper layer coated was 1.2 g/m$^2$ was obtained.

(Coating Solution Composition (I) for Forming Underlayer)

Specific polymer compound described in Table 9: 3.5 parts m, p-Cresol novolac (m/p ratio=6/4, weight average molecular weight of 6,000): 0.6 parts Infrared absorbent (IR coloring agent (1): following structure): 0.2 parts 4,4'-Bishydroxyphenyl sulfone: 0.3 parts Tetrahydrophthalic acid: 0.4 parts p-Toluenesulfonic acid: 0.02 parts 3-Methoxy-4-diazodiphenylamine hexafluorophosphate: 0.06 parts Product obtained by replacing an counter ion of ethyl violet with 6-hydroxynaphthalenesulfonic acid: 0.15 parts Fluorine-based surfactant (MEGAFAC F-780, manufactured by DIC Corporation): 0.07 parts Methyl ethyl ketone: 30 parts 1-Methoxy-2-propanol: 15 parts γ-Butyrolactone: 15 parts IR coloring agent (1)

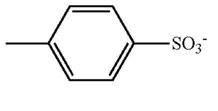

-continued

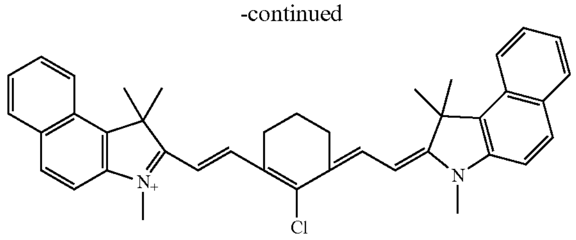

(Coating Solution Composition (II) for Forming Upper Layer)

Novolac resin (m-cresol/p-cresol/phenol=3/2/5, weight average molecular weight of 8,000): 0.68 parts Infrared absorbent (IR coloring agent (1): above structure): 0.045 parts Fluorine-based surfactant (MEGAFAC F-780, manufactured by DIC Corporation): 0.03 parts Methyl ethyl ketone: 15.0 parts 1-Methoxy-2-propanol: 30.0 parts 5-Benzoyl-4-hydroxy-2-methoxybenzenesulfonate of 1-(4-methylbenzyl)-1-phenylpiperidinium: 0.01 parts The following evaluations were performed on the obtained lithographic printing plate precursor, and the results are shown in the following Table 9.

<Evaluation of Non-Image Portion Development Time>

Drawing of a test pattern in an image was performed on the lithographic printing plate precursor using a Trendsetter VX manufactured by Creo company while changing the exposure energy. Thereafter, the resulting product was immersed in a developing bath charged with a developer XP-D (which was made to have a conductivity of 43 mS/cm by diluting) manufactured by Fujifilm Corporation, and the time required for developing the non-image portion at a developing temperature of 30° C. was measured. The immersion time in which the image density became equal to the image density of the Al support was taken as a non-Image portion development time. As the non-Image portion development time is shorter, an alkali aqueous solution developability (highlight reproducibility) is good. The results are shown in Table 9.

<Evaluation of Printing Durability>

Drawing of a test pattern in an image was performed on the lithographic printing plate precursor using a Trendsetter manufactured by Creo company at a beam intensity of 9 W and a drum rotation speed of 150 rpm. Thereafter, using PS PROCESSOR LP940H manufactured by Fujifilm Corporation charged with a developer XP-D (which was made to have a conductivity of 43 mS/cm by diluting) manufactured by Fujifilm Corporation, development was performed at a developing temperature of 30° C. The development time was made to be the non-image portion development time added with 5 seconds. This was continuously printed using a printer LITHRONE manufactured by KOMORI Corporation. As the ink, a tokunen black ink manufactured by TOYO INK CO., LTD. which contains calcium carbonate, as a model of low-grade material was used. At this time, by visually observing how much sheets could be printed while maintaining a sufficient ink density, the printing durability was evaluated. As the number of sheets was larger, the printing durability was evaluated to be excellent. The results are shown in Table 9.

<Evaluation of Chemical Resistance>

Exposure, development, and printing were performed on the lithographic printing plate precursors of the examples in the same manner as in the evaluation of the printing durability. In this time, every time 5,000 sheets were printed, a step of wiping the plate surface with a cleaner (manufactured by Fujifilm Corporation, multi cleaner) was performed, and the chemical resistance was evaluated. The printing durability at this time was evaluated as 1 in a case where the number of printed sheets was 95% to 100% of the number of printing endurable sheets described above, evaluated as 2 in a case where the number of printed sheets was 80% or greater and less than 95%, evaluated as 3 in a case where the number of printed sheets was 60% or greater and less than 80%, and evaluated as 4 in a case where the number of printed sheets was less than 60%. Even in a case where the step of wiping the plate surface with a cleaner was performed, as the change in the printing durability index was smaller, the chemical resistance was evaluated to be excellent. The results are shown in the following Table 9.

TABLE 9

| | Support | Specific polymer compound | Non-image portion developing time (seconds) | Printing durability number of printed sheets (×10000 sheets) | Chemical resistance |
|---|---|---|---|---|---|
| Example 1 | A-1 | PU-1 | 2 | 11 | 1 |
| Example 2 | B-1 | PU-1 | 2 | 11 | 1 |
| Example 3 | C-1 | PU-1 | 2 | 11 | 1 |
| Example 4 | D-1 | PU-1 | 2 | 11 | 1 |
| Example 5 | E-1 | PU-1 | 2 | 11 | 1 |
| Example 6 | F-1 | PU-1 | 2 | 11 | 1 |
| Example 7 | A-1 | PU-3 | 6 | 10 | 1 |
| Example 8 | A-1 | PU-6 | 4 | 10 | 2 |
| Example 9 | A-1 | PU-8 | 4 | 10 | 2 |
| Example 10 | A-1 | PU-21 | 4 | 9 | 1 |
| Example 11 | A-1 | PU-23 | 4 | 9 | 1 |
| Example 12 | A-1 | PU-57 | 8 | 12 | 1 |
| Example 13 | A-1 | PU-61 | 7 | 12 | 1 |
| Example 14 | A-1 | PU-65 | 8 | 12 | 1 |
| Example 15 | A-1 | PI-1 | 2 | 9 | 1 |
| Example 16 | A-1 | PI-2 | 2 | 9 | 1 |
| Example 17 | A-1 | PI-3 | 2 | 9 | 1 |
| Example 18 | A-1 | PI-17 | 4 | 10 | 2 |
| Example 19 | A-1 | PI-18 | 4 | 10 | 2 |
| Example 20 | A-1 | PI-19 | 4 | 10 | 2 |
| Example 21 | A-1 | PI-30 | 2 | 10 | 1 |
| Example 22 | A-1 | PI-32 | 6 | 10 | 1 |
| Example 23 | A-1 | PI-34 | 6 | 10 | 1 |
| Example 24 | A-1 | PN-1 | 8 | 11 | 1 |
| Comparative Example 1 | A-1 | CP-1 | 150 | 18 | 2 |
| Comparative Example 2 | A-1 | CP-2 | 150 | 7 | 3 |
| Comparative Example 3 | A-1 | CP-3 | 20 | 5 | 3 |

Synthesis Example Of Comparative Example 1 (CP-1)

Into a three-neck flask provided with a condenser and a stirrer, 12.51 g of 4,4'-diaminodiphenylmethane (manufactured by Tokyo Chemical Industry Co., Ltd.) and 112.59 g of N-methylpyrrolidone (manufactured by Kanto Chemical Co., Inc.) were put, and by being stirred under ice-cooling, the solution became homogeneous. Next, into a dropping funnel, 5.95 g of methylenediphenyl 4,4'-diisocyanate (manufactured by Tokyo Chemical Industry Co., Ltd.) and 53.5 g of N-methylpyrrolidone (manufactured by Kanto Chemical Co., Inc.) were put, followed by dissolving, and the resulting solution was added dropwise to the reaction solution over a period of 1 hour. The resulting product was stirred at 0° C. to 10° C. for 1 hour, and allowed to react at room temperature for 2 hours. The reaction solution was added dropwise to a mixed solution of 0.5 L of pure water and 0.5 L of methanol, and as a result, a polymer was precipitated. This was collected by filtration, washed, and dried, whereby 14.8 g of a binder polymer (CP-1) having a weight average molecular weight of 76,000 was obtained. It was confirmed from the NMR spectrum, the IR spectrum, and GPC (polystyrene conversion) that the obtained product was the target substance.

Synthesis Example Of Comparative Example 2 (CP-2)

Into a three-neck flask provided with a condenser and a stirrer, 6.97 g of 1,6-hexanediamine (manufactured by Tokyo Chemical Industry Co., Ltd.) and 53.9 g of N-methylpyrrolidone (manufactured by Kanto Chemical Co., Inc.) were put, and by being stirred at room temperature under a nitrogen flow, the solution became homogeneous. Next, 9.49 g of pyridine (manufactured by Kanto Chemical Co., Inc.) and 7.33 g of 4-dimethylaminopyridine (manufactured by Tokyo Chemical Industry Co., Ltd.) was added to the reaction solution, followed by dissolving. Next, 22.03 g of 4,4'-oxybis(benzenesulfonylchloride) (manufactured by Tokyo Chemical Industry Co., Ltd.) was added to the flask, followed by stirring at room temperature for 1 hour, then, the temperature was raised to 60° C., and the resulting solution was allowed to react for 10 hours. The reaction solution was added dropwise to a mixed solution of 0.5 L of pure water and 0.5 L of methanol, and as a result, a polymer was precipitated. This was collected by filtration, washed, and dried, whereby 25.5 g of a binder polymer (CP-2) having a weight average molecular weight of 52,000 was obtained. It was confirmed from the NMR spectrum, the IR spectrum, and GPC (polystyrene conversion) that the obtained product was the target substance.

Synthesis Example Of Comparative Example 3 (CP-3)

Into a three-neck flask provided with a condenser and a stirrer, 5.80 g of N,N'-dimethylformamide (manufactured by Wako Pure Chemical Industries, Ltd.) was put, and the solution was stirred at 65° C. for 30 minutes under a nitrogen flow. Next, into a dropping funnel, a 7.21 g of 4-methacrylamidebenzene sulfonamide (manufactured by FUJIFILM Finechemicals Co., Ltd.), 3.00 g of methyl methacrylate (manufactured by Wako Pure Chemical Industries, Ltd.), 2.12 g of acrylonitrile (manufactured by Tokyo Chemical Industry Co., Ltd.), 23.0 g of N,N'-dimethylformamide (manufactured by Wako Pure Chemical Industries, Ltd.), and 0.324 g of azobisisobutyronitrile (manufactured by Wako Pure Chemical Industries, Ltd.) were put, followed by dissolving, and the resulting solution was added dropwise to the flask over a period of 2 hours. The resulting product was stirred at 65° C. for 3 hours. The reaction solution was added dropwise to a mixed solution of 0.5 L of pure water and 0.5 L of methanol, and as a result, a polymer was precipitated. This was collected by filtration, washed, and dried, whereby 11.2 g of a binder polymer (CP-3) having a weight average molecular weight of 65,000 was obtained. It was confirmed from the NMR spectrum, the IR spectrum, and GPC (polystyrene conversion) that the obtained product was the target substance.

CP-1

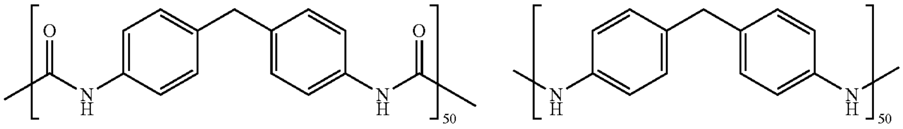

CP-2

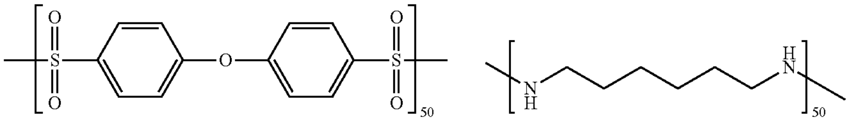

CP-3

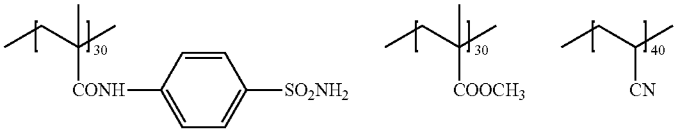

As apparent from the results shown in Table 9, it is found that, in a case where the photosensitive resin composition of the present invention is used, developability and printing durability are improved.

Examples 25 to 48 and Comparative Examples 4 to 6

<Production of Support>

In the same manner as in Examples 1 to 24, supports [A] to [F] were produced.

<Formation of Undercoat>

In the same manner as in Examples 1 to 24, supports [A-1] to [F-1] having an undercoat were produced.

<Formation of Recording Layer>

After a coating solution composition (III) for forming an underlayer having the following compositional ratio was applied to the obtained supports [A-1] to [F-1] using a wire bar, the resulting product was dried in a drying oven at 150° C. for 40 seconds such that the coating amount became 1.0 g/m$^2$, whereby an underlayer was provided. After the underlayer was provided, a coating solution composition (IV) for forming an upper layer having the following compositional ratio was applied using a wire bar, whereby an upper layer was provided. After application, the resulting product was dried at 150° C. for 40 seconds, whereby a lithographic printing plate precursor in which the amount of the underlayer and the upper layer coated was 1.2 g/m$^2$ was obtained.

(Coating Solution Composition (III) for Forming Underlayer)

- Copolymer (weight average molecular weight of 65,000) of N-(p-aminosulfonylphenyl)methacrylamide/methyl methacrylate/acrylonitrile=35/35/30 (molar ratio): 3.5 parts
- m, p-Cresol novolac (m/p ratio=6/4, weight average molecular weight of 6,000): 0.6 parts
- Infrared absorbent (above IR coloring agent (1)): 0.2 parts
- 4,4'-Bishydroxyphenyl sulfone: 0.3 parts
- Tetrahydrophthalic acid: 0.4 parts
- p-Toluenesulfonic acid: 0.02 parts
- 3-Methoxy-4-diazodiphenylamine hexafluorophosphate: 0.06 parts
- Product obtained by replacing a counter ion of ethyl violet with 6-hydroxynaphthalenesulfonic acid: 0.15 parts
- Fluorine-based surfactant (MEGAFAC F-780, manufactured by DIC Corporation): 0.07 parts
- Methyl ethyl ketone: 30 parts
- 1-Methoxy-2-propanol: 15 parts
- γ-Butyrolactone: 15 parts (Coating Solution Composition (IV) for Forming Upper Layer)

- Specific polymer compound described in Table 10: 0.3 parts
- Novolac resin (m-cresol/p-cresol/phenol=3/2/5, Mw 8,000): 0.4 parts
- Infrared absorbent (above IR coloring agent (1)): 0.045 parts
- Fluorine-based surfactant (MEGAFAC F-780, manufactured by DIC Corporation): 0.03 parts
- Methyl ethyl ketone: 15.0 parts
- 1-Methoxy-2-propanol: 30.0 parts
- 5-Benzoyl-4-hydroxy-2-methoxybenzenesulfonate of 1-(4-methylbenzyl)-1-phenylpiperidinium: 0.01 parts Evaluation was performed on the obtained lithographic printing plate precursor under the same conditions as in Example 1. The results are shown in the following Table 10.

TABLE 10

| | Support | Specific polymer compound | Non-image portion developing time (seconds) | Printing durability number of printed sheets (×10000 sheets) | Chemical resistance |
|---|---|---|---|---|---|
| Example 25 | A-1 | PU-1 | 2 | 9 | 1 |
| Example 26 | B-1 | PU-1 | 2 | 9 | 1 |
| Example 27 | C-1 | PU-1 | 2 | 9 | 1 |
| Example 28 | D-1 | PU-1 | 2 | 9 | 1 |
| Example 29 | E-1 | PU-1 | 2 | 9 | 1 |
| Example 30 | F-1 | PU-1 | 2 | 9 | 1 |
| Example 31 | A-1 | PU-3 | 4 | 8 | 1 |
| Example 32 | A-1 | PU-6 | 2 | 8 | 2 |
| Example 33 | A-1 | PU-8 | 2 | 8 | 2 |
| Example 34 | A-1 | PU-21 | 2 | 7 | 1 |
| Example 35 | A-1 | PU-23 | 4 | 7 | 1 |
| Example 36 | A-1 | PU-57 | 6 | 10 | 1 |
| Example 37 | A-1 | PU-61 | 5 | 10 | 1 |
| Example 38 | A-1 | PU-65 | 4 | 10 | 1 |
| Example 39 | A-1 | PI-1 | 2 | 7 | 1 |
| Example 40 | A-1 | PI-2 | 2 | 7 | 1 |
| Example 41 | A-1 | PI-3 | 2 | 7 | 1 |
| Example 42 | A-1 | PI-17 | 2 | 8 | 2 |
| Example 43 | A-1 | PI-18 | 2 | 8 | 2 |
| Example 44 | A-1 | PI-19 | 2 | 8 | 2 |
| Example 45 | A-1 | PI-30 | 5 | 8 | 1 |
| Example 46 | A-1 | PI-32 | 5 | 8 | 1 |

TABLE 10-continued

| | Support | Specific polymer compound | Non-image portion developing time (seconds) | Printing durability number of printed sheets (×10000 sheets) | Chemical resistance |
|---|---|---|---|---|---|
| Example 47 | A-1 | PI-34 | 4 | 8 | 1 |
| Example 48 | A-1 | PN-1 | 4 | 9 | 1 |
| Comparative Example 4 | A-1 | CP-1 | 100 | 10 | 2 |
| Comparative Example 5 | A-1 | CP-2 | 100 | 6 | 3 |
| Comparative Example 6 | A-1 | CP-3 | 18 | 5 | 3 |

As apparent from the results shown in Table 10, it is found that, in a case where the photosensitive resin composition of the present invention is used, developability and printing durability are improved.

Examples 49 to 72 and Comparative Examples 7 to 9

<Production of Support>

In the same manner as in Examples 1 to 24, supports [A] to [F] were produced.

<Formation of Undercoat>

An undercoat coating solution 2 shown below was applied to each of the supports [A] to [F] produced in the above manner, followed by drying at 80° C. for 15 seconds, whereby supports [A-1] to [F-1] provided with an undercoat were obtained. The coating amount after drying was 15 mg/m$^2$.

(Undercoat Coating Solution 2)

β-alanine: 0.5 parts

Methanol: 95 parts

Water: 5 parts

<Formation of Recording Layer>

After a coating solution composition (V) for forming an underlayer having the following compositional ratio was applied to the obtained supports [A-1] to [F-1] using a wire bar such that the coating amount became 1.5 g/m$^2$, the resulting product was dried in a drying oven at 160° C. for 40 seconds and, immediately, cooled until the temperature of the support reached 35° C. using a cold air at 17° C. to 20° C., whereby an underlayer was provided. After the underlayer was provided, a coating solution composition (VI) for forming an upper layer having the following compositional ratio was applied thereto using a wire bar such that the coating amount became 0.5 g/m$^2$, and by drying the resulting product at 130° C. for 40 seconds and slowly cooling using an air at 20° C. to 26° C., an upper layer was provided, whereby a lithographic printing plate precursor was obtained.

(Coating Solution Composition (V) for Forming Underlayer)

Specific polymer compound described in Table 11: 0.8 parts

Infrared absorbent (IR coloring agent (1): above structure): 0.017 parts

CRYSTAL VIOLET (manufactured by HODOGAYA CHEMICAL CO., LTD.): 0.017 parts

MEGAFAC F-177 (manufactured by DIC Corporation, fluorine-based surfactant): 0.015 parts γ-Butyrolactone: 10 parts Methyl ethyl ketone: 10 parts 1-Methoxy-2-propanol: 8 parts (Coating Solution Composition (VI) for Forming Upper Layer)

Styrene/acrylonitrile/methacrylic acid copolymers (compositional ratio of 69 mol %/25 mol %/6 mol %, weight average molecular weight=45,000): 20 parts Alkali-soluble resin: following polyurethane 1: 10 parts Ethyl Violet: 0.03 parts MEGAFAC F-177 (manufactured by DIC Corporation, fluorine-based surfactant): 0.05 parts 3-Pentanone: 60 parts Propylene glycol monomethyl ether-2-acetate: 8 parts (Polyurethane 1)

A diisocyanate compound and a diol compound represented by the following formulas was polymerized to be a molar ratio of 1:1 (weight-average molecular weight of 36,000).

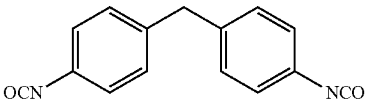

(80 mol %)

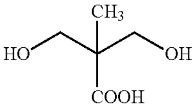

(80 mol %)

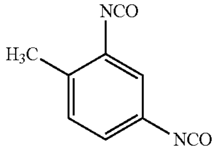

(20 mol %)

$HO-(CH_2)_{10}-OH$ (20 mol %)

Evaluation was performed on the obtained lithographic printing plate precursor under the same conditions as in Example 1 except that the specific developer A described below was used in a development treatment. The results are shown in the following Table 11.

(Compositional Ratio of Specific Developer A)

Water: 796 parts

Sodium carbonate: 12.8 parts

Sodium hydrogen carbonate: 7.0 parts

Sodium gluconate: 15.5 parts

Softazoline LPB-R (30% aqueous solution): 154.0 parts

Softazoline LAO (30% aqueous solution): 38.0 parts

Ethylenediamine disuccinate: 6.7 parts pH 9.85

TABLE 11

| | Support | Specific polymer compound | Non-image portion developing time (seconds) | Printing durability number of printed sheets (×10000 sheets) | Chemical resistance |
|---|---|---|---|---|---|
| Example 49 | A-1 | PU-1 | 6 | 15 | 1 |
| Example 50 | B-1 | PU-1 | 6 | 15 | 1 |
| Example 51 | C-1 | PU-1 | 6 | 15 | 1 |
| Example 52 | D-1 | PU-1 | 6 | 15 | 1 |
| Example 53 | E-1 | PU-1 | 6 | 15 | 1 |
| Example 54 | F-1 | PU-1 | 6 | 15 | 1 |
| Example 55 | A-1 | PU-3 | 10 | 13 | 1 |
| Example 56 | A-1 | PU-6 | 8 | 13 | 2 |
| Example 57 | A-1 | PU-8 | 8 | 13 | 2 |
| Example 58 | A-1 | PU-21 | 8 | 12 | 1 |
| Example 59 | A-1 | PU-23 | 8 | 12 | 1 |

TABLE 11-continued

| | Support | Specific polymer compound | Non-image portion developing time (seconds) | Printing durability number of printed sheets (×10000 sheets) | Chemical resistance |
|---|---|---|---|---|---|
| Example 60 | A-1 | PU-57 | 12 | 16 | 1 |
| Example 61 | A-1 | PU-61 | 11 | 16 | 1 |
| Example 62 | A-1 | PU-65 | 10 | 16 | 1 |
| Example 63 | A-1 | PI-1 | 6 | 12 | 1 |
| Example 64 | A-1 | PI-2 | 6 | 12 | 1 |
| Example 65 | A-1 | PI-3 | 6 | 12 | 1 |
| Example 66 | A-1 | PI-17 | 6 | 13 | 2 |
| Example 67 | A-1 | PI-18 | 6 | 13 | 2 |
| Example 68 | A-1 | PI-19 | 6 | 13 | 2 |
| Example 69 | A-1 | PI-30 | 10 | 14 | 1 |
| Example 70 | A-1 | PI-32 | 8 | 14 | 1 |
| Example 71 | A-1 | PI-34 | 8 | 14 | 1 |
| Example 72 | A-1 | PN-1 | 8 | 14 | 1 |
| Comparative Example 7 | A-1 | CP-1 | 150 | 20 | 2 |
| Comparative Example 8 | A-1 | CP-2 | 150 | 9 | 3 |
| Comparative Example 9 | A-1 | CP-3 | 25 | 7 | 3 |

As apparent from the results shown in Table 11, it is found that, in a case where the photosensitive resin composition of the present invention is used, developability and printing durability are improved.

Examples 73 to 96 and Comparative Examples 10 to 12

<Production of Support>

In the same manner as in Examples 1 to 24, supports [A] to [F] were produced.

<Formation of Undercoat>

In the same manner as in Examples 49 to 72, supports [A-1] to [F-1] having an undercoat were produced.

<Formation of Recording Layer>

After a coating solution composition (VII) for forming an underlayer having the following compositional ratio was applied to the obtained supports [A-1] to [F-1] using a wire bar such that the coating amount became 1.5 g/m$^2$, the resulting product was dried in a drying oven at 160° C. for 40 seconds and, immediately, cooled until the temperature of the support reached 35° C. using a cold air at 17° C. to 20° C., whereby an underlayer was provided. After the underlayer was provided, a coating solution composition (VIII) for forming an upper layer having the following compositional ratio was applied thereto using a wire bar such that the coating amount became 0.5 g/m$^2$, and by drying the resulting product at 130° C. for 40 seconds and slowly cooling using an air at 20° C. to 26° C., an upper layer was provided, whereby a lithographic printing plate precursor was obtained.

(Coating Solution Composition (VII) for Forming Underlayer)

N-phenylmaleimide/methacrylic acid/methacrylic amide copolymer (copolymerization ratio of 60 mol %/15 mol %/25 mol %, weight average molecular weight=50,000): 0.8 parts Infrared absorbent (IR coloring agent (1): above structure): 0.017 parts CRYSTAL VIOLET (manufactured by HODOGAYA CHEMICAL CO., LTD.): 0.017 parts MEGAFAC F-177 (manufactured by DIC Corporation, fluorine-based surfactant): 0.015 parts γ-Butyrolactone: 10 parts Methyl ethyl ketone: 10 parts 1-Methoxy-2-propanol: 8 parts (Coating Solution Composition (VIII) for Forming Upper Layer)

Specific polymer compound described in Table 12: 20 parts

Alkali-soluble resin: following polyurethane 1: 10 parts

Ethyl Violet: 0.03 parts

MEGAFAC F-177 (manufactured by DIC Corporation, fluorine-based surfactant): 0.05 parts 3-Pentanone: 60 parts Propylene glycol monomethyl ether-2-acetate: 8 parts Evaluation was performed on the obtained lithographic printing plate precursor under the same conditions as in Examples 49 to 72. The results are shown in the following Table 12.

TABLE 12

| | Support | Specific polymer compound | Non-image portion developing time (seconds) | Printing durability number of printed sheets (×10000 sheets) | Chemical resistance |
|---|---|---|---|---|---|
| Example 73 | A-1 | PU-1 | 4 | 13 | 1 |
| Example 74 | B-1 | PU-1 | 4 | 13 | 1 |
| Example 75 | C-1 | PU-1 | 4 | 13 | 1 |
| Example 76 | D-1 | PU-1 | 4 | 13 | 1 |
| Example 77 | E-1 | PU-1 | 4 | 13 | 1 |
| Example 78 | F-1 | PU-1 | 4 | 13 | 1 |
| Example 79 | A-1 | PU-3 | 8 | 12 | 1 |
| Example 80 | A-1 | PU-6 | 6 | 12 | 2 |
| Example 81 | A-1 | PU-8 | 6 | 12 | 2 |
| Example 82 | A-1 | PU-21 | 6 | 10 | 1 |
| Example 83 | A-1 | PU-23 | 6 | 10 | 1 |
| Example 84 | A-1 | PU-57 | 9 | 14 | 1 |
| Example 85 | A-1 | PU-61 | 8 | 14 | 1 |
| Example 86 | A-1 | PU-65 | 6 | 14 | 1 |
| Example 87 | A-1 | PI-1 | 4 | 10 | 1 |
| Example 88 | A-1 | PI-2 | 4 | 10 | 1 |
| Example 89 | A-1 | PI-3 | 4 | 10 | 1 |
| Example 90 | A-1 | PI-17 | 4 | 12 | 2 |
| Example 91 | A-1 | PI-18 | 4 | 12 | 2 |
| Example 92 | A-1 | PI-19 | 4 | 12 | 2 |
| Example 93 | A-1 | PI-30 | 7 | 12 | 1 |
| Example 94 | A-1 | PI-32 | 6 | 12 | 1 |
| Example 95 | A-1 | PI-34 | 5 | 12 | 1 |
| Example 96 | A-1 | PN-1 | 6 | 13 | 1 |
| Comparative Example 10 | A-1 | CP-1 | 120 | 18 | 2 |
| Comparative Example 11 | A-1 | CP-2 | 120 | 8 | 3 |
| Comparative Example 12 | A-1 | CP-3 | 16 | 6 | 3 |

As apparent from the results shown in Table 12, it is found that, in a case where the photosensitive resin composition of the present invention is used, developability and printing durability are improved.

Examples 97 to 120 and Comparative Examples 13 to 15

<Production of Support>

In the same manner as in Examples 1 to 24, supports [A] to [F] were produced.

<Formation of Undercoat>

In the same manner as in Examples 1 to 24, supports [A-1] to [F-1] having an undercoat were produced.

<Formation of Recording Layer>

After a coating solution composition (IX) having the following compositional ratio was applied to the obtained supports [A-1] to [F-1] using a wire bar, the resulting product was dried in a drying oven at 140° C. for 50 seconds, whereby a lithographic printing plate precursor having a coating amount of 1.0 g/m$^2$ was obtained.

(Coating Solution Composition (IX))

m, p-Cresol novolac (m/p ratio=6/4, weight average molecular weight of 5,000): 0.474 parts Specific polymer compound described in Table 13: 2.37 parts Infrared absorbent (above IR coloring agent (1)): 0.155 parts 2-Methoxy-4-(N-phenylamino)benzenediazonium hexafluorophosphate: 0.03 parts Tetrahydrophthalic anhydride: 0.19 parts Product obtained by replacing an counter ion of ethyl violet with 6-hydroxy-β-naphthalenesulfonic acid: 0.11 parts Fluorine-based surfactant (MEGAFAC F-780, manufactured by Dainippon Ink and Chemicals): 0.07 parts p-Toluenesulfonic acid: 0.008 parts Bis-p-hydroxyphenyl sulfone: 0.13 parts 3,3'-Dimyristyl thiodipropionate: 0.04 parts Lauryl stearate: 0.02 parts γ-Butyrolactone: 13 parts Methyl ethyl ketone: 24 parts 1-Methoxy-2-propanol: 11 parts Evaluation was performed on the obtained lithographic printing plate precursor under the same conditions as in Example 1 except that a developer LH-DS manufactured by Fujifilm Corporation was used in a development treatment, and the results are shown in the following Table 13.

TABLE 13

| | Support | Specific polymer compound | Non-image portion developing time (seconds) | Printing durability number of printed sheets (×10000 sheets) | Chemical resistance |
|---|---|---|---|---|---|
| Example 97 | A-1 | PU-1 | 6 | 11 | 1 |
| Example 98 | B-1 | PU-1 | 6 | 11 | 1 |
| Example 99 | C-1 | PU-1 | 6 | 11 | 1 |
| Example 100 | D-1 | PU-1 | 6 | 11 | 1 |
| Example 101 | E-1 | PU-1 | 6 | 11 | 1 |
| Example 102 | F-1 | PU-1 | 6 | 11 | 1 |
| Example 103 | A-1 | PU-3 | 10 | 10 | 1 |
| Example 104 | A-1 | PU-6 | 8 | 10 | 2 |
| Example 105 | A-1 | PU-8 | 8 | 10 | 2 |
| Example 106 | A-1 | PU-21 | 8 | 8 | 1 |
| Example 107 | A-1 | PU-23 | 8 | 8 | 1 |
| Example 108 | A-1 | PU-57 | 12 | 12 | 1 |
| Example 109 | A-1 | PU-61 | 10 | 12 | 1 |
| Example 110 | A-1 | PU-65 | 8 | 12 | 1 |
| Example 111 | A-1 | PI-1 | 6 | 8 | 1 |

TABLE 13-continued

| | Support | Specific polymer compound | Non-image portion developing time (seconds) | Printing durability number of printed sheets (×10000 sheets) | Chemical resistance |
|---|---|---|---|---|---|
| Example 112 | A-1 | PI-2 | 6 | 8 | 1 |
| Example 113 | A-1 | PI-3 | 6 | 8 | 1 |
| Example 114 | A-1 | PI-17 | 6 | 10 | 2 |
| Example 115 | A-1 | PI-18 | 6 | 10 | 2 |
| Example 116 | A-1 | PI-19 | 6 | 10 | 2 |
| Example 117 | A-1 | PI-30 | 9 | 10 | 1 |
| Example 118 | A-1 | PI-32 | 8 | 10 | 1 |
| Example 119 | A-1 | PI-34 | 6 | 10 | 1 |
| Example 120 | A-1 | PN-1 | 8 | 11 | 1 |
| Comparative Example 13 | A-1 | CP-1 | 150 | 16 | 2 |
| Comparative Example 14 | A-1 | CP-2 | 150 | 7 | 3 |
| Comparative Example 15 | A-1 | CP-3 | 25 | 5 | 3 |

As apparent from the results shown in Table 13, it is found that, in a case where the photosensitive resin composition of the present invention is used, developability and printing durability are improved.

What is claimed is:

1. A photosensitive resin composition, comprising:

a polymer compound having a constitutional unit represented by the following Formula A-1 as a constitutional unit A and at least one constitutional unit among constitutional units represented by the following Formulas B-1, B-2, B-4 and B-6 as a constitutional unit B in a main chain; and an infrared absorbing material, (A-1)

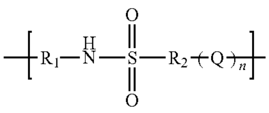

(B-1)

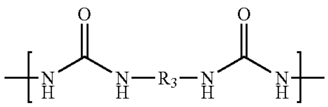

(B-2)

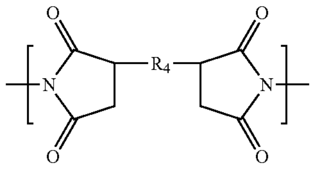

-continued (B-4)

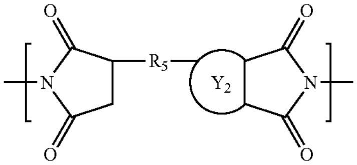

(B-6)

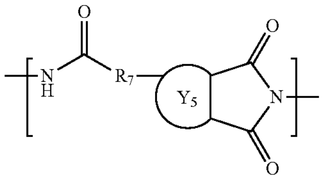

wherein in Formula A-1 and Formulas B-1, B-2, B-4 and B-6, $R_1$ to $R_3$ each independently represent a divalent linking group, Q represents a divalent structure including a sulfonamide group, n represents an integer of 0 or greater, $R_4$, $R_5$ and $R_7$ each independently represent a single bond or a divalent linking group, and $Y_2$ and $Y_5$ each independently represent an aromatic hydrocarbon ring or an aliphatic hydrocarbon ring.

2. The photosensitive resin composition according to claim 1, wherein the polymer compound has the constitutional unit represented by Formula B-1 or B-6 as the constitutional unit B.

3. The photosensitive resin composition according to claim 1, wherein the polymer compound has the constitutional unit represented by Formula B-1 as the constitutional unit B.

4. The photosensitive resin composition according to claim 1, wherein the constitutional unit A is a constitutional unit represented by the following Formula A-2, and (A-2)

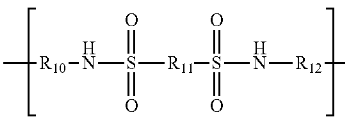

in Formula A-2, $R_{10}$, $R_{11}$, and $R_{12}$ each independently represent a divalent linking group.

5. The photosensitive resin composition according to claim 1, wherein the polymer compound further has a constitutional unit represented by the following Formula A-3 as a constitutional unit A' in the main chain, and (A-3)

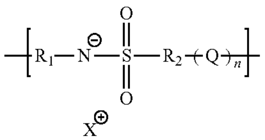

in Formula A-3, $R_1$ and $R_2$ each independently represent a divalent linking group, Q represents a divalent structure including a sulfonamide group, n represents an integer of 0 or greater, and X represents an organic or inorganic cation.

6. The photosensitive resin composition according to claim 5, wherein the ratio of the constitutional unit A to the total mass of the constitutional unit A and the constitutional unit A' in the polymer compound is 5% by mass to 90% by mass.

7. The photosensitive resin composition according to claim 1, wherein $R_1$ and $R_2$ are arylene groups.

8. The photosensitive resin composition according to claim 1, wherein the polymer compound further has an alkyleneoxy group in the main chain.

9. A lithographic printing plate precursor, comprising:

an image recording layer including the photosensitive resin composition according to claim 1.

10. The lithographic printing plate precursor according to claim 9 which is a positive type.

11. The lithographic printing plate precursor according to claim 9, wherein the image recording layer is formed on a support having a hydrophilic surface.

12. The lithographic printing plate precursor according to claim 11 which is a positive type lithographic printing plate precursor having an image recording layer having an underlayer and an upper layer in this order on the support having a hydrophilic surface, wherein the photosensitive resin composition is contained in the underlayer and/or the upper layer.

13. The lithographic printing plate precursor according to claim 12, wherein the photosensitive resin composition is contained only in the underlayer.

14. A method for producing a lithographic printing plate, comprising in the following order:

image-exposing the lithographic printing plate precursor according to claim 9; and developing using a developer.

15. A photosensitive resin composition, comprising:

a polymer compound having a constitutional unit represented by the following Formula A-2 as a constitutional unit A and at least one constitutional unit among constitutional units represented by the following Formulas B-1 to B-6 as a constitutional unit B in a main chain; and an infrared absorbing material, (A-2)

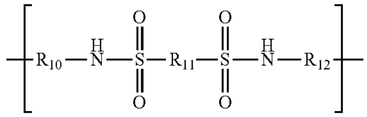

(B-1)

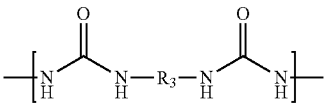

(B-2)

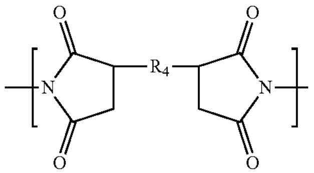

-continued (B-3)

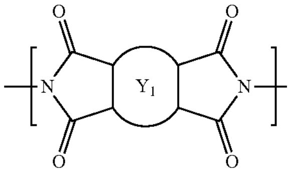

(B-4)

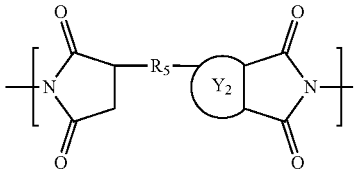

(B-5)

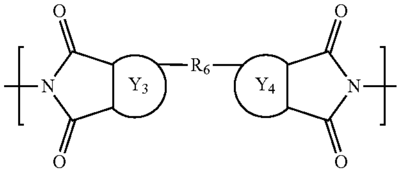

(B-6)

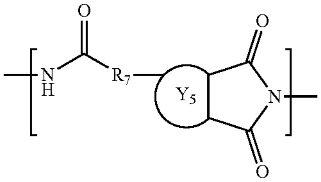

wherein in Formula A-2 and Formulas B-1 to B-6, $R_{10}$, $R_{11}$, and $R_{12}$ each independently represent a divalent linking group, $R_3$ represents a divalent linking group, $R_4$ to $R_7$ each independently represent a single bond or a divalent linking group, and $Y_1$ to $Y_5$ each independently represent an aromatic hydrocarbon ring or an aliphatic hydrocarbon ring.

16. A lithographic printing plate precursor, comprising:

an image recording layer including the photosensitive resin composition according to claim 15.

17. The lithographic printing plate precursor according to claim 16 which is a positive type.

18. The lithographic printing plate precursor according to claim 16, which is a positive type lithographic printing plate precursor having an image recording layer having an underlayer and an upper layer in this order on a support having a hydrophilic surface, wherein the photosensitive resin composition is contained in the underlayer and/or the upper layer.

19. The lithographic printing plate precursor according to claim 18, wherein the photosensitive resin composition is contained only in the underlayer.

20. A method for producing a lithographic printing plate, comprising in the following order:

image-exposing the lithographic printing plate precursor according to claim 16; and developing using a developer.

* * * * *